(12) United States Patent
Lee et al.

(10) Patent No.: US 6,620,682 B1
(45) Date of Patent: Sep. 16, 2003

(54) SET OF THREE LEVEL CONCURRENT WORD LINE BIAS CONDITIONS FOR A NOR TYPE FLASH MEMORY ARRAY

(75) Inventors: Peter W. Lee, Saratoga, CA (US); Hsing-Ya Tsao, San Jose, CA (US); Fu-Chang Hsu, San Jose, CA (US); Mervyn Wong, El Cerrito, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 09/978,230

(22) Filed: Oct. 16, 2001

Related U.S. Application Data

(60) Provisional application No. 60/271,644, filed on Feb. 27, 2001.

(51) Int. Cl.[7] .................................................. H01L 21/336
(52) U.S. Cl. ........................... 438/257; 438/14; 438/61
(58) Field of Search ........................ 438/14, 18, 19, 438/61, 66, 155, 257

(56) References Cited

U.S. PATENT DOCUMENTS

| | | | | |
|---|---|---|---|---|
| 5,464,998 A | 11/1995 | Hayakawa et al. | ......... | 257/316 |
| 5,708,600 A | 1/1998 | Hakozaki et al. | ...... | 365/185.03 |
| 5,712,815 A | 1/1998 | Bill et al. | ............ | 365/185.03 |
| 5,748,532 A | * 5/1998 | Tanaka et al. | | |
| 5,748,538 A | 5/1998 | Lee et al. | ............ | 365/185.06 |
| 5,757,699 A | 5/1998 | Takeshima et al. | .... | 365/185.24 |
| 5,790,456 A | 8/1998 | Haddad | ................. | 365/185.03 |
| 5,825,689 A | 10/1998 | Wakita | ................... | 365/185.11 |
| 5,848,000 A | 12/1998 | Lee et al. | ............... | 365/185.23 |
| 5,892,713 A | 4/1999 | Jyouno et al. | ......... | 365/185.11 |
| 5,959,882 A | 9/1999 | Yoshida et al. | ........ | 365/185.03 |
| 5,982,668 A | 11/1999 | Ishii et al. | ............. | 365/185.24 |
| 6,009,016 A | 12/1999 | Ishii et al. | ............. | 365/185.24 |
| 6,011,715 A | 1/2000 | Pasotti et al. | .......... | 365/185.03 |
| 6,038,170 A | 3/2000 | Shiba | .................... | 365/185.13 |
| 6,072,722 A | 6/2000 | Hirano | .................. | 365/185.13 |
| 6,101,123 A | 8/2000 | Kato et al. | ............. | 365/185.11 |

\* cited by examiner

*Primary Examiner*—Phuc T. Dang
(74) *Attorney, Agent, or Firm*—George O Saile; Stephen B. Ackerman

(57) ABSTRACT

In the present invention a method is shown that uses three concurrent word line voltages in memory cell operations of an a NOR type EEPROM flash memory array. A first concurrent word line voltage controls the operation on a selected word line within a selected memory block. The second concurrent word line voltage inhibits cells on non selected word lines in the selected memory block, and the third concurrent word line voltage inhibits non-selected cells in non-selected blocks from disturb conditions. In addition the three consecutive word line voltages allow a block to be erased, pages within the block to be verified as erased, and pages within the block to be inhibited from further erasure. The three consecutive voltages also allow for the detection of over erasure of cells, correction on a page basis, and verification that the threshold voltage of the corrected cells are above an over erase value but below an erased value. The methods described herein produce a cell threshold voltage that has a narrow voltage distribution.

8 Claims, 42 Drawing Sheets

10- control gate
11- floating gate
22- shallow junction
33- deep junction
34- lightly doped n-
44- p+ implant
14- ONO
15- tunnel oxide
16- p-substrate
48- edge erase
49- CHE program 10- control gate
11- floating gate
22- shallow junction
13- shallow junction
44- p+ implant
14- ONO
15- tunnel oxide
16- p-substrate
38- channel erase
49- CHE program 10- control gate
11- floating gate
12- deep junction
20- lightly doped n-
13- shallow junction
14- ONO
15- tunnel oxide
16- p-substrate
17- p+ implant
18- channel erase
19- edge program 10- control gate
11- floating gate
22- shallow junction
13- shallow junction
14- ONO
15- tunnel oxide
16- p-substrate
27- channel erase
28- channel program

- 10- control gate
- 11- floating gate
- 22- shallow junction
- 13- shallow junction
- 44- p+ implant
- 14- ONO
- 15- tunnel oxide
- 38- channel erase
- 49- CHE program
- 40- p-well
- 41- deep n-well
- 16- p-substrate

ETOX NOR Cell on a P-substrate a)

b) ERASE c) ERASE INHIBIT d) CORRECTION e) PROGRAM

ETOX NOR Cell on a P-substrate a) PROGRAM VERIFY b) CORRECTION VERIFY c) READ d) ERASE VERIFY

Cell on a P-substrate for this invention a)

b) ERASE c) ERASE INHIBIT d) CORRECTION e) PROGRAM

Cell on a P-substrate for this invention a) PROGRAM/CORRECTION
   INHIBIT
   (In same WL, in selected Block)

b) PROGRAM/CORRECTION
   INHIBIT
   (In different WL,
   in selected Block)

c) PROGRAM VERIFY d) CORRECTION VERIFY e) READ f) ERASE VERIFY

ETOX NOR cell on a P-well a)

b) ERASE c) ERASE INHIBIT d) CORRECTION e) PROGRAM

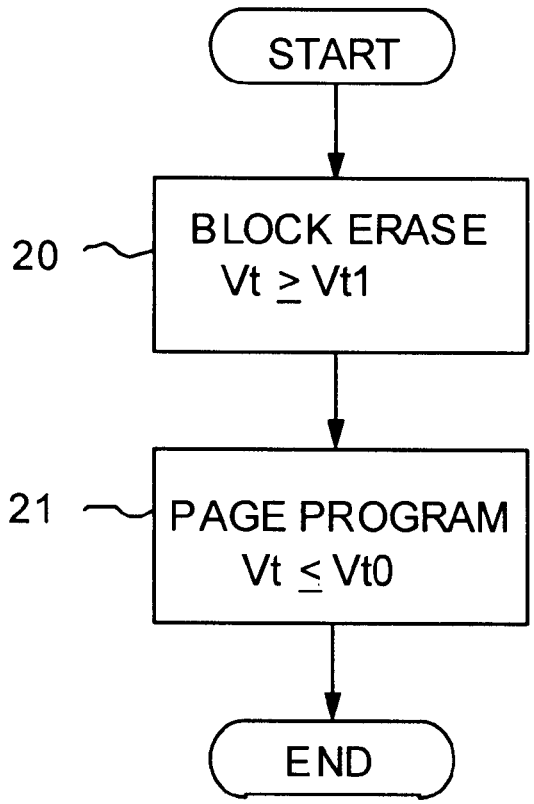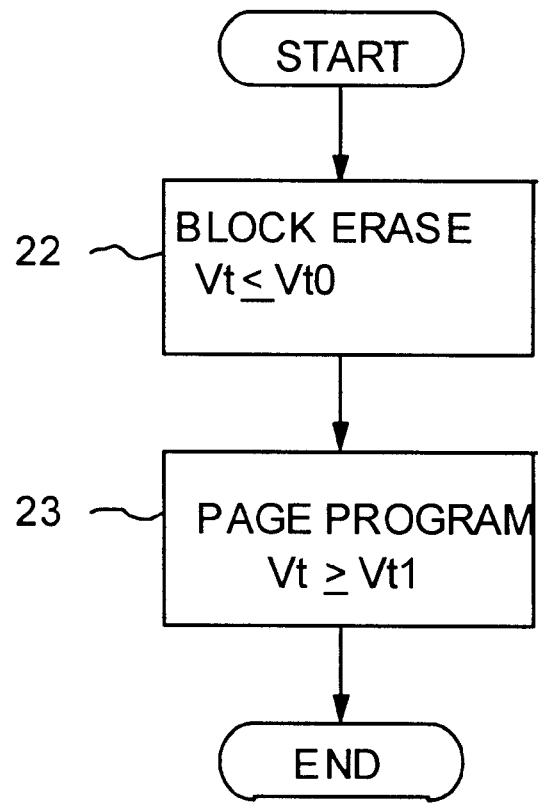
FIG.42a (Prior Art)
FIG.42b (Prior Art)

SET OF THREE LEVEL CONCURRENT WORD LINE BIAS CONDITIONS FOR A NOR TYPE FLASH MEMORY ARRAY

This application claims priority to Provisional Patent Application serial No. 60/271644, filed on Feb. 27, 2001, herein incorporated by reference.

BACKGROUND OF THE INVENTION

1. Field of the Invention

The present invention relates to semiconductor memories and in particular a three level concurrent word line bias condition for NOR type flash memory arrays.

2. Description of the Related Art

In today's flash EEPROM technology, a plurality of one-transistor EEPROM cells has been configured into either NAND-type or NOR-type memory arrays. For the NAND type cell array, the sources and drains of the flash cells are connected in series to save die size for the reason of cost reduction. In contrast, for NOR-type cell array, the drains and sources of the cells are connected in parallel to bit lines and source lines, respectively, to achieve high read speed at sacrifice of the increase in die size. It is well known that the NAND-type cell array suffers no over-erase problem due to its unique array structure allowing no leakage path during read. For a one transistor (non-split gate) NOR-type cell array, the over erase problem may or may not occur, and the over erase problem is subject to the choice of erase and program methods. Conventionally, a program operation is performed on the basis of bit-by-bit method but erase is performed collectively on all cells in a block. In both the NOR-type or NAND-type flash memory, the entire flash chip is divided into several blocks, and typically, the size of each flash block ranges from 64 Kbits to 512 Kbits. An erase operation is performed prior to program operation, and in a NAND-type flash memory, the erase is performed on a block (sector) basis and program is performed on a page basis.

A page is usually defined as a word line and a block is defined as many word lines which share common bit lines within the same divided block. Although several methods of erase and program operations have been proposed, in the current NAND type flash memory, the definition of erase and program operations is unified. The erase operation is to decrease the Vt (threshold voltage) of the cells that are physically connected to the same erased word line or the word lines in the same block. In contrast, the program operation is to increase the Vt of cells of selected erased word line or word lines in the selected block. The non-selected cells in the non-selected word lines in the selected block or the non-selected blocks remain undisturbed.

The following U.S. patents of prior art are directed toward the detailed description of NAND type flash EPROM's.

A) U.S. Pat. No. 6,038,170 (Shiba) is directed toward a nonvolatile memory of a hierarchical bit line structure having hierarchical bit lines which includes a plurality of sub-bit lines.

B) U.S. Pat. No. 5,464,998 (Hayakawa et al.) is directed toward a non-volatile semiconductor memory device including NAND type memory cells arranged in a matrix pattern over a semiconductor substrate.

Up to the present, the definition of erase and program operations for a one-transistor cell, NOR-type flash memory is inconsistent. Erase could be defined to increase cell's Vt and program to decrease cell's Vt, or vise versa depending on the preferred flash technology and its design techniques.

The following is a summary of erase and program operations for state, of the art one-transistor (non-split-gate) NOR-type flash EEPROM technologies.

I) FN (Fowler-Nordheim) Block erase, CHE (channel hot electron) program, one-transistor cell, NOR-type flash, EEPROM technology. The typical example is an ETOX flash cell. In this prior art, programming is performed on bit-by-bit basis to increase the Vt of the cells by using the CHE method while erase is performed on block basis to decrease the Vt of the cells by using FN-tunneling method. The CHE program consumes more than 300 uA per bit, therefore only a few bits can be programmed at a time by an on-chip charge pump having an economic semiconductor area. Unlike CHE, FN-tunneling erase requires only 10 nA per flash cell so that a big block size of 512 Kb can be erased simultaneously. For a Vdd voltage of 3V or lower, about 4 bits of ETOX cells are programmed in state-of-the art design. In a CHE operation, hot electrons are injected into cell's floating gate with an increase in Vt. In contrast, in the FN tunneling operation, the electrons are extracted out of the floating gate with a decrease in Vt. The erase operation is called an edge erase operation which is done at edge of the thin tunnel oxide between the floating gate and the source junction. In the ETOX flash cell, the source junction of N+ is used for an erase operation only which is made to be much deeper than the drain node. The source junction of N+ is surrounded with lightly doped N-implant to reduce the peak electrical field generated during erase operation at the tunneling edge. The drain junction is formed with a shallow N+, with a P+ implanted underneath to enhance the electrical field for CHE program. The ETOX cell is made non-symmetrical with respect to source and drain junctions of the cell in terms of cell structure and operating conditions; therefore, it is very difficult to shrink the cell using technology below 0.18 um for Ultra-high integrated memory.

The key operating conditions for the ETOX technology with a cell made on a P-substrate are as follows:

|  | Source | Gate | Drain | Bulk |
|---|---|---|---|---|
| a) Erase (edge) | +5 V | −10 V | Floating | 0 V |
| b) Program (channel) | 0 V | +10 V | +5 V | 0 V |
| c) Read | 0 V | Vdd + δV | 1 V | 0 V |

|  | Erase | Program |
|---|---|---|
| d) Current per cell | 10 nA | >300 uA |

The drawbacks of the ETOX flash cell are: a) a low cell scalability resulting from an asymmetrical cell structure with a deep source junction; b) a high program current caused by the CHE program scheme; c) a high erase current resulting from using an edge-FN scheme with large substrate leakage current; d) severe over erase potential caused by decreasing the Vt of cells during erase operation; e) a channel punch through problem in short channel lengths due to the edge erase.

The following U.S. patents of prior art are directed toward the detailed description of ETOX flash cell operations:

A) U.S. Pat. No. 5,712,815 (Colin et al.) is directed toward an improved programming structure for performing a program operation in an array of multiple bits-per-cell flash EEPROM memory cells is provided.

B) U.S. Pat. No. 5,790,456 (Haddad) is directed toward an improved method for performing channel hot-carrier programming in an array of multiple bits-per-cell Flash EEPROM memory cells in a NOR memory architecture so as to eliminate program disturb during a programming operation.

C) U.S. Pat. No. 6,011,715 (Pasotti et al.) is directed toward a programming method for a nonvolatile memory which includes several steps that are repeated until a final threshold value is obtained.

D) U.S. Pat. No. 5,825,689 (Wakita) is directed toward a nonvolatile semiconductor memory device including a memory cell array in which the threshold voltage of a transistor constituting the memory cell is at ground potential or less, and the source voltage condition is changed by a source potential setting circuit in accordance with a detection result from a data detecting circuit.

II) AND one-transistor cell, NOR-type flash EEPROM technology. Unlike ETOX technology, in the AND one transistor prior art the program is performed on bit-by-bit basis to decrease the Vt of cells while erase is performed on block basis to increase the Vt of cells. Both erase and program operations use the FN-tunneling method which consumes only about 10 nA per bit; therefore, a large number of flash cells within a large block can be erased simultaneously by an on-chip charge pump which utilizes a small area on the chip. For a single low power supply, Vdd, is at 3V or below, and as many as 16 Kb of cells of the AND technology in a block can be erased. In the AND prior art, the erase operation is carried out by FN block channel erase, and the program operation is carried out by page FN edge program. The edge program is at the drain edge formed by a buried N+ bit line . The electrons are injected into cell's floating gate by block channel erase operation with an increase in the Vt of the erased cells. In contrast, electrons are extracted out of a floating gate by a page edge program operation where the Vt of the programmed cells decreases. In this AND flash cell, the N+ drain junction is used for program operation only and is made to be much deeper than the source node. The N+ drain junction is surrounded with a lightly-doped N-implant to reduce the peak electrical field that is generated during the drain-edge-program operation. The source junction is formed with a shallow N+ having a P+ implant underneath to prevent voltage punch-through in a short channel region during an edge program operation. The AND cell like the ETOX cell is made non-symmetrical with respect to the source and drain junctions in terms of cell structure and operating conditions. Therefore, it is very difficult to shrink the AND cell below 0.18 um technology for an ultra-high integrated memory.

The key operating conditions for this technology with cell made on P-substrate are summarized as follows.

|  | Source | Gate | Drain | Bulk |
| --- | --- | --- | --- | --- |
| a) Erase (channel) | +0 V | +15 V | 0 V | 0 V |
| b) Program (drain edge) | +5 V | −10 V | Floating | 0 V |
| c) Read | 0 V | Vdd | 1 V | 0 V |
|  |  | Erase |  | Program |
| d) Current per cell |  | 10 pA |  | 10 nA |

The drawbacks of the AND flash cell are: a) low cell scalability caused by asymmetrical cell structure with a deeper drain than source junction; b) high program current resulting from the edge-FN program scheme with large substrate leakage current; c) severe channel punch-through problem in shorter channel length resulting from the edge program.

The detailed description of AND flash cell operations can be referred to the following U.S. patents of prior art:

A) U.S. Pat. No. 6,072,722 (Hirano) is directed toward programming and erasing a non-volatile semiconductor storage device.

B) U.S. Pat. No. 6,101,123 (Kato et al.) is directed toward programming and erasing verification of a non-volatile semiconductor memory.

C) U.S. Pat. No. 6,009,016 (Ishii et al.) is directed toward a nonvolatile semiconductor memory which recovers variation in the threshold of a memory cell due to disturbance related to a word line.

D) U.S. Pat. No. 5,982,668 (Ishii et al.) is directed toward a nonvolatile semiconductor memory which recovers variation in the threshold of a memory cell due to disturbance related to a word line. The nonvolatile memory continuously performs many writing operations without carrying out single-sector erasing after each writing operation.

E) U.S. Pat. No. 5,959,882 (Yoshida et al.) is directed toward a nonvolatile semiconductor memory device with a plurality of threshold voltages set so as to store multi-valued information in one memory cell entitled.

F) U.S. Pat. No. 5,892,713 (Jyouno et al.) is directed toward a configuration that provides a nonvolatile semiconductor memory device which allows high-speed block reading.

G) U.S. Pat. No. 5,757,699 (Takeshima et al.) is directed toward the programming of a selected memory cell which is repeated until the programmed threshold voltage is not greater than a predetermined threshold voltage.

III) FN-erase, FN-program, Metal-bit line, One-transistor, NOR-type Flash EEPROM. Like AND flash technology, in this prior art, the program operation is performed on a bit-by-bit basis to decrease the Vt of cells while erase is performed on a block basis to increase the Vt of cells. Both erase and program operations use the FN-tunneling method, which consumes only about 10 nA per bit without taking the greater substrate current into account. Therefore a large number of flash cells within a big block can be erased at one time by an on-chip charge pump having economic area. For a single low power supply, Vdd, of 3V or below, a larger number of flash cells in a block can be programmed and erased simultaneously. In the prior art, the erase operation is carried out by FN channel-erase, and the program operation is carried out by FN edge-program. The edge-program is at the drain edge but the cell structure is formed by a non-buried N+ bit line and a source line. The bit line is a vertical metal line which connects all drains of the cells in the same block for high read speed. The source lines are tied together by an N+ active line, which runs in parallel to the word lines. Each source line is shared by one pair of word lines as in the ETOX flash cell array. As disclosed in the prior art, the electrons are removed from the floating gate of the cells by drain edge FN programming in which the Vt is decrease. Conversely, the electrons are injected into the floating gate by channel erasing where Vt is increased. The N+ drain junction is used for the FN program operation and is made to be much deeper than source node, and is surrounded with a lightly doped N-implant to reduce the peak electrical field generated during drain edge program operation. The source junction is formed with shallow N+ with a P+ implant underneath the source to prevent voltage punch-through in a short channel region during edge-program operation. The flash cell of prior art is made asymmetrical with respect to source and drain junctions in terms of cell structure and operating conditions; therefore, it is difficult to further shrink the memory cell for Ultra-high density memory below 0.18 um technology.

The key operating conditions for the NOR type flash technology with a cell formed on a P-substrate are as follows:

|  | Source | Gate | Drain | Bulk |
|---|---|---|---|---|
| a) Erase (channel) | +0 V | +15 V | 0 V | 0 V |
| b) Program (drain-edge) | Floating | −10 V | +5 V | 0 V |
| c) Read | 0 V | Vdd | 1 V | 0 V |
|  | Erase |  | Program |  |
| d) Current per cell | 10 pA |  | 10 nA |  |

The drawbacks of the NOR type flash cell are: a) Low cell scalability as a result of an asymmetrical cell structure with the drain junction deeper than the source junction; b) high program current caused by the edge-FN program scheme with a large substrate leakage current.; c) severe channel punch-through problem in shorter channel lengths caused by the edge program. The detailed description of the NOR type flash technology can be referred to in U.S. Pat. No. 5,708,600 (Hakozaki et al.) which is directed toward a method for writing a multiple value into a nonvolatile memory capable of multiple value data being written into a floating gate type memory cell.

SUMMARY OF THE INVENTION

An object of the present invention is to provide a three level concurrent word line bias condition and method using CHE program and FN block erase for a semiconductor nonvolatile device and in particular, for an ETOX one transistor cell, and a NOR-type EEPROM memory array formed on P-substrate.

Another object of the present invention is to provide a three level word line bias condition and methods using FN schemes for both program and erase operations for a one transistor cell, NOR type AND EEPROM memory array formed on P-substrate.

Another objective of the present invention is to provide a three level word line bias condition and methods using CHE program and FN block-erase for a semiconductor nonvolatile device, in particular an ETOX one transistor cell, NOR type EEPROM memory array formed on p-well which is within a deep N-well on top of p-substrate.

Still another objective of the present invention is to provide a new operation method that employs the three level word line bias condition to perform the bit-by-bit verify and correction for achieving both tight "0" and "1" for distributions of Vt.

BRIEF DESCRIPTION OF THE DRAWINGS

This invention will be described with reference to the accompanying drawings, wherein:

FIGS. 29a through 28d show additional single cell operating conditions for ETOX NOR arrays on a P-well for the present invention, FIG. 42a is a flow diagram block erase and page program sequence of operations of prior art applied to a first AND array of prior art, FIG. 42b is a flow diagram block erase and page program sequence of operations of prior art applied to a second AND array of prior art.

DETAILED DESCRIPTION OF THE PREFERRED EMBODIMENTS

The operating principles of a one-transistor flash cell of the present invention are described with reference to FIGS. 1–5. The term "write operation" will be frequently used in this description and is defined as an operation, comprising erase and program operations. In one complete write operation, erase is usually performed first on a block basis followed by a program operation on a page basis.

Figure 1:
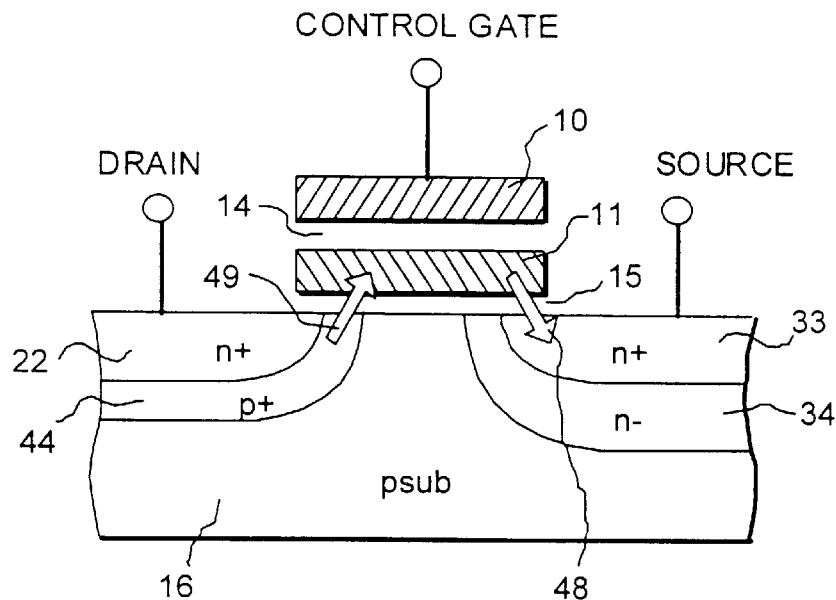
FIG. 1 is a sectional view of an ETOX type memory cell of prior art with a p+ implant and a lightly doped n- implant.

FIG. 1 shows the cross sectional view of a device structure of prior art of an ETOX flash memory cell with an n+ source 33, n+ drain 22, control gate 10 and floating gate 11. The tunnel oxide layer 15 is formed between floating gate 11 and P-substrate 16. The arrow 48 shows the flow of electrons from floating gate 11 to source 33 during an edge erase operation. The arrow 49 shows electrons moving from drain 44 to the floating gate 11 during CHE (channel hot electron) program operation.

Figure 2:
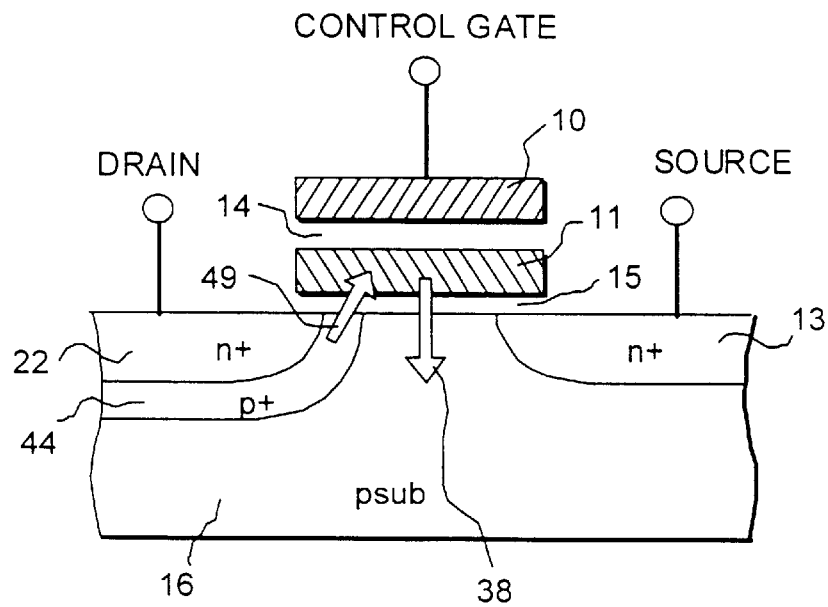
FIG. 2 is a sectional view of an ETOX type memory cell of prior art with a p+ implant.

Continuing to refer to FIG. 1, since the n+ source node 33 experiences much higher electric field during an edge erase operation than the drain 22 during CHE program operation, the source junction is made much deeper than drain. The source 33 is lightly doped by an n– implant 34 to avoid junction breakdown in the erase operation. The p+ implant 44 is used to increase the substrate concentration underneath n+ drain 22 so that the CHE program operation can be achieved. An n– implant 34 is formed underneath n+ source 33 so that breakdown can be avoided during FN edge erase 48. A second prior art of an ETOX cell is shown in FIG. 2. Shown in FIG. 2 is a cross sectional view of ETOX cell which uses a CHE program 49 to increase the threshold voltage, Vt, and an FN channel erase 38 to decrease Vt. In FIG. 2, the n– implant layer is no longer required since channel erase 38 does not exert the high tunneling electric field to source junction 13.

Figure 3:
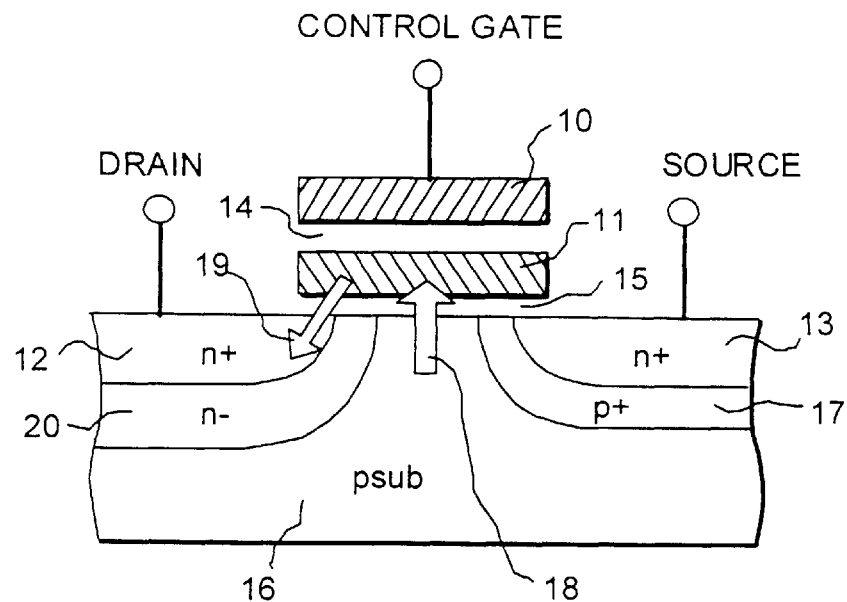
FIG. 3 is a sectional view of an AND type memory cell of prior art with a p+ implant and a lightly doped n- implant.

In FIG. 3 is shown a cross sectional view an AND flash cell of prior art with buried N+ source 13 and drain 12 which uses FN channel erase 18 to increase Vt and FN edge program 19 to decrease Vt. Edge program is performed similarly to the ETOX cell in FIG. 1. A lightly doped n– layer 20 is required underneath n+ drain 12 to reduce the high tunneling electric field during program operation. The cell of FIG. 3 is an asymmetric cell and has a lower scalability as with the cell in FIG. 2.

Figure 4:
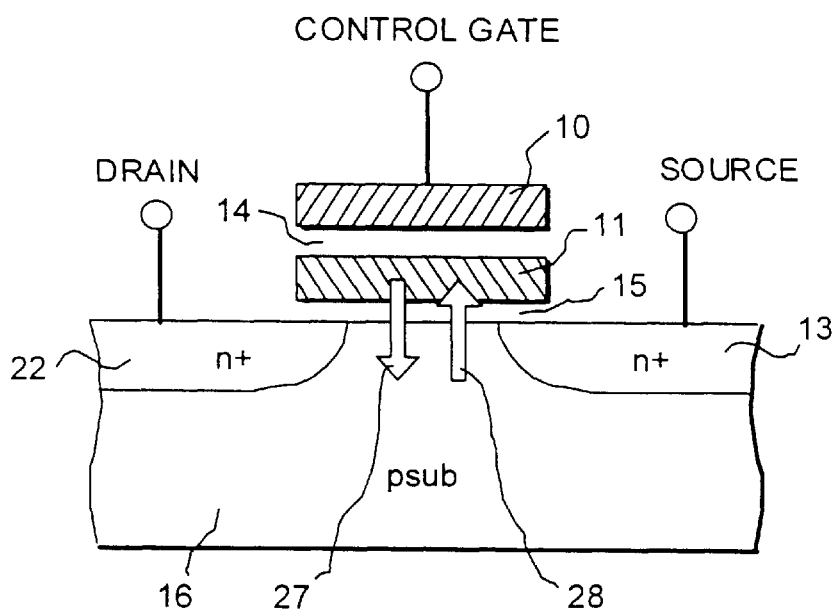
FIG. 4 is a sectional view of an NAND type memory cell of prior art with a shallow source and drain.

The prior art of FIG. 4 shows a cross sectional view of a NAND like flash cell with an n+ source 13 and drain 22. This flash cell uses FN channel-program 28 to increase Vt and FN channel-erase 27 to decrease Vt. Unlike the previous cells, neither n– nor p+ are required for drain 22 and source node 13, respectively. The cell of FIG. 4 is a symmetrical cell and has higher scalability than the cells in the cells shown in FIGS. 1, 2 and 3.

Figure 5:
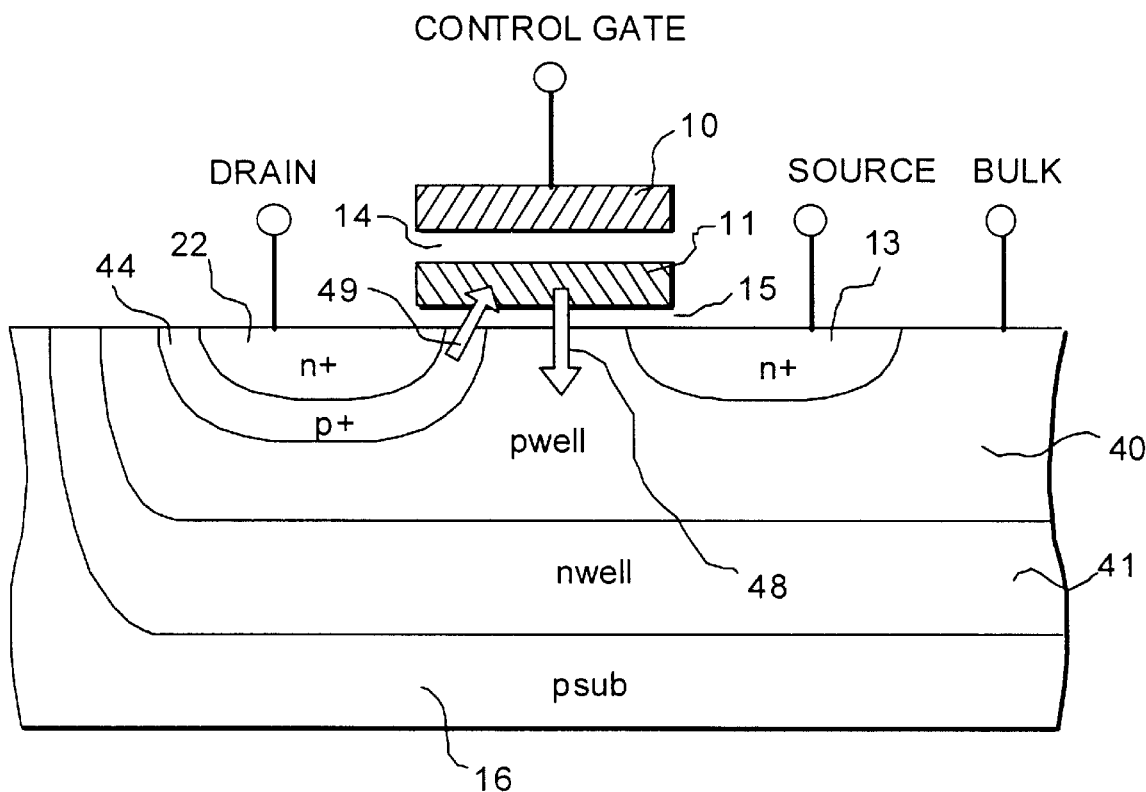
FIG. 5 is a sectional view of an ETOX type memory cell of prior art with a p+ implant on a p-well within a deep n-well on p-substrate.

The prior art of FIG. 5 shows a cross sectional view of an ETOX cell which uses a CHE program 49 to increase Vt and a FN channel erase 48 to decrease Vt. The cell is formed on p-well 40 within an n-well 41 on a P-substrate 16. The n– implant layer is no longer required since channel erasing 48 does not exert the high tunneling electric field on the source junction 13. For lower voltage operation of this cell the voltages applied to the control gate 10 and p-well 40 can be DC-shifted down.

Figure 6:
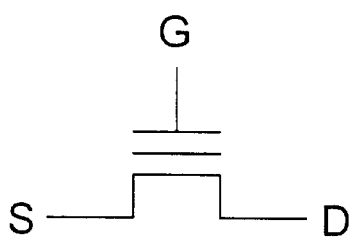
FIGS. 6a through 6e show a single cell operating conditions of the present invention for an ETOX NOR flash cell array on a P-substrate.
Figure 6:
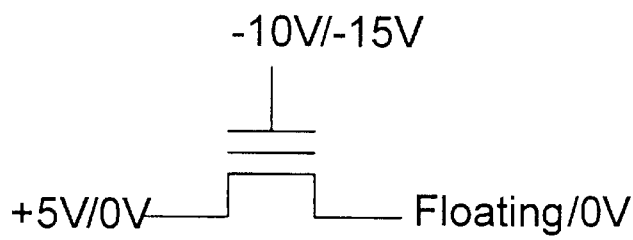
Figure 6:
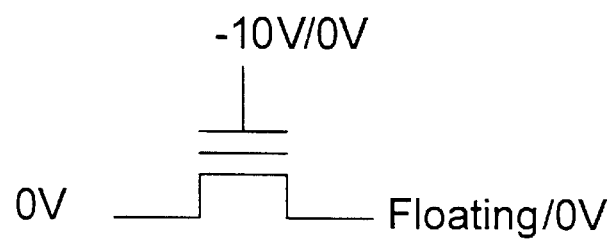
Figure 6:
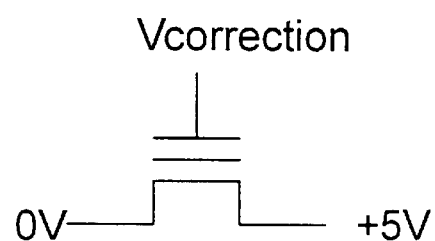
Figure 6:
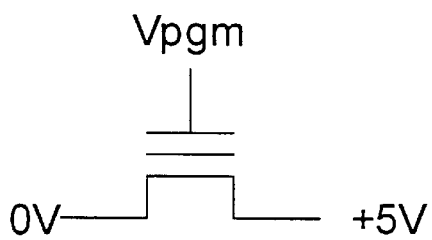
Figure 7:
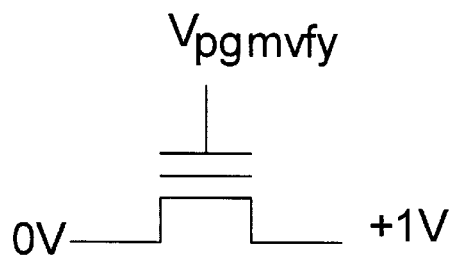
FIGS. 7a through 7d show additional single cell operating conditions of the present invention for an ETOX NOR flash cell array on a P-substrate.
Figure 7:
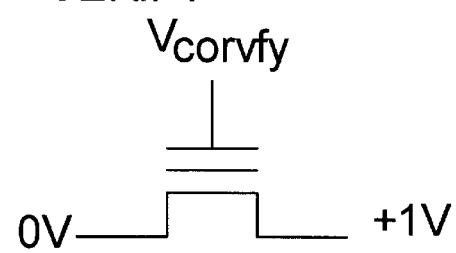
Figure 7:
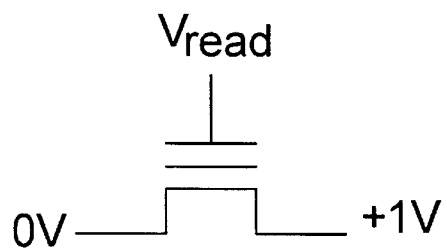
Figure 7:
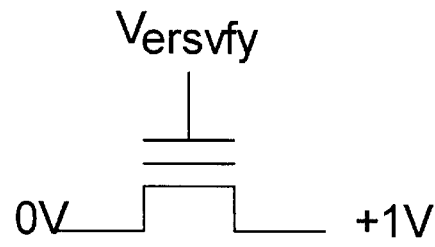

The first embodiment of the present invention will be described with reference to FIG. 6 through FIG. 15. The cell used is an ETOX cell on P-substrate. FIG. 6a shows a flash cell of this invention with nodes of D, G and S. The P-substrate is not shown and is held at ground. FIG. 6b shows a flash cell with bias conditions of this invention illustrating two types of ERASE operations. The first operation has D, G and S nodes coupled with floating, –10V and +5V, respectively, for edge-erase. The second operation has D, G and S nodes coupled with 0V, −15V and 0V, respectively, for a channel erase, where the −15V is an exemplary value. The exact value and time of the control gate voltage is subject to different flash technologies. The gate voltage of −15V, and source and drain voltage of 0V will result in a tunneling electric field in channel region of the cell. The tunneling electric field will transport electrons from the floating gate to the P-substrate in order to decrease the Vt of the cells (off-state) after a predetermined erase time. The erase operation can be performed on the basis of single-page (word line), block (N word lines), multiple blocks (M blocks) or chip (all blocks), where typically N and M are larger than 2.

FIG. 6c shows a flash cell with bias conditions of the present invention illustrating two types of an erase inhibit operation. The first erase inhibit is with D, G and S nodes set to floating, −10V, +5V respectively, and the second erase inhibit with D, G and S nodes set to 0V, 0V and 0V, respectively. This operation is intended to prevent a build-up of disturbance to those non-selected erased cells (in either selected or non-selected blocks) and to achieve better endurance (number of program and erase cycles).

FIG. 6d shows a flash cell with bias conditions of the present invention that illustrates the correction operation with D, G and S nodes coupled to +5V, Vcorrection and 0V, respectively. Here Vcorrection is an exemplary value for better understanding of the present invention. The exact value and time for the control gate voltage in this operation varies with different flash technologies. The correction operation is a soft program CHE operation. The difference between program and correction lies in the control gate voltage. Normal program operation has about +10V applied to control gate and is intended to increase Vt more than +5V. Correction has lower control gate voltage to avoid over program. It is used to correct the Vt of cells back to around +1V from either negative or below +0.5V to avoid sub-threshold leakage during subsequent read or program operations. The operation of FIG. 6d is sometimes referred to as recovery.

The data becomes "0" after this operation.

FIG. 6e shows a flash ETOX cell with the bias conditions of the present invention illustrating the CHE program operation with D, G and S nodes coupled to +5V, Vpgm and 0V, respectively. In the CHE program, there is a conduction current flowing from drain to source and causing an electron-hole pair generated at drain node. Electrons are attracted to the floating gate to increase Vt by the positive high voltage Vpgm, which increases the Vt of the cells. The CHE program typically consumes more than 300 uA per cell. With weak on chip charge pump circuits operating at Vdd below 3V, only about 4 bits can be programmed simultaneously. The cell data becomes "1" after this operation is performed.

In FIG. 7a, a flash cell with bias conditions of the present invention illustrates the program verify operation with D, G and S nodes coupled to +1V, Vpgmvfy and 0V, respectively. The Vpgmvfy is an adjustable voltage input to the control gate of the cells to meet different Vt requirements in the program operation. For example, for storage of more than 2-bits per cell, Vpgmvfy may vary from as low as 1V up to about 5V or more. For a binary program, Vpgmvfy is set to be around +5V. For storage of multiple states such as 1V, 2V, 3V, and 4V, Vpgmvfy is set to 1V, 2V, 3V and 4V accordingly to verify each state In FIG. 7b, a flash cell with bias conditions of the present invention illustrates the correction verify operation with D, G and S nodes coupled to +1V, Vcorvfy and 0V, respectively. The Vcorvfy is an adjustable voltage input to the control gate to meet different Vt requirements in this operation. The Vt of over erased cells will be recovered back to a Vt window of between +0.5V and 1.0V, after this operation is performed.

FIG. 7c shows a flash cell with bias conditions of the present invention illustrating a read operation with D, G and S nodes coupled to +1V, Vread and 0V, respectively. The Vread is an adjustable voltage input for the control gate for the read operation. Vread can be simply set to Vdd; however, in some designs, Vread is set to a clamped value so that the read voltage applied to the control gate can be independent of Vdd variation. In some designs, the Vread voltage is boosted to be higher than Vdd, resulting in higher read current.

Shown in FIG. 7d is a flash cell with bias conditions of the present invention illustrating an erase verify operation with D, G and S nodes coupled to +1V, Versvfy and 0V, respectively. The Versvfy is an adjustable voltage input to the control gate for this operation. In the conventional ETOX cell, Versvfy is set to be around +2.5V to reduce the number of over erased cells because the correction cannot be performed in a bit-by-bit mode as in regular program operation. The correction is done in a collective mode. When the number of over-erased cells increases to some level, the correction current will overload the on-chip charge pump and fail to recover the Vt of the cells. In contrast, Versvfy is set to be +1V in the present invention and as a result of the 3-level word line voltage is used to perform bit-by-bit correction. There are many cells in many bit lines, but only one cell per one selected bit line is corrected simultaneously. Therefore, current over load will not occur and the corrected Vt can be set accurately.

Figure 8:
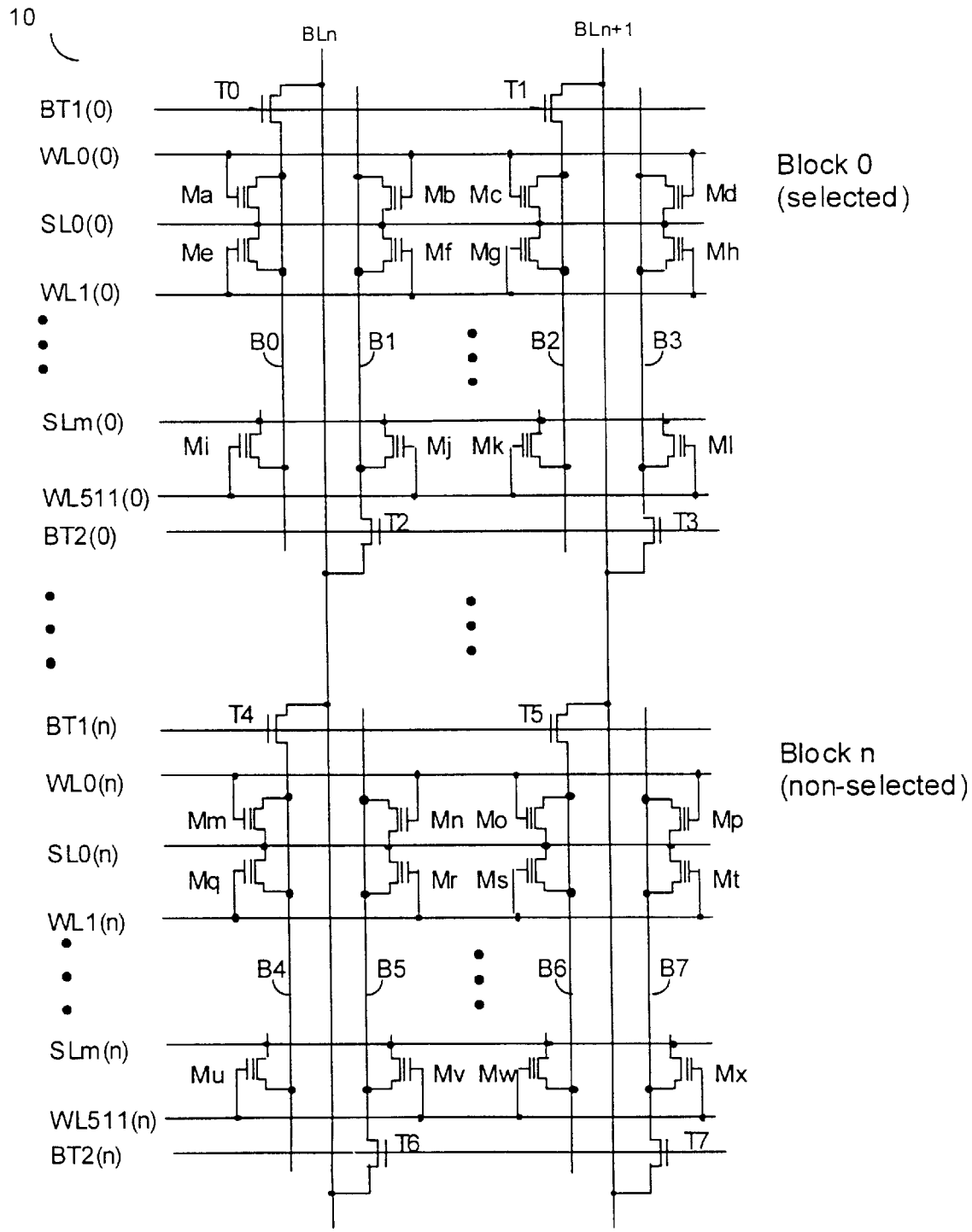
FIG. 8 shows the ETOX NOR flash cell array of prior art.

In FIG. 8 is shown a conventional ETOX NOR type flash EEPROM memory array 10. This nonvolatile NOR-type memory array includes: a matrix of word lines and bit lines intersecting one another; and an ETOX memory cell being disposed so as to correspond to each intersection of the matrix of the global bit lines BLn–BLn+1, local bit line Bn, source line SLn and global word lines WLn, the memory cell including a control gate, a drain, a source and a P-substrate as shown in FIG. 1. The control gates are coupled to a corresponding one of the row wise word lines WLm(n), the drains are coupled to a corresponding one of the local column wise bit line Bn and one of the global bit line BLn selected by transistor Tn gated by BT1 (n) and BT2(n), and the sources are coupled to a corresponding one of the local row wise source lines SLm. The memory cell is capable of performing a FN erase and a CHE program operation based on the three level word line of the present invention. The plurality of control signals of WLm(n), BT1(n) and BT2(n) are generated from an X-decoder (word line decoder), local bit line decoder, local source line decoder, global bit line decoder and global source line decoder, respectively.

Figure 9:
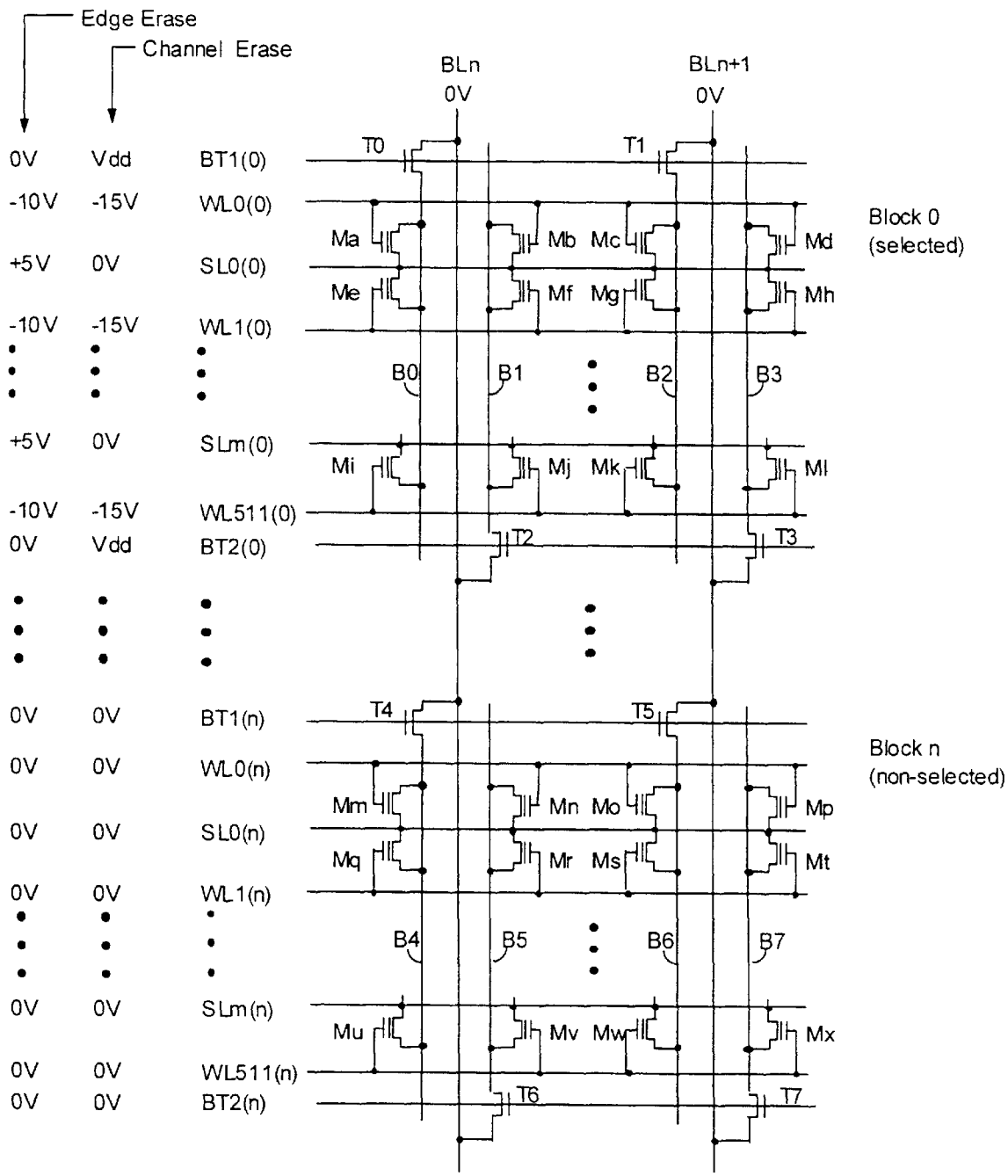
FIG. 9 illustrates the bias conditions for block erase for the ETOX NOR flash cell array of the present invention.

Shown in FIG. 9 are two Block Erase Operations for a conventional ETOX NOR type flash EEPROM memory array 10. One is edge erase operation, and the other is a channel erase operation. For channel-erase operation, an erase voltage of −15V is coupled to the corresponding row wise word lines, WL0(0)–WL511(0) for selected Block 0, and ground is coupled to the non-selected word lines in the rest of the blocks. The drains of the cells are coupled to 0V by a corresponding the local column wise first level metal bit lines B0–B3 and the second global metal bit lines BLn–BLn+1 via transistors of T0 and T1 which are gated by applying Vdd to BT1(n) and BT2(n) signals. The sources are coupled to 0V by a corresponding plurality of row wise source lines SL0(0)–SLm(0). The channel erase conditions are applied so that the memory cells of Ma–Ml in the word lines in Block 0 are capable of performing a FN erase operation. The Vt of the cells are decreased after the erase operation is performed. The flash cells of Mm–Mx in non-selected Block n are kept undisturbed. The erase operation is designed to be an iterative process. Each erase pulse width can be set to around 1 ms. Given a shorter erase pulse, a larger number of erase pulses are required.

Figure 10:
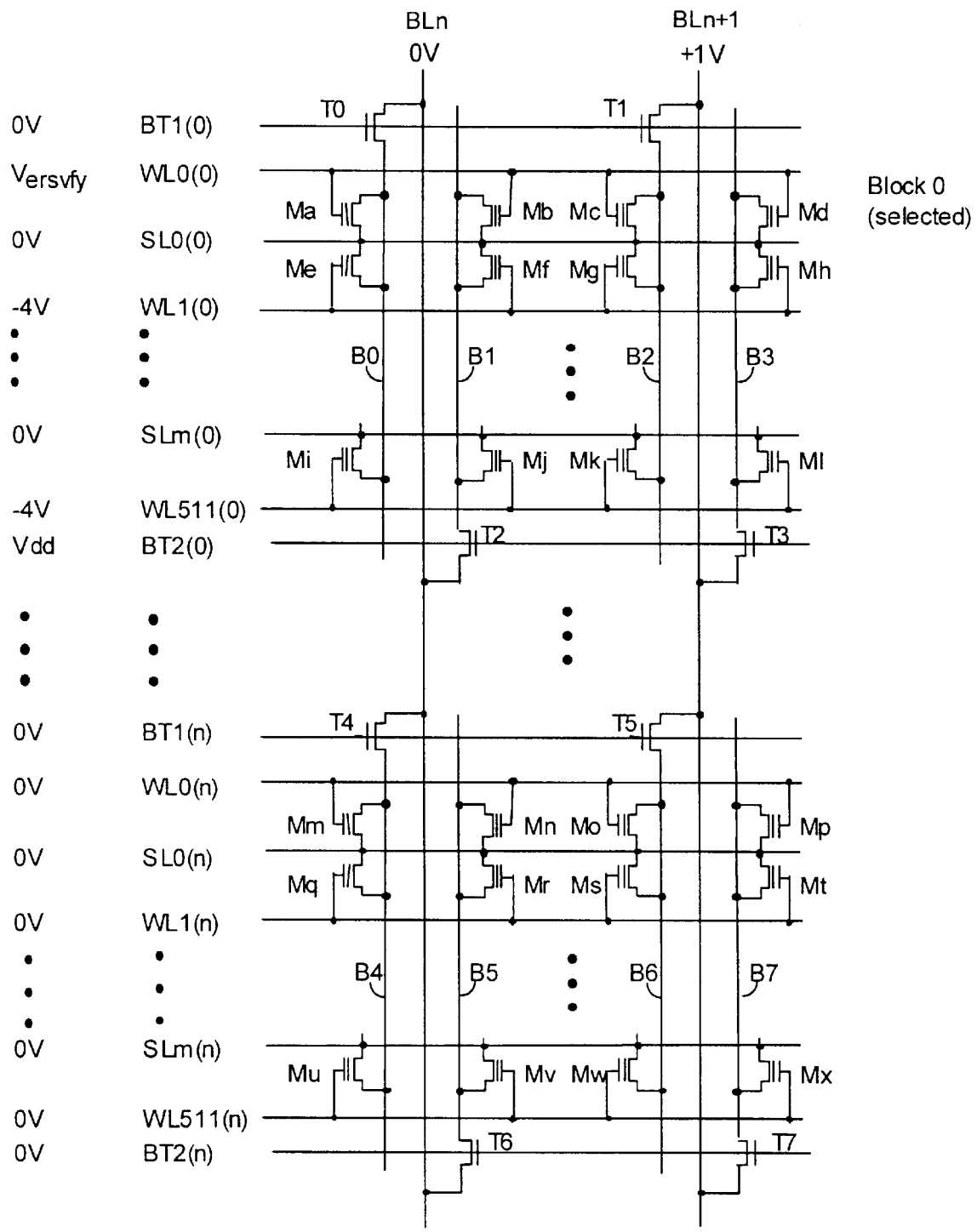
FIG. 10 illustrates the bias conditions for block erase verify for the ETOX NOR flash cell array of the present invention.

In FIG. 10 is illustrated a Block Erase Verify operation with preferred voltages for WLm(n), global BLn, global SLm, BT1(n), BT2(n). Assuming WL0(0) is firstly selected for Block erase verify, then Versvfy is coupled to WL0(0). The rest of the word lines of WL1(0) to WL511(0) are coupled to −4V to shut off any potential leakage caused by over-erased cells that might exist in Block 0. The word line voltage of −4 v is not a fixed number but is set to be able to shut off any leakage current resulted from cells with a Vt less than −4V. All source voltages SLm(n) are coupled to ground. Bit line BLn is coupled to 0V and BLn+1 is coupled to 1V for the verify operation. Bit line BLn+1 is then selectively connected to a corresponding sense amplifier for verification. In the conventional ETOX array a total of eight sense amplifiers are needed for byte read and 16 sense amplifiers for word read. The verification for the rest of the cells on the same word lines will be controlled by connecting the sense amplifiers to the next group of 8 bit lines. The process will be continued in the same page until all cells in the page are verified. Then the verify process is moved to the next page of WL1(0) in Block 0. After five hundred and twelve word lines are verified, the block erase verify is terminated. With the successful verification of block erase all cells in the selected block (Block 0) become a logical "0". The data of the cells in the non-selected blocks remain the same without changes. Three word line voltages are uses concurrently, which include Versvfy for the selected word line, −4V for non-selected word lines in the selected block and 0V for non-selected word lines in non-selected blocks. Although the cells in Block 0 are at a logical "0", there could be over erase cells. The definition of an over erased cell in the present invention is a cell Vt ranging from a negative Vt to a positive Vt but below 0.5V. The over-erase cells will induce leakage and result in false readings so that a Vt correction operation is required.

Figure 11:
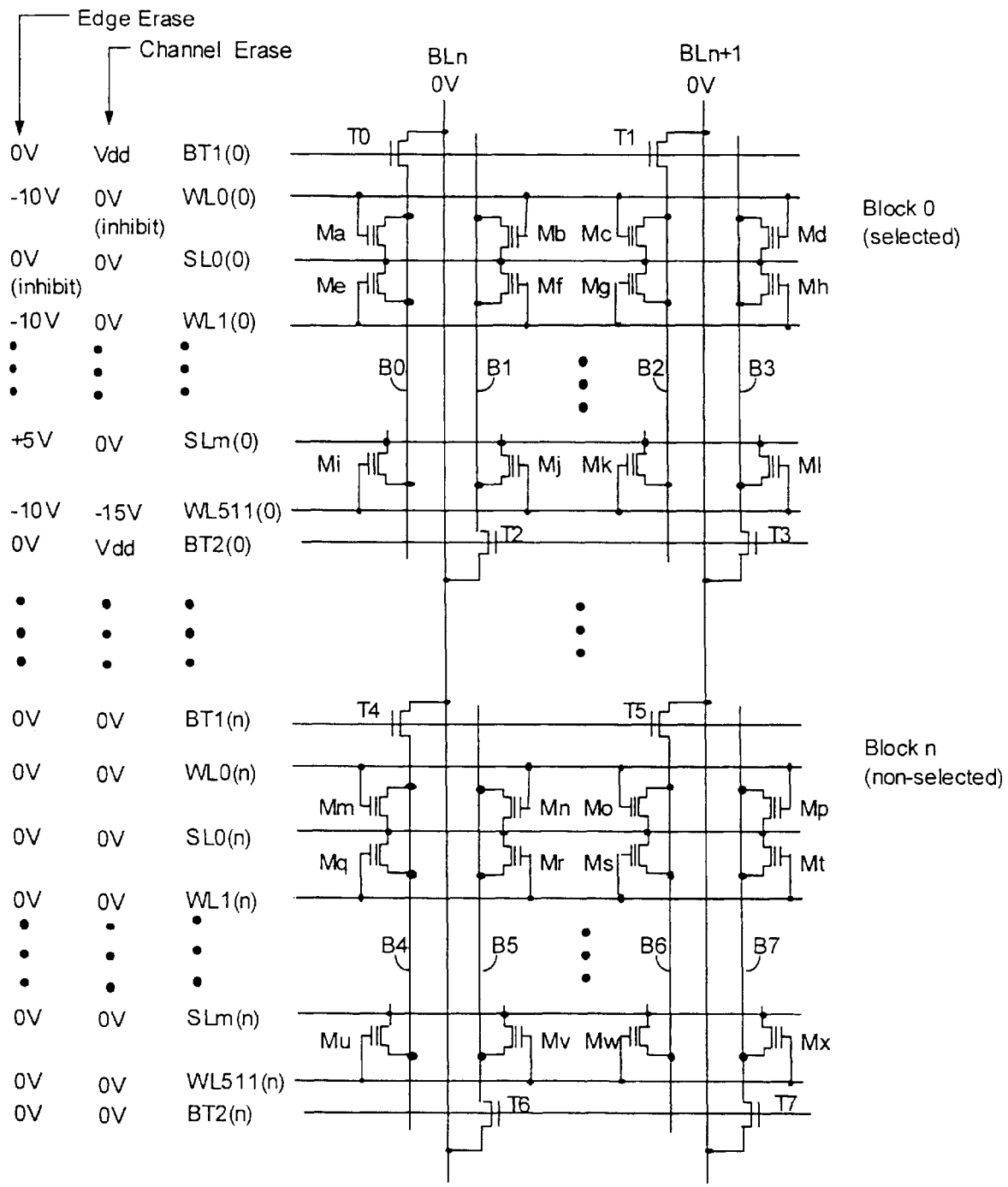
FIG. 11 illustrates the bias conditions for erase inhibit for the ETOX NOR type flash cell array of the present invention.
Figure 12:
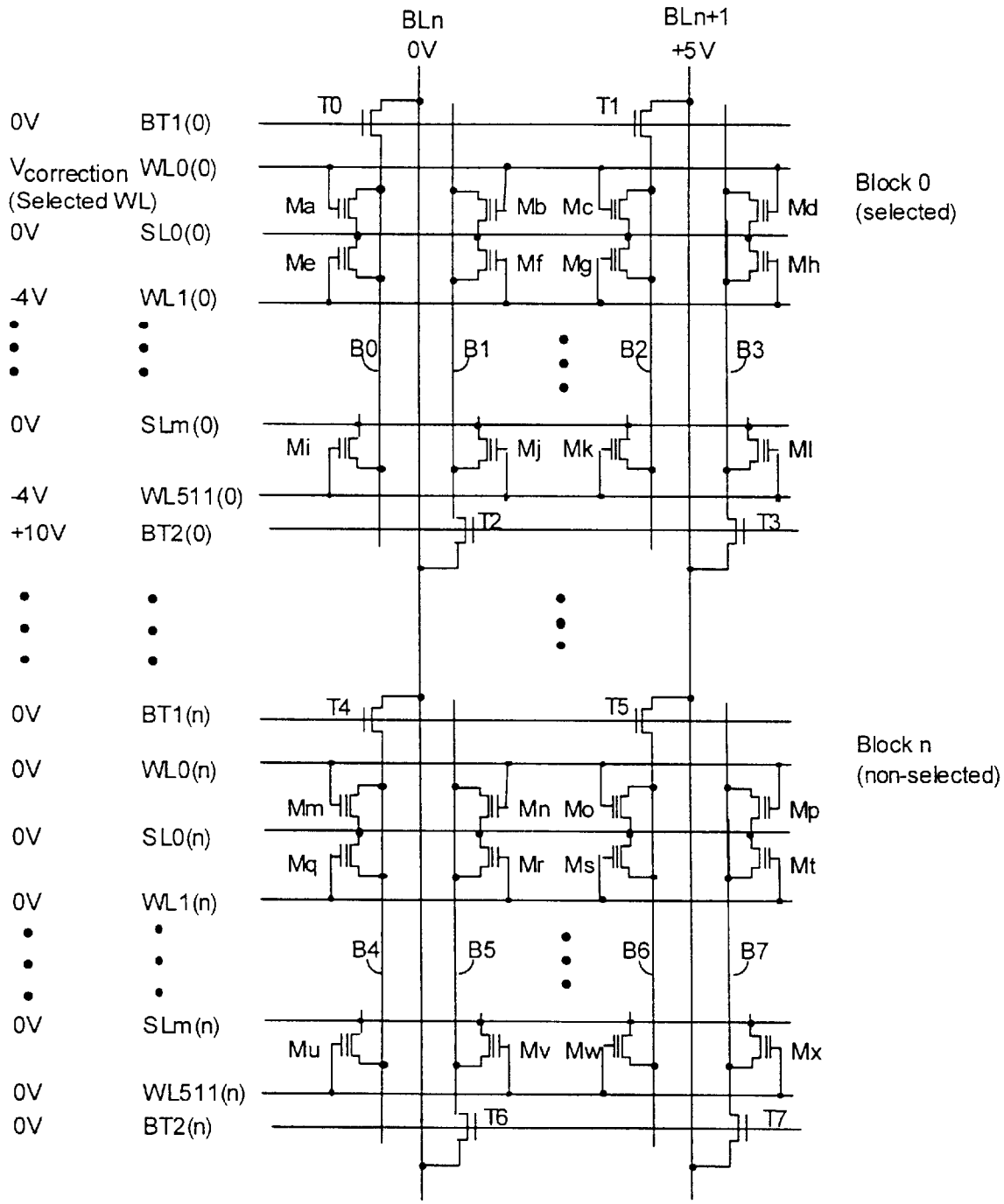
FIG. 12 illustrates the bias conditions for correction operations for the ETOX NOR type flash cell array of the present invention.

FIG. 11 shows an erase inhibit operation with preferred voltages for WLm(n), global BLn, global SLm, BT1(n), and BT2(n). This operation is performed on sub-block basis and is intended to set those sub-blocks that have been successfully erased into a de-selected mode to prevent further erase. For example, WL0(0) and WL1(0) are verified to have a successful erase and are set to be in Erase Inhibit mode to avoid the further erase pluses. The way to set erase inhibit is to set the word line voltage from −15V (erase) to 0V (inhibit) for channel erase or source voltage from +5V (erase) to 0V (inhibit) for an edge erase operation. In the erase inhibit mode the tunneling electric field is reduced so that no tunneling effect will take place. This operation does not require three concurrent word line voltages. In FIG. 12 a correction operation is illustrated with preferred voltages for WLm(n), global BLn, global SLm, BT1(n) and BT2(n). The correction operation is performed on a bit by bit basis and is intended to correct those over erased cells to a Vt voltage that is positive but below +0.5V. The process is repeated to correct all cells in one selected word line WL0(0) and then moved to correct the cells in next word lines of Block 0. A Vcorrection voltage is coupled to the first selected word line WL0(0) along with a bit line voltage of 5V in order to perform a CHE soft program. The Vcorrection voltage is set to be less than +10V while the rest of the word lines of WL1(0) to WL511(0) are coupled to −4V to shut off any potential leakage due to over erased cells that might be existing in Block 0. The −4V is an approximate value and is of sufficient magnitude to be able to shut off any leakage current resulting from cells with Vt less than −4V. All source voltages of SL0(0)–SLm(n) are coupled to ground along with bit line BLn. Bit line BLn+1 is couple to 5V for the correction operation. The process is continued in the same page until all cells in the page are corrected and then the process moves to correct next page WL0(1) in Block 0. After all the word lines in a block are successfully corrected, the correction process is terminated. With the successful correction, all cells in the selected block (Block 0) become "0". The data of cells in the non-selected blocks remain the same without changes. This correction operation uses three concurrent word line voltages, Vcorrection, −4V and 0V.

Figure 13:
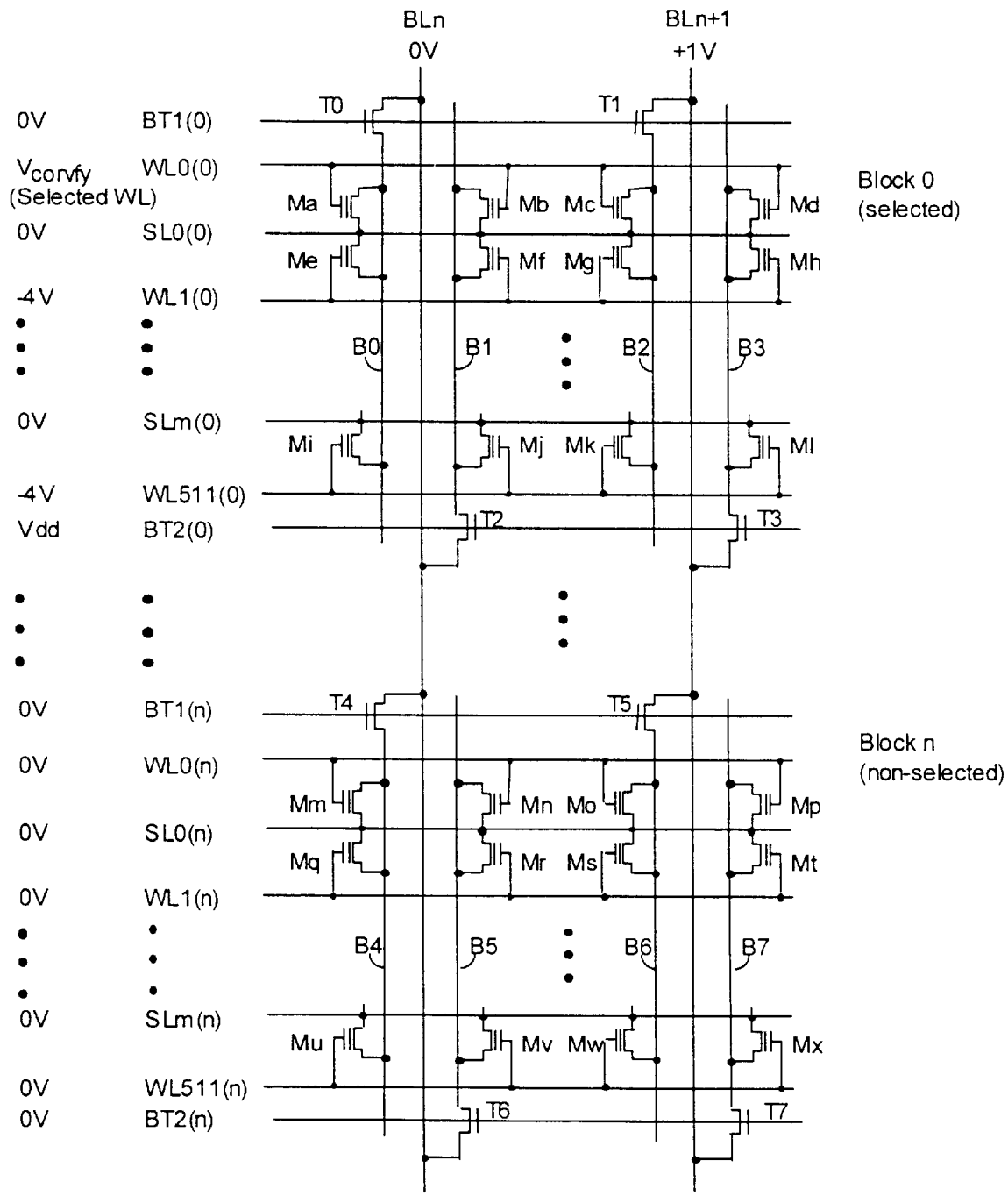
FIG. 13 illustrates the bias conditions for correction verify operation for the ETOX NOR type flash cell array of the present invention.

FIG. 13 illustrates a correction verify operation with preferred voltages for WLm(n), global BLn, global SLm, BT1(n), and BT2(n). This operation is performed on bit-by-bit basis. In the present invention, this operation is intended to verify that those over erased cells are corrected to Vt within +0.5V but below +1V. A voltage Vcorvfy is coupled to word line WL0(0) and the rest of the word lines, WL1(0) to WL511(0), are coupled to −4V to shut off any potential leakage caused by over erased cells that might be existing in Block 0. The voltage of −4 v is an approximate value and is set to be able to shut off any leakage current which results from cells with Vt less than −4V. All source voltages of SL0(0)–SLm(n) are coupled to ground along with the bit line BLn. The bit line BLn+1 is coupled to +1V for the verify operation. The process will be continued in the same page until all cells in that page are corrected and verified. Then the operation moves to verify next page of WLn(0) in Block 0. After all word lines in the block are successfully corrected and verified, the verify process is terminated. Three word line voltages are used, which include Vcorvfy for the selected word line, −4V for non-selected word lines in the selected block and 0V for non-selected word lines in non-selected blocks.

Figure 14:
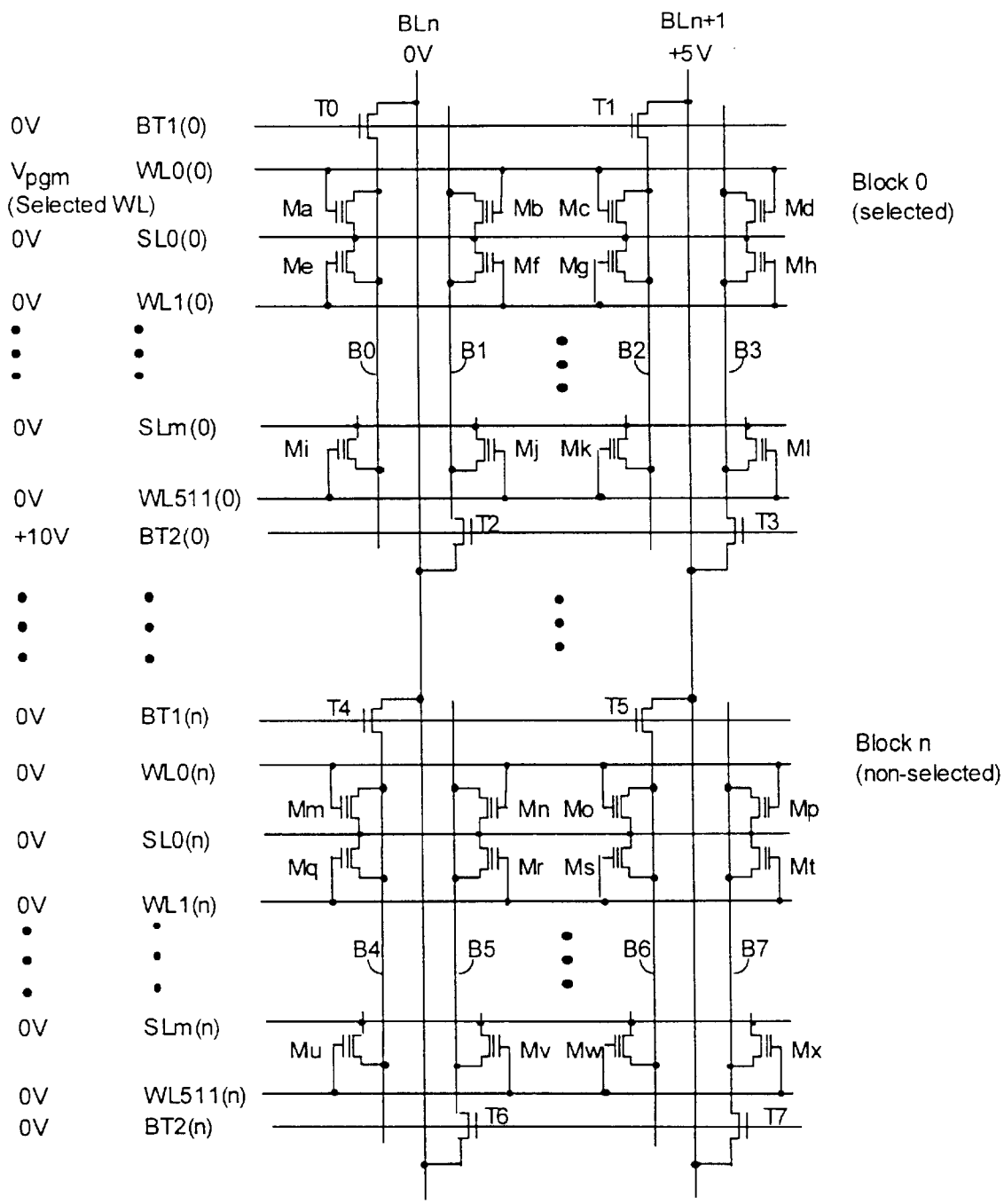
FIG. 14 illustrates the bias conditions for program operations for the ETOX NOR type flash cell array of the present invention.

In FIG. 14 is illustrated a CHE program operation with preferred voltages for WLm(n), global BLn, global SLm, BT1(n), and BT2(n). This operation is performed after correction and is on a bit-by-bit basis. The process is continued until all cells are fully verified. A voltage Vpgm, which is approximately 10V, is coupled to WL0(0), and the remainder of the word lines of WL1(0) to WL511(0) are coupled to 0V. Because all over erased cells have previously been corrected, the −4 v used to shut off any leakage is no longer needed. The CHE program operation performs on a bit-by-bit basis and terminates when all cells in same byte/word are programmed, coupled to a high Vt (>4V). Three concurrent word line voltages are not required for this operation.

Figure 15:
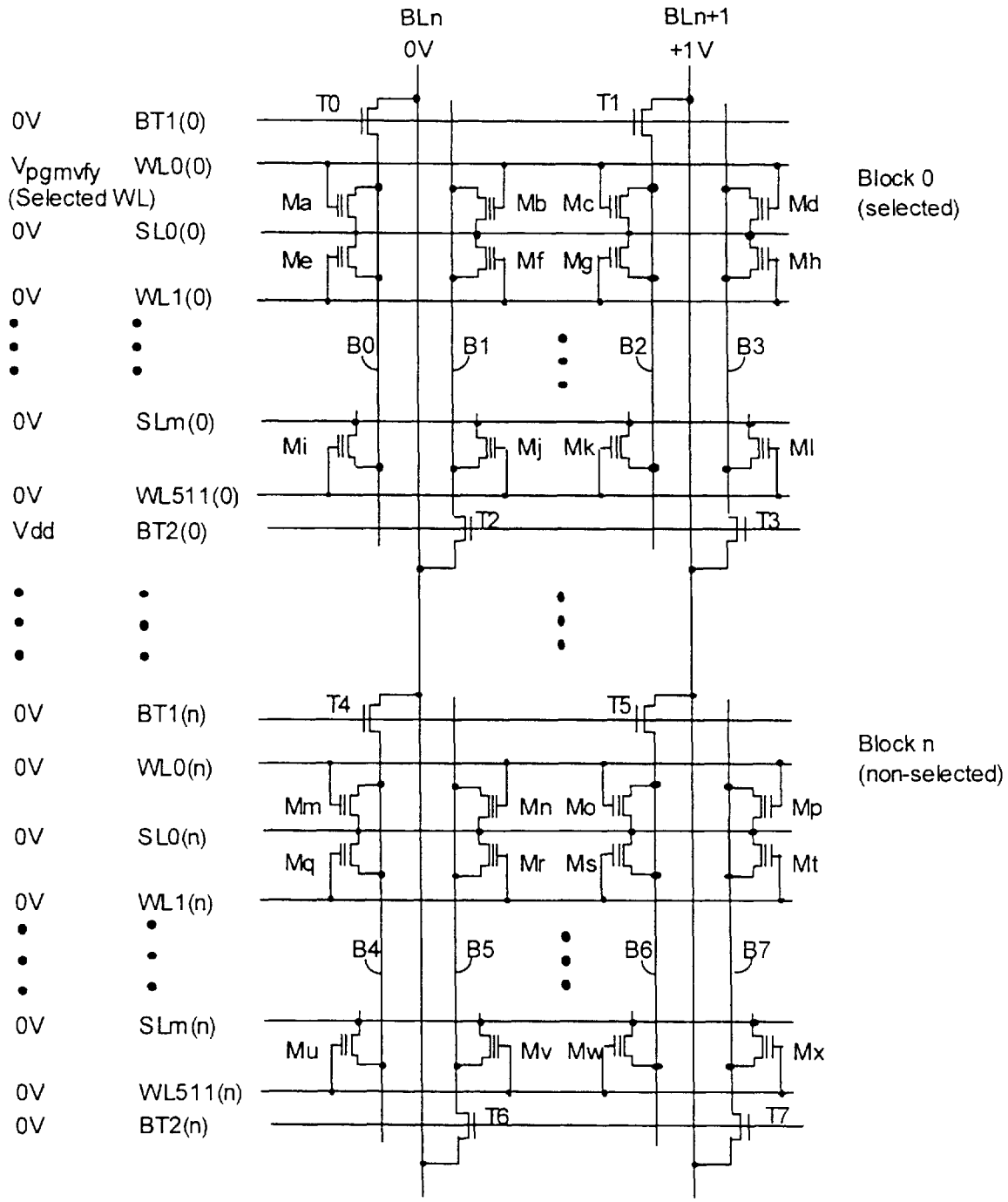
FIG. 15 illustrates the bias conditions for program verify operations for the ETOX NOR type flash cell array of the present invention.
Figure 16:
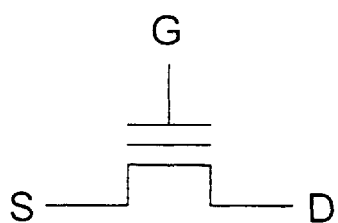
FIGS. 16a through 16e show a single cell operating conditions for AND arrays on P-substrate for the present invention.
Figure 16:
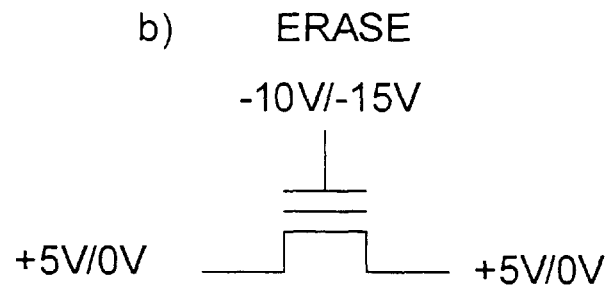
Figure 16:
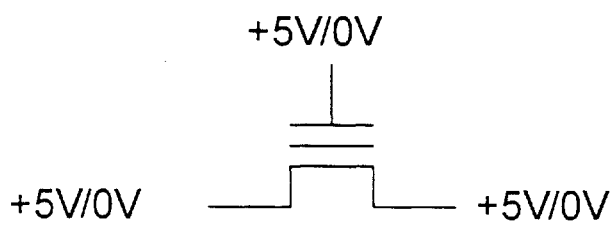
Figure 16:
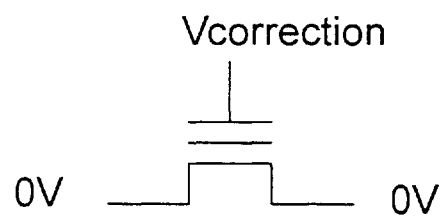
Figure 16:
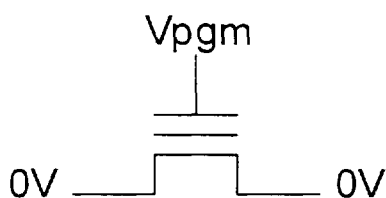
Figure 17:
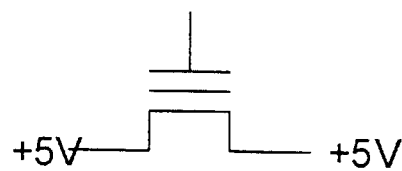
FIGS. 17a through 17f show additional single cell operating conditions for AND arrays on P-substrate for the present invention.
Figure 17:
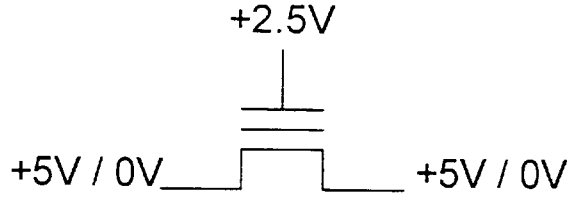
Figure 17:
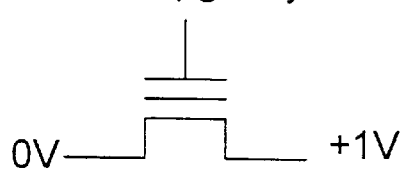
Figure 17:
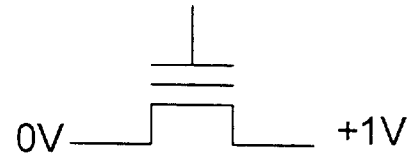
Figure 17:
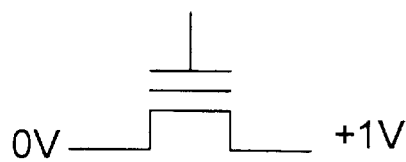
Figure 17:
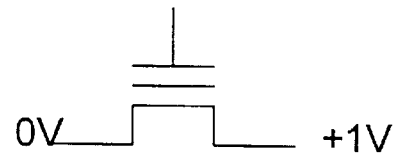

In FIG. 15 a CHE program verify operation is illustrated with preferred voltages for WLm(n), global BLn, global SLm, BT1(n), and BT2(n). This operation is performed in a similar manner as correction verify. The only difference is that the verify voltage for the programmed cell, Vpgmvfy, is set to be approximately +4V for cell Vt of +4V after a CHE program operation. Three concurrent word line voltages are not required for this operation.

In summary, there are three preferred operations for an ETOX array that require a three level voltage word line. These operations include block erase verify, correction and correction verify. In the block erase operation, the word line of the selected page within the selected block is couple with Versvfy, the word lines in the non-selected pages within the selected block are couple to a voltage approximately −4V, and the word lines in the non-selected blocks are couple to 0V. In the correction operation the word line in the selected page of the selected block is coupled to Vcorrection, the non-selected pages in the selected block are coupled to a voltage approximately −4V, and the word lines in the non-selected blocks are couple to 0V. In the correction verify operation the selected page within the selected block is coupled with Vcorvfy, the word lines in the non-selected pages within the selected block are couple to a voltage approximately −4V, and the word lines in the non-selected blocks are couple to 0V.

The second embodiment of the present invention will be described with reference to FIG. 16 through FIG. 27 for an AND array on P-substrate by employing the same three voltage word line technique of the present invention for some preferred operations. The erase operations use both edge and channel to perform the FN method. Erase operation is carried out to decrease Vt of the cells and program increases Vt. The current using FN program and FN erase only causes 10 pA and 10 nA, respectively, per cell.

In FIG. 16a is shown a simplified form of a flash cell on P-substrate of the present invention with three nodes of D, G and S. Where D, G and S stand for drain, gate and source, respectively. The potential of P-substrate is held to ground level and is not shown in the figure. In FIG. 16b a flash cell of the present invention shown biased for two types of erase operations with first set of voltages for D, G and S coupled with +5V, −10V and 5V, respectively, for an edge erase, and the second set of voltages for D, G and S coupled with 0V, −15V and 0V, respectively, for channel erase. Where −10 v and −15V are exemplary values. The exact value and time of the gate voltage in the erase operation varies with different flash technologies. Gate voltages of −15V/−10V and source and drain voltages of 0V/+5V will result in FN tunneling in the channel region for channel erase and edge region for edge erase. The tunneling electrons will flow from the floating gate to the P-substrate and the source and drain to decrease Vt of the cell after a predetermined erase time. The erase operation can be performed on the basis of single page (word line), block (more than 2 word lines), multiple blocks (more than two blocks) and chip (all blocks).

In FIG. 16c is shown a flash cell of the present invention biased in two types of erase inhibit operations with D, G and S coupled to a first set of voltages +5V, +5V and 5V, respectively, for an edge erase, and D, G and S coupled to a second set of voltages 0V, 0V and 0V, respectively, for a channel erase. The erase inhibit operation can be performed on the basis of single page (word line), block (more than 2 word lines), multiple blocks (more than two blocks) and chip (all blocks).

FIG. 16d shows a simplified form of a flash cell on a P-substrate of the present invention with the three transistor nodes of D, G and S biased with 0V, Vcorrection and 0V, respectively, in correction mode. The correction operation is performed on a page basis and is intended to verify the Vt of all cells in one selected word line after an erase operation.

Referring to FIG. 16e, a simplified form of a flash cell is shown on a P-substrate of the present invention with three nodes of the cell transistor D, G and S biased with 0V, Vpgm and 0V, respectively, in a program operation. This operation is performed on page basis and is intended to simultaneously program the selected cells to high Vt (>4V).

FIG. 17a shows a simplified form of a flash cell on a P-substrate of the present invention with three nodes of the cell transistor D, G and S biased with +5V, Vpgm/Vcorrection and +5V, respectively, for program and correction inhibit operation. This operation is intended to prevent non-selected cells from programming and correction in the same word line of the selected block.

In FIG. 17b a simplified form of a flash cell is shown on a P-substrate of the present invention with three nodes of D, G and S biased with +5V/0V, +2.5V and +5V/0V, respectively, for program operation and 0V, +2.5V, and 0V, respectively, for correction inhibit. This is intended to prevent non-selected cells on word lines not selected in the selected block from bit line disturb of programming and correction.

In FIG. 17c a flash cell of the present invention is shown biased in a program verify operation with nodes D, G and S coupled with +1V, Vpgmvfy and 0V. This operation can be performed on page basis. FIG. 17d shows a flash cell of the present invention biased in correction verify operation with D, G and S coupled with +1V, Vcorvfy and +0V, respectively. This operation can also be performed on page basis. In FIG. 17e a flash cell of the present invention is biased in a read operation with nodes D, G and S coupled with +1V, Vread and 0V, respectively. This operation can be performed on page basis. FIG. 17f shows a flash cell of the present invention biased in an erase verify operation with nodes D, G and S coupled with +1V, Versvfy and +0V, respectively. This operation can be performed on page basis.

Figure 18:
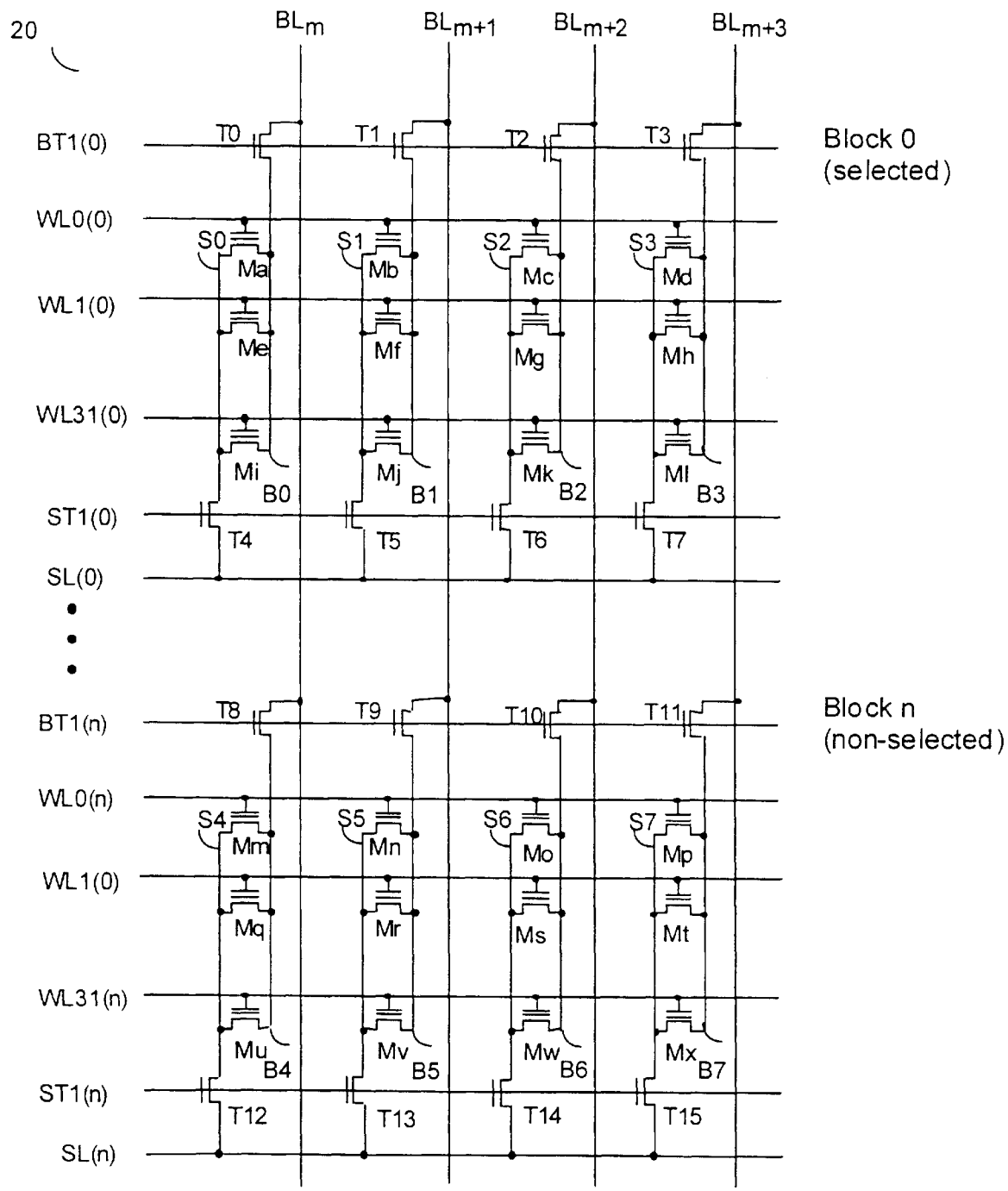
FIG. 18 shows an AND flash cell array of prior art.

In FIG. 18 is shown a conventional AND memory cell, NOR-type flash EEPROM memory array 20. This nonvolatile NOR-type memory array includes a matrix of word lines and bit lines intersecting one another. The AND memory cell Ma to Mx being disposed so as to correspond to each intersection of the matrix of the global bit lines BLm to BLm+3, local bit line Bn, source line SLn and global word lines WLn. The memory cell including a control gate, a drain, a source and a P-substrate is shown in FIG. 1. The control gate is coupled to a corresponding one of the row-wise word lines WLm(n). The drains are coupled to a corresponding one of the local column-wise bit line Bn, and one of the global bit lines BLn is selected by transistor Tn gated by BT1(n). The sources Sn are coupled to a corresponding one of the local row-wise source line SL(n) via transistor Tn gated by ST(n), and the memory cell is capable of performing an FN erase and FN program operations based on the three level word line bias of the present invention. The plurality of control signals of WLm(n), BT1(n), ST1(n) are generated from X-decoder (word line decoder), local bit line decoder, local source line decoder, global bit line decoder and global source line decoder, respectively.

Figure 19:
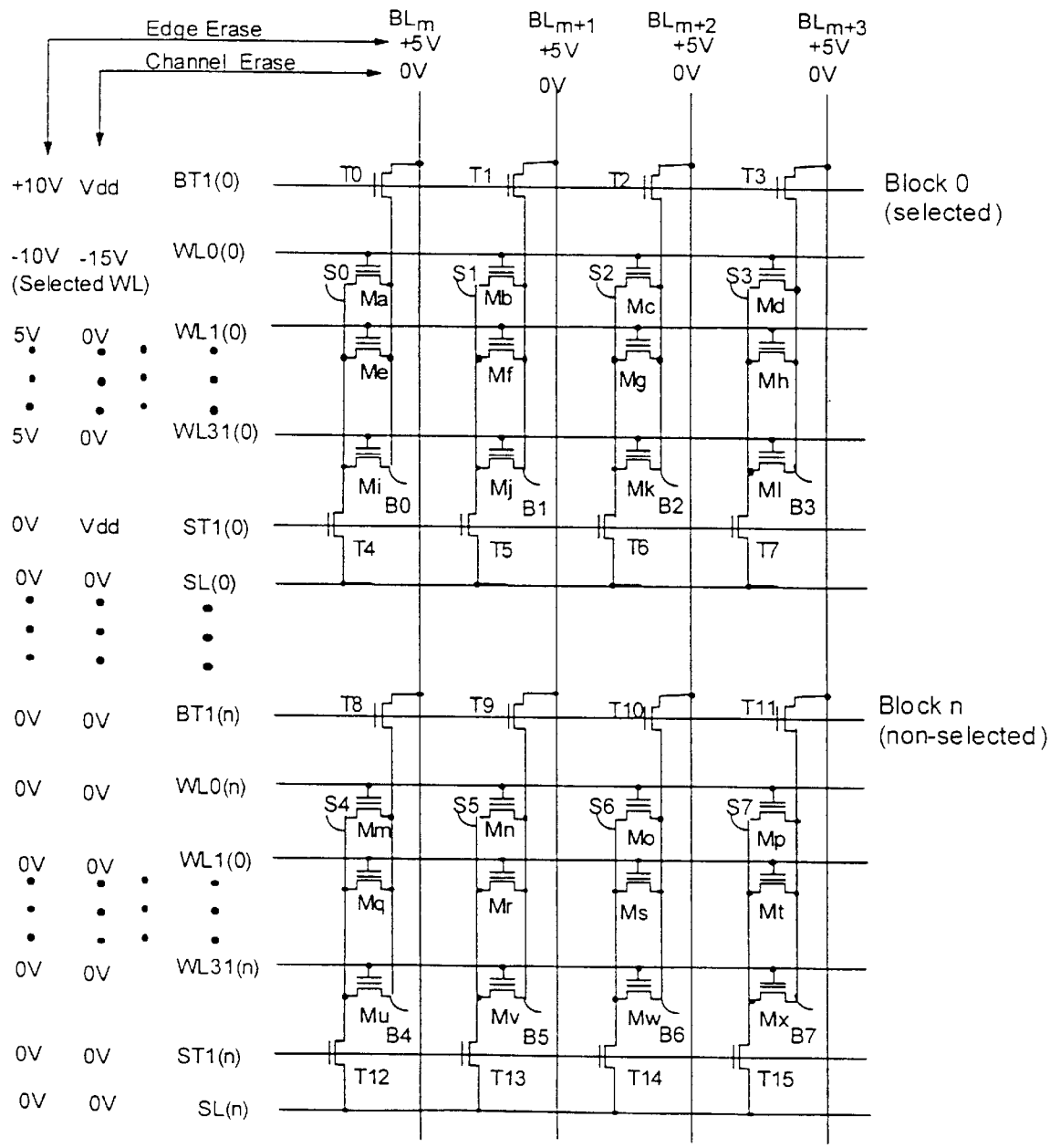
FIG. 19 illustrates the bias conditions for random page erase operation of the present invention for the AND flash cell array of the present invention.

FIG. 19 shows an AND flash array biased in Random page Erase Operation with selected page WL0(0) coupled with −10V and BLm to BLm+3 coupled with +5V for edge erase. Word line WL0(0) is coupled with −15V and BLm–BLm+3 coupled 0V for channel-erase. Word lines WL1(0) through WL31(0) are coupled to +5V for the edge erase operation and coupled to 0V for the channel erase to reduce the erase disturb to those non-selected cells in the selected block, Block 0. The non-selected cells include cells that are in cells Ma–MI of Block 0. The nodes of the rest of non-selected cells in the non-selected blocks are all biased with 0V for the drains, gates and sources. The bias condition for the non selected cells prevents erase disturb of cells of Mm–Mx in non-selected blocks. After the Random page erase operation is performed, the Vt of cells in WL0(0) will be decreased and data "1" is stored in the cells.

Figure 20:
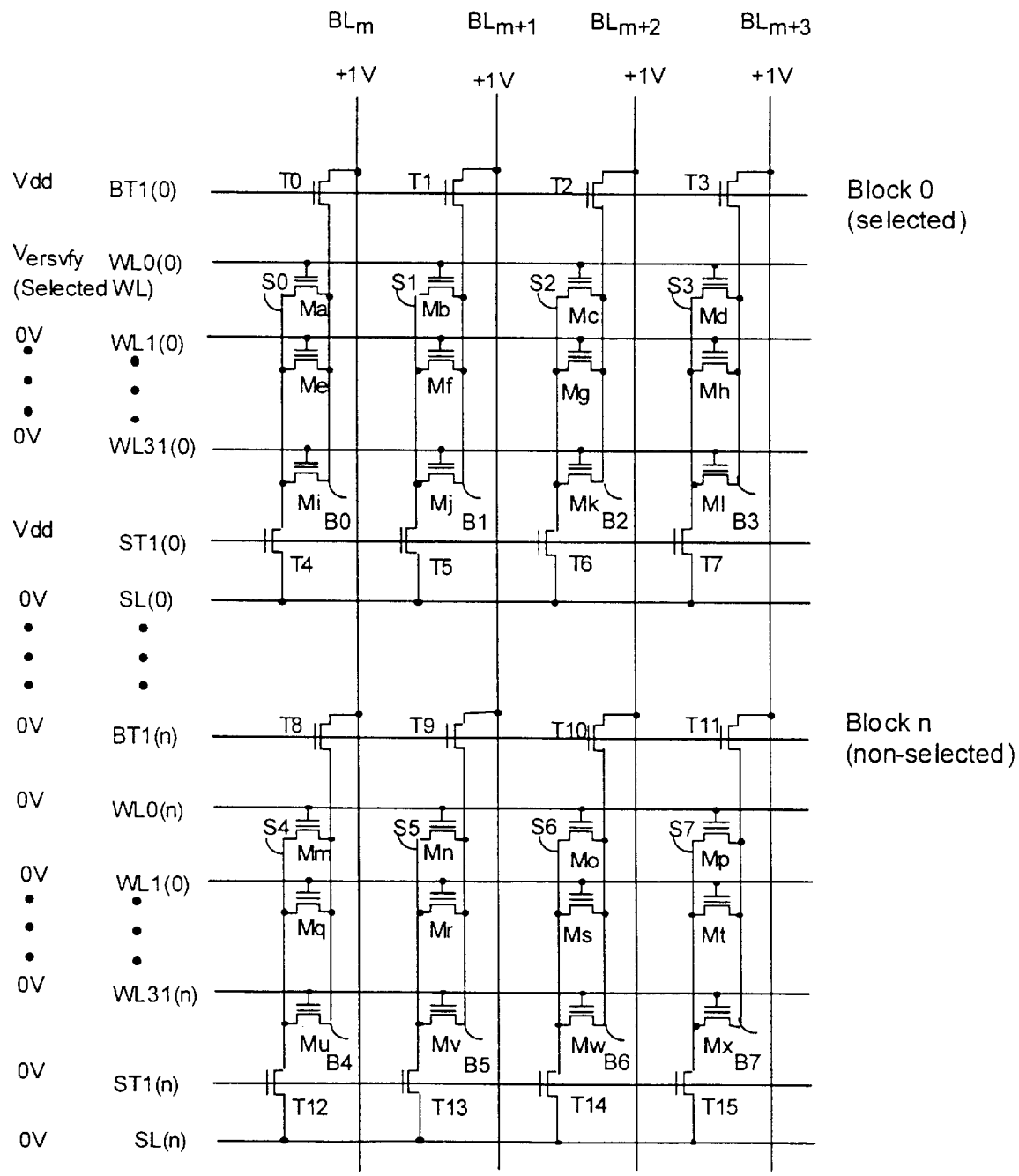
FIG. 20 illustrates the bias conditions for random page erase verify operation of the present invention for the AND flash cell array of the present invention.

FIG. 20 shows a random page erase verify operation with preferred voltages for WLm(n), global BLm, global SL(n), BT1(n) and ST1(n). This operation is performed after the completion of a random page erase. In the present invention, this operation is intended to verify the Vt of those cells erased by verifying that the value of Vt is below +1V. This operation can be carried out on page basis using a plurality of sense amplifies connected to BLm. Random page is an arbitrary page of any block selected to perform erase operation. A confirmed success by page verify means all cells in the selected page have been erased to be data "0" with Vt below +1V. Some fast cells may have been over erased with Vt becoming negative which requires a Vt correction (recovery) in the subsequent operation. In this operation, Versvfy of +1V is coupled to the selected word line (page) for data verification. The rest of word lines are coupled to ground level to shut off the bit line leakage. Since only one word line is selected in this operation, no three voltage word line bias is required.

Figure 21:
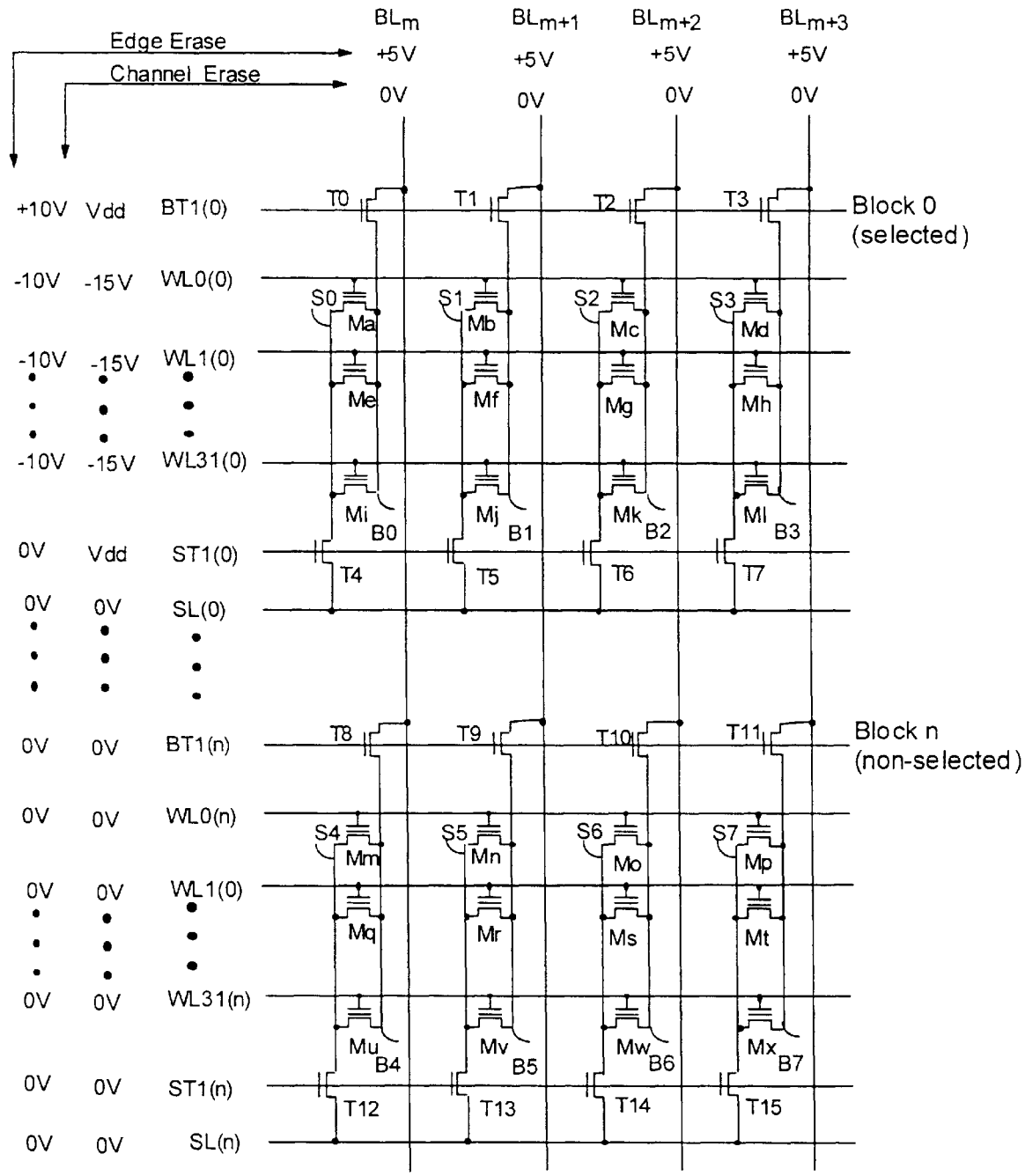
FIG. 21 illustrates the bias conditions for block erase operation of the present invention for the AND flash cell array of the present invention.

In FIG. 21 a block erase operation is shown with preferred voltages for WLm(n), global BLm, global SL(n), BT1(n) and ST1(n). In the present invention, the block erase operation is intended to erase a plurality of cells in a selected block simultaneously. A typical flash block comprises of thirty two word lines and thousands of bit lines. In FIG. 21, cells in Block 0 are selected for erase. Part of the cells in Block 0 include Ma, Mb, Mc, Md on word line WL0(0), Me, Mf, Mg, Mh on WL1(0) and Mi, Mj, Mk and Ml on WL31(0). All word lines from WL0(0) to WL31(0) in Block 0 are coupled to −15V with all selected bit lines from BLm to BLm+3 coupled to 0V for channel erase. All word lines of WL0(0)–WL31(0) in Block 0 are coupled to −10V with all selected bit lines of BLm to BLm+3 coupled with +5V for edge erase. In both cases, source line SL(0) is held at ground level during the erase operation. In edge erase, BT1 is coupled to +10V to transfer +5V from global bit lines of BLm through BLm+3 to local bit lines of B0 through B3. The source control line ST1 is coupled to 0V to shut off the local source lines of S0 through S3 to the common source line of SL(0) in Block 0. In channel erase, BT1 is coupled to Vdd to transfer 0V from global bit lines of BLm through BLm+3 to local bit lines of B0 through B3. The source control line ST1 is coupled to Vdd to connect the local source lines of S0 through S3 to the common source line of SL(0) in Block 0.

Some fast cells may have been over-erased with negative Vt that require a Vt correction (recovery) in the subsequent operation. In this operation, three voltage are not required for the word lines. For the remaining word lines in non-selected blocks are all coupled to ground to avoid any erase disturbance.

Figure 22:
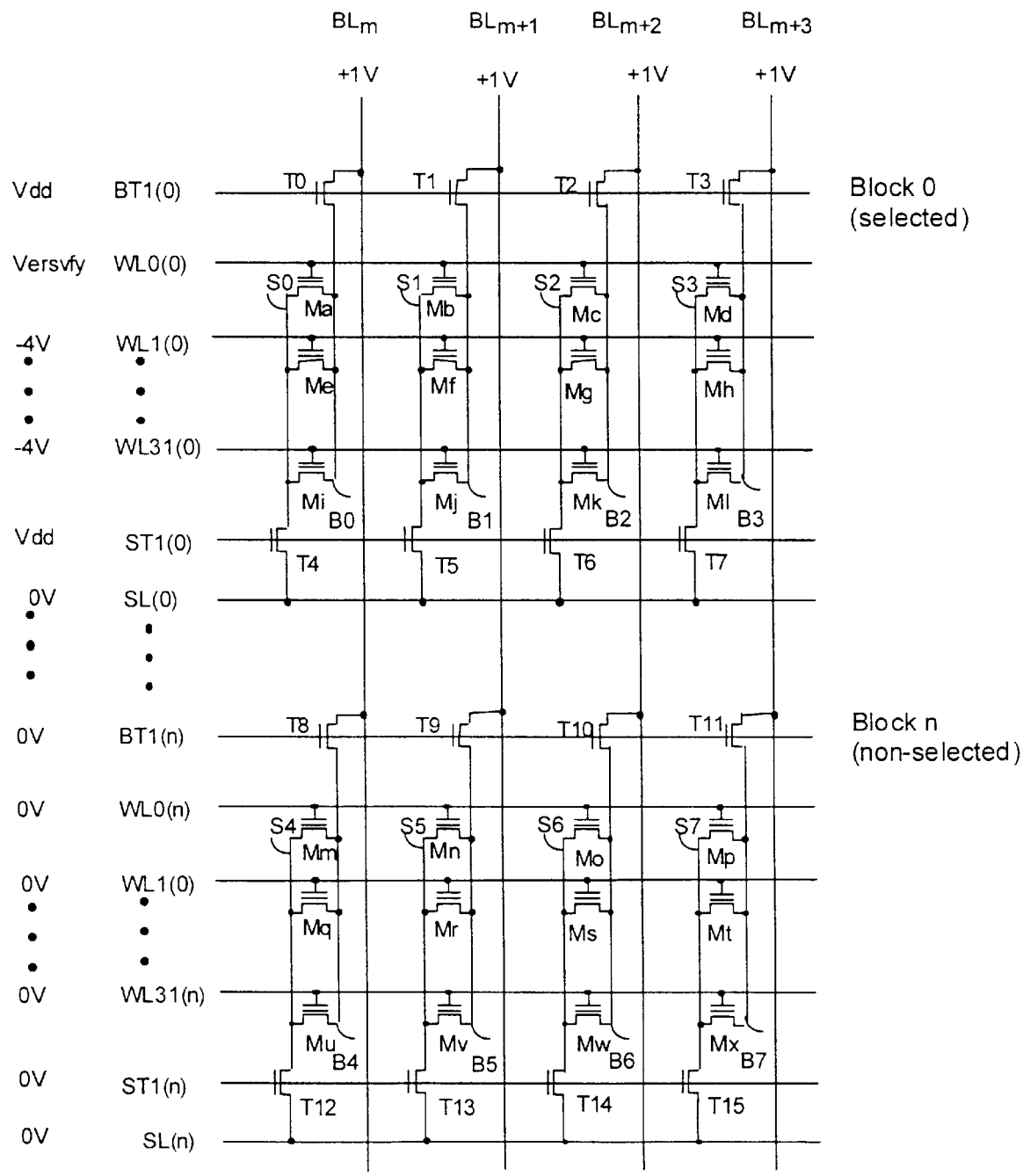
FIG. 22 illustrates the bias conditions for block erase verify operation of the present invention for the AND flash cell array of the present invention.

FIG. 22 shows a block erase verify operation with preferred voltages for WLm(n), global BLm, global SL(n), BT1(n) and ST1(n). In the present invention, the block erase verify operation is intended to simultaneously verify a plurality of cells in a selected block on page basis. Each of the thirty two word lines in Block 0 is sequentially selected for data verification. The cells in WL0(0) are selected at the same time for page verify. In this operation, word line WL0(0) is coupled to Versvfy voltage at approximately around +1V. The rest of word lines in Block 0, WL1(0) through WL31(0), are coupled with −4V to shut off leakage and avoid false verification. The −4V is used with the assumption that the Vt of all cells is not more negative than −4V after block erase operation. The non-selected cells in non-selected word lines in non-selected blocks, Block 1 through Block n, are grounded. In this manner, three voltages are used for word lines to achieve a bit-by-bit verify in the present invention. The three word line voltages include Versvfy for the selected word line, −4V for non-selected word lines in the selected block and 0V for non-selected word lines in non-selected blocks. When all cells in WL0(0) have been verified, the operation is continued to verify the next word line WL1(0). WL0(0) is switched to −4V and WL1(0) is coupled to Versvfy. Then, the same steps used to verify WL0(0) is repeated on WL1(0). When WL31(0) has been verified, the process will terminate. After the completion of this operation, all cells in Block 0 are "0" with Vt less than +1V.

Figure 23:
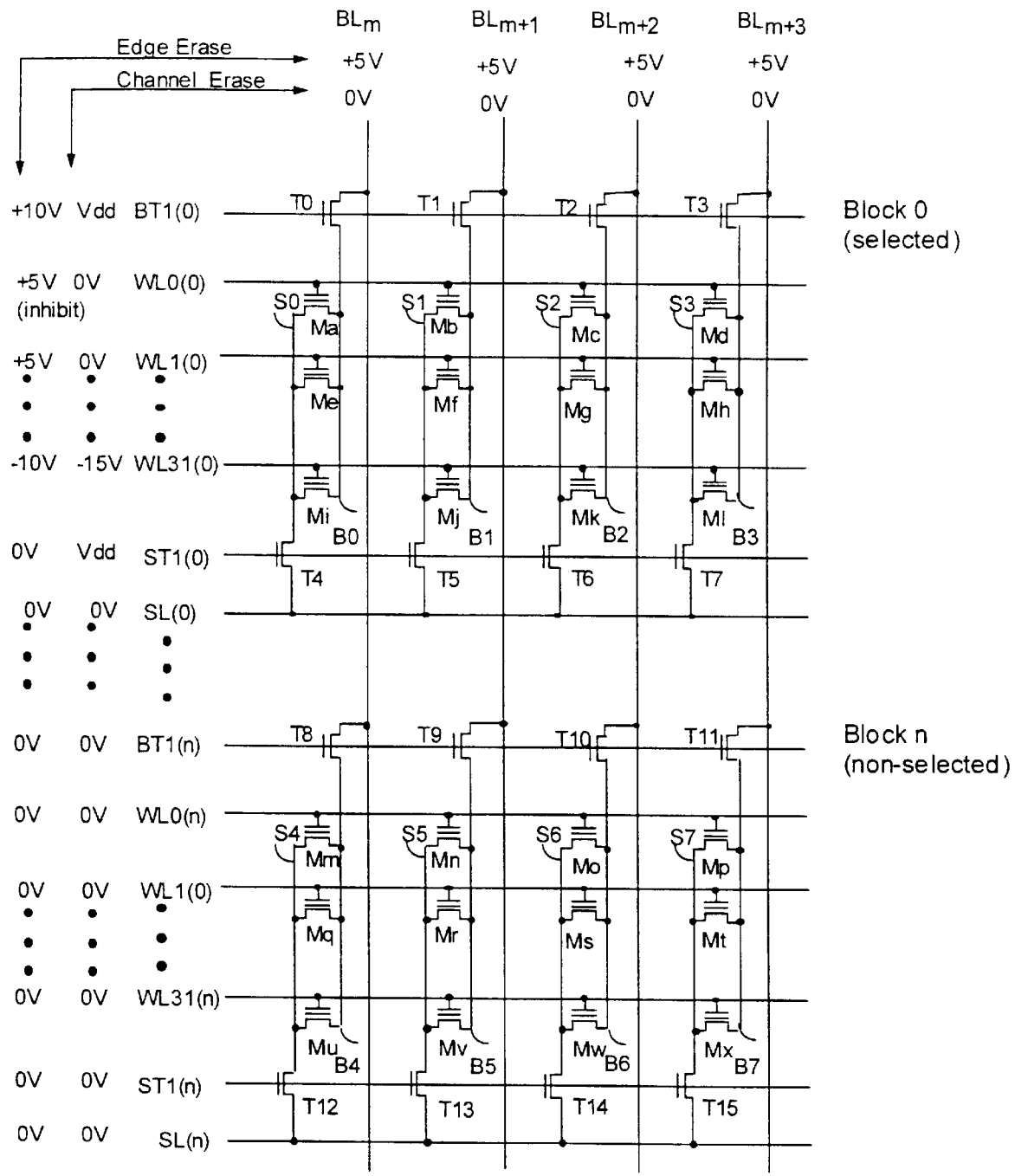
FIG. 23 illustrates the bias conditions for block erase inhibit operation of the present invention for the AND flash cell array of the present invention.

Referring to FIG. 23, a block erase inhibit operation is shown with preferred voltages for WLm(n), global BLm, global SL(n), BT1(n) and ST1(n). The bias conditions for the block erase inhibit operation is provided to further reduce the erase disturbance to those pages which have passed the erase and erase verify during the iterative erase operation. For example, except for word line WL31(0), word lines WL0(0) through WL30(0) have passed the erase verify. Word line WL31(0) is coupled with erase pulse of −15V and −10V for the channel and edge erase operations, respectively. Word lines WL0(0) through WL30(0) are biased to the preferred voltages of 0V for channel erase, or +5V for edge erase, to reduce the disturb in the channel and edge erase operations respectively. The reduction in erase disturb is because the voltage drop across gate-drain and gate-source has been reduced from 5V to 0V for those cells such as Ma–Mh shown in FIG. 23. The three concurrent word line voltages include 5V/0V that have been erase verified in Block 0, −10V/−15V on word line WL31(0) and 0 v/0V applied to non-selected word lines in non-selected blocks Block 1 through Block n, where the voltage designation is for edge erase/channel erase.

Figure 24:
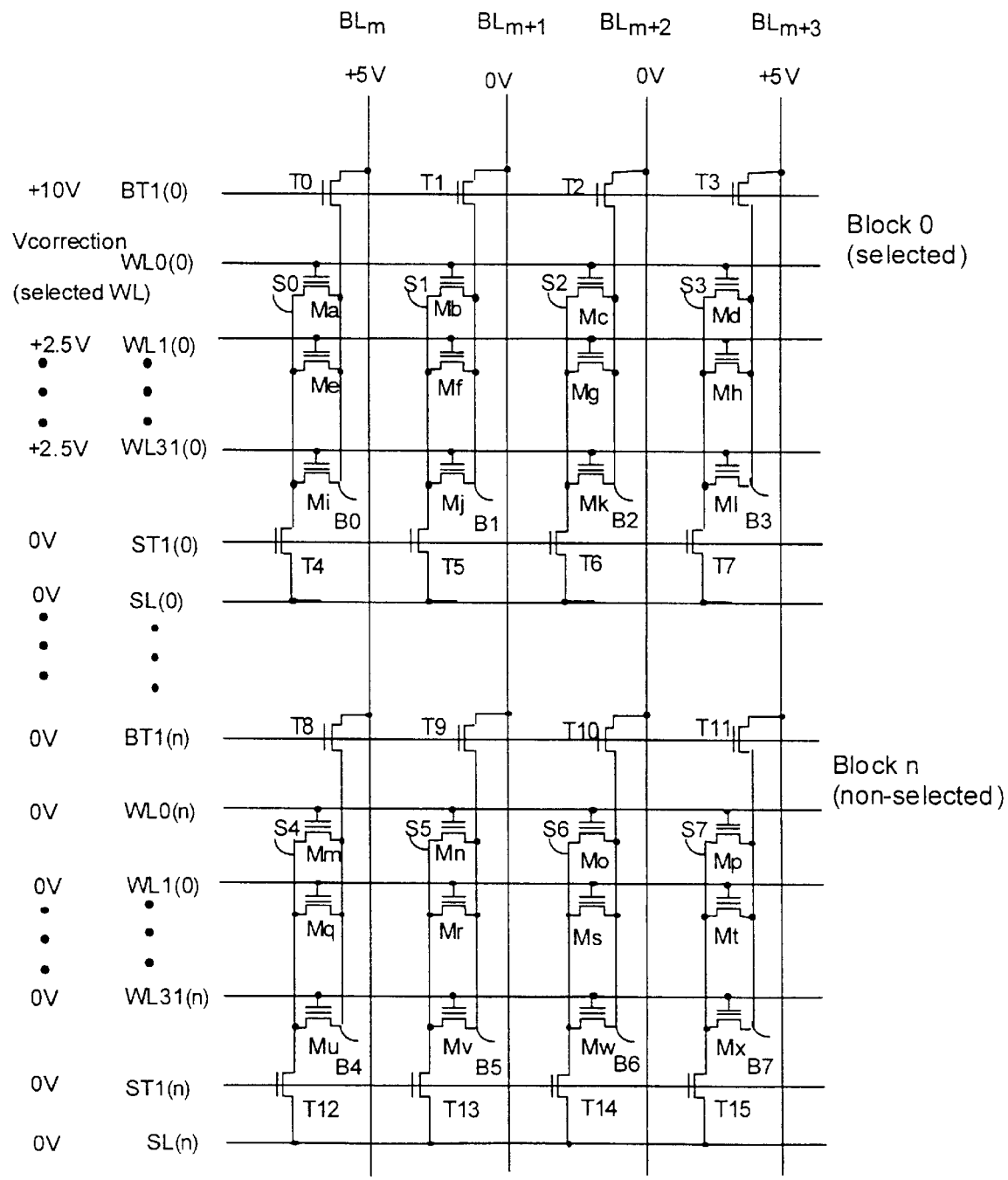
FIG. 24 illustrates the bias conditions for correction operation of the present invention for the AND flash cell array of the present invention.

In FIG. 24 is shown a correction operation with preferred voltages for WLm(n), global BLm, global SL(n), BT1(n) and ST1(n). This operation is provided to correct those pages with over-erased cells and can be performed on bit-by-bit basis. For example, cells of Mb and Mc in word line WL0(0) have been verified to be in an over-erase state requiring a Vt correction. The over-erase state is defined as the Vt below +0.5V. By contrast, cells of Ma and Md have been erased successfully with Vt meeting the desired value which is to be above +0.5V but below 1.0V. The corresponding bit lines of BLm and BLm+3 are coupled to +5V with BLm+1 and BLm+2 coupled to ground to bias Ma and Md in erase inhibit state with Mb and Mc in erase state. The rest of the word lines of WL1(0) through WL31(0) are applied with +2.5V to reduce the correction disturb in selected bit lines. Once WL0(0) is corrected successfully, WL0(0) will be switched to +2.5V and the operation is continued to the next word line WL1(0). This operation will be continued to the last page on word line WL31(0). After the completion of the correction operation, all cells in Block 0 are "0" with Vt below +1V but above +0.5V. The three concurrent word line voltages required for this operation are Vcorrection for WL0(0) in Block 0, +2.5V for word lines WL1(0) through WL31(0) in Block 0, and 0V on non-selected word lines in non-selected blocks Block 1 through Block n.

Figure 25:
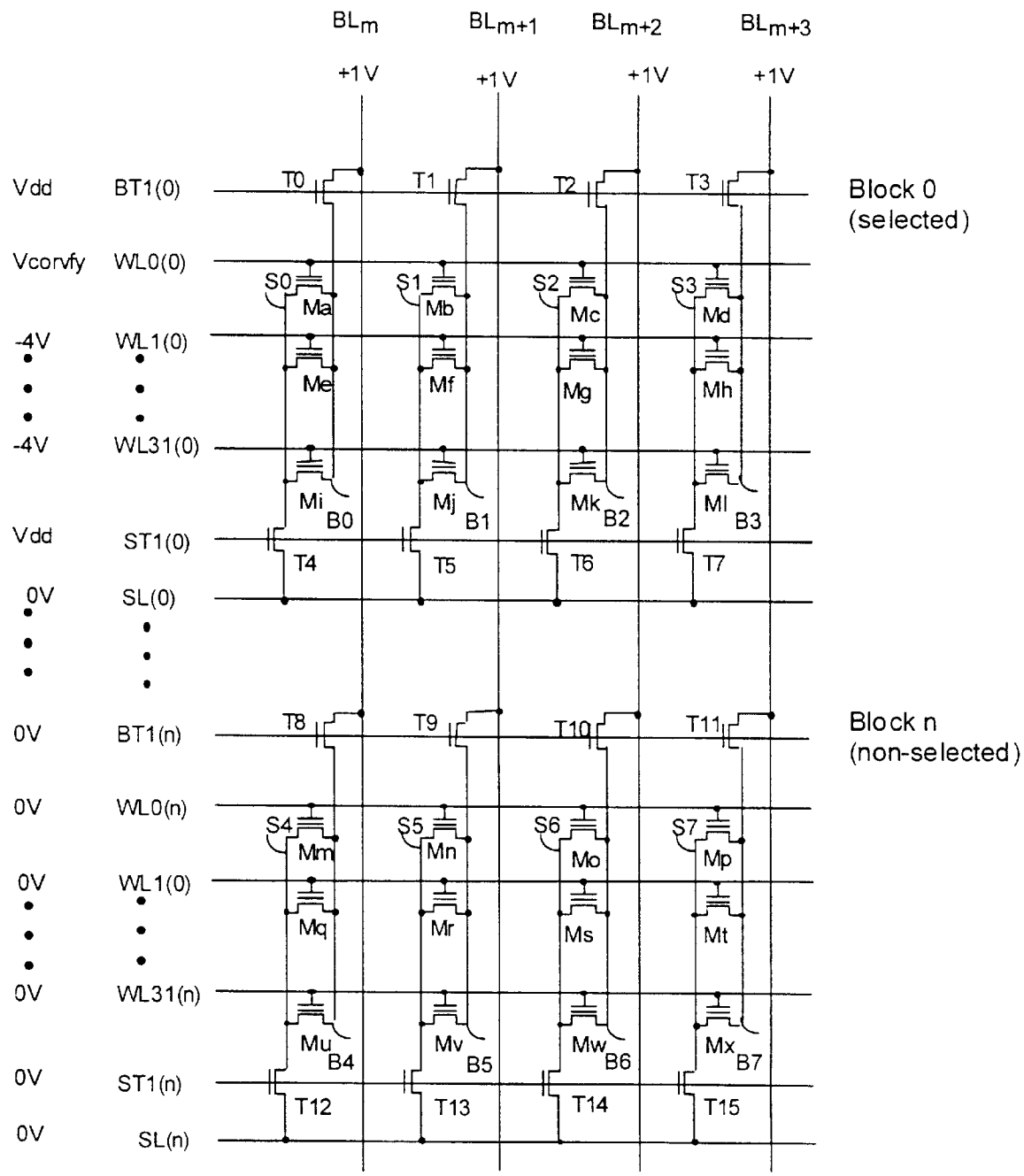
FIG. 25 illustrates the bias conditions for correction verify operation of the present invention for the AND flash cell array of the present invention.

FIG. 25 shows a correction verify operation with preferred voltages for WLm(n), global BLm, global SL(n), BT1(n) and ST1(n). This operation is provided to verify that pages with cells that have been corrected have a Vt below +1V and above +0.5V. For example, cells in WL0(0) can be verified collectively. The correction verify is same as a page read operation. Therefore, through transistors T0–T3, all local bit lines Bn are connected to global bit lines BLm and sense amplifiers with a bias voltage around +1V.

All source lines are held to ground by connecting local source lines Sn to SL(0) by means of transistors T4 through T7 gated by ST1(0). As shown in FIG. 25, three preferred voltages are applied to all word lines concurrently. These three voltages include Vcorvfy on the selected word line, WL0(0) for data verification, −4V on WL1(0)–WL31(0) for shutting off bit line leakage and 0V on non-selected word lines in non-selected blocks Block 1 through Block n for avoiding any undesired disturbance.

Figure 26:
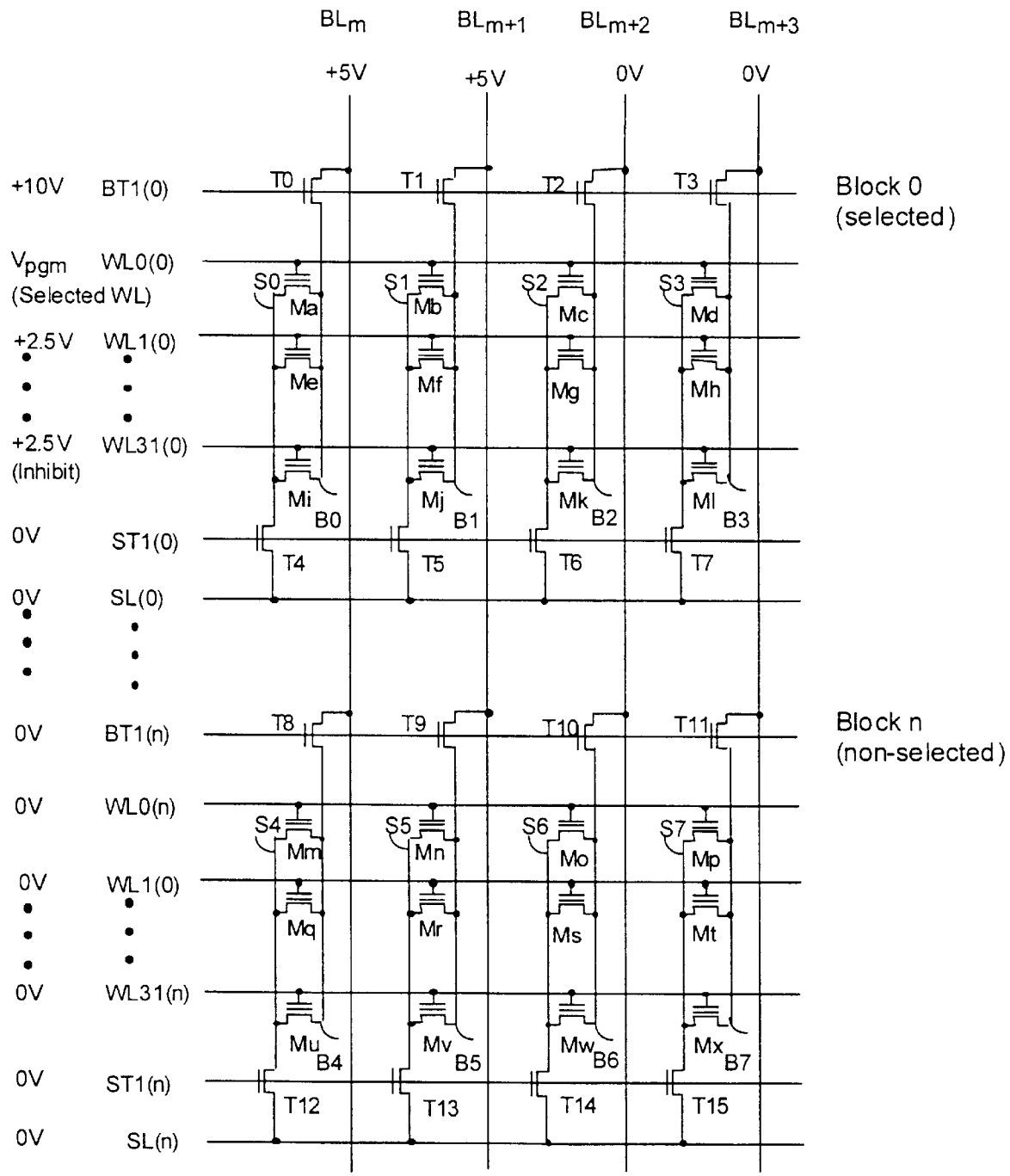
FIG. 26 illustrates the bias conditions for random page program operation of the present invention for the AND flash cell array of the present invention.

FIG. 26 shows a random page program operation with preferred voltages for WLm(n), global BLm, global SL(n), BT1(n) and ST1(n). This operation is intended to change cell data of "0" to "1" on a page basis. The Vt of the cells is changed from + 1.0V to more than +4V. In order to change cell data from "0" to "1" by using the cell bias conditions shown in FIG. 17a. In concert with Vpgm on word line WL0(0), the corresponding bit lines of BLm and BLm+1 are coupled to +5V to inhibit programming on Ma and Mb cells, and BLm+2 and BLm+3 are coupled to ground to enable programming on Mc and Md cells. The rest of the word lines of WL1(0) through WL31(0) are coupled with +2.5V to reduce the +5V disturb in selected bit lines. In this example, the data of Ma and Mb is kept to "0" but the data of Mc and Md is changed to "1." A preferred three voltages are required for this program operation. These three voltages include Vpgm on the selected word line, WL0(0) for channel program, +2.5V on WL1(0)–WL31(0) for disturb reduction and 0V on non-selected word lines in non-selected blocks Block 1 through Block n for zero program disturb. Vpgm is approximately +15V in this operation.

Figure 27:
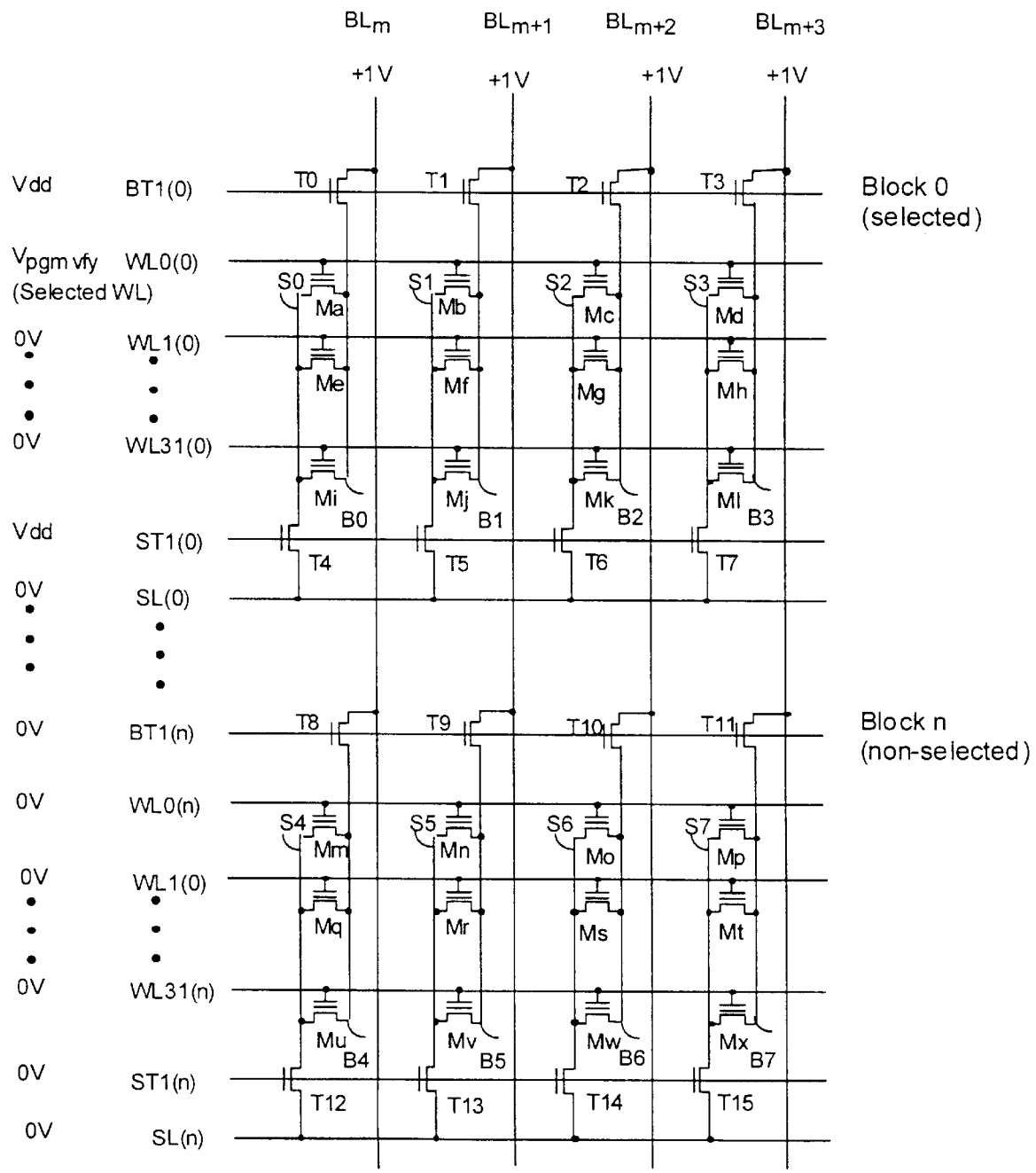
FIG. 27 illustrates the bias conditions for random page program verify operation of the present invention for the AND flash cell array of the present invention.

Referring to FIG. 27, a random page program verify operation is shown with the preferred voltages for WLm(n), global BLm, global SL(n), BT1(n) and ST1(n). This operation is provided to verify those programmed cells in the selected page in the selected block. For example, cells in WL0(0) can be verified collectively. The random page program verify is same as page correction verify operation. The only difference is that Vpgmvfy is larger than Vcorvfy used in the correction verify operation. Vpgmvfy is usually set to be around +4V for checking the Vt of programmed cells. This operation does not require three concurrent word line voltages.

The third embodiment of the present invention is explained with reference to FIG. 28 through FIG. 37. The cells are ETOX cells and are formed on a p-well. The p-well voltage is not always held to ground level as are the cells which are formed on a P-substrate. The detailed voltages for drain, gate, source and p-well nodes are shown in FIG. 28a through FIG. 29d. The operations which use the three voltage word line of the present invention include block erase verify, erase inhibit, correction and correction verify. The operations of this embodiment are similar to the operations shown in FIG. 8–FIG. 15.

FIG. 28b shows a flash cell with bias conditions of the present invention illustrating an erase operation. The nodes D, G, S and Pw are coupled with +5V, −10V, +5V and +5V, respectively, for channel erase, where voltage values are exemplary values. The exact value and time of the control gate's voltage is subject to different flash technologies. The gate voltage of −10V, and source and drain voltage of +5V will result in a tunneling electric field in channel region of the cell. The tunneling electric field will transport electrons from the floating gate to the P-well in order to decrease the Vt of the cells (off-state) after a predetermined erase time. The erase operation can be performed on the basis of single-page (word line), block (N word lines), multiple blocks (M blocks) or chip (all blocks), where N and M are typically larger than two. FIG. 28c shows a flash cell with bias conditions of the present invention illustrating an erase inhibit operation. The first erase inhibit is performed with D, G, S and Pw nodes set to +5 v, +5V, +5V, +5V, respectively, and the second erase inhibit is performed with D, G, S and Pw nodes set to 5V, 5V/0V, 5V and 5V, respectively. This operation is intended to prevent a build-up of disturbance to those non-selected erased cells (in either selected or non-selected blocks) and to achieve better endurance (number of program and erase cycles). Both gate voltages, 0V and 5V, are optional inhibit voltage. The "0V" creates less voltage stress on WL decoder but more disturbances. The "5V" has more voltage stress on WL decoder but less disturbances. The disturbance of both cases is too small to affect the value of Vt even during the specified maximum erase time.

FIG. 28d shows a flash cell with bias conditions of the present invention that illustrates the correction operation with D, G, S and Pw nodes coupled to +5V, Vcorrection , 0V, and 0V, respectively. The exact value and time for the control gate voltage in this operation varies with different flash technologies. The correction operation is a soft program CHE operation. The difference between program and correction lies in the control gate voltage. Normal program operation has about +10V applied to control gate and is intended to increase Vt to more than +5V. Correction has lower control gate voltage to avoid over program. It is used to correct the Vt of cells back to around +1V from either negative or below +0.5V to avoid sub-threshold leakage during subsequent read or program operations. The operation of FIG. 28d is sometimes referred to as recovery. The data becomes a logical "0" after this operation.

FIG. 28e shows a flash ETOX cell with the bias conditions of the present invention illustrating the CHE program operation with D, G, S and Pw nodes coupled to +5V, Vpgm, 0V and 0V, respectively. In the CHE program, there is a conduction current flowing from drain to source and causing an electron-hole pair generated at drain node. Electrons are attracted to the floating gate to increase Vt by the positive high voltage Vpgm, which increases the Vt of the cells. The CHE program typically consumes more than 300 uA per cell. With weak on chip charge pump circuits operating at Vdd below 3V, only about 4 bits can be programmed simultaneously. The cell data becomes a logical "1" after this operation is performed.

In FIG. 29a, a flash cell with bias conditions of the present invention illustrates the program verify operation with D, G, S and Pw nodes coupled to +1V, Vpgmvfy, 0V and 0V, respectively. The Vpgmvfy is an adjustable voltage input to the control gate of the cells to meet different Vt requirements in the program operation. For example, for storage of more than 2-bits per cell, Vpgmvfy may vary from as low as 3Vup to about 5V or more. For a binary program, Vpgmvfy is set to be around +5V. For storage of multiple states such as 1V, 2V, 3V, and 4V, Vpgmvfy is set to 1V, 2V, 3V and 4V accordingly to verify each state In FIG. 29b, a flash cell with bias conditions of the present invention illustrates the correction verify operation with D, G, S and Pw nodes coupled to +1V, Vcorvfy, 0V and 0V, respectively. The Vcorvfy is an adjustable voltage input to the control gate to meet different Vt requirements in this operation. The Vt of over erased cells will be recovered back to a Vt-window of between +0.5V and 1.0V, after this operation is performed.

FIG. 29c shows a flash cell with bias conditions of the present invention illustrating a read operation with D, G, S and Pw nodes coupled to +1V, Vread, 0V and 0V, respectively. The Vread is an adjustable voltage input for the control gate for the read operation. Vread can be simply set to Vdd; however, in some designs, Vread is set to a clamped value so that the read voltage applied to the control gate can be independent of Vdd variation. In some designs, the Vread voltage is boosted to be higher than Vdd, resulting in higher read current.

Shown in FIG. 29d is a flash cell with bias conditions of the present invention illustrating an erase verify operation with D, G, S and Pw nodes coupled to +1V, Versvfy, 0V and 0V, respectively. The Versvfy is an adjustable voltage input to the control gate for this operation. In the conventional ETOX cell, Versvfy is set to be around +2.5V to reduce the number of over erased cells because the correction cannot be performed in truly bit-by-bit mode as in regular program operation. The correction is done in a collective mode. When the number of over-erased cells increases to some level, the correction current will overload the on-chip charge pump and fail to recover the Vt of the cells. In contrast, Versvfy is set to be +1V in the present invention and as a result of the 3-level word line voltage is used to perform bit-by-bit correction. There are many cells in many bit lines, but only one cell per one selected bit line is corrected simultaneously. Therefore, current over load will not occur and the corrected Vt can be set accurately.

Figure 28:
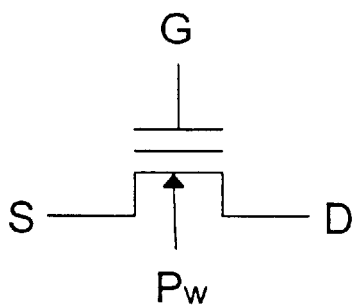
FIGS. 28a through 28e show a single cell operating conditions for ETOX NOR arrays on a P-well for the present invention.
Figure 28:
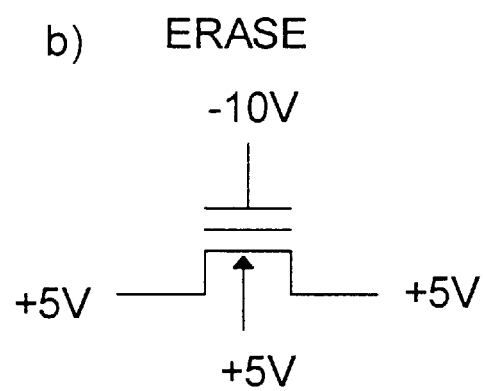
Figure 28:
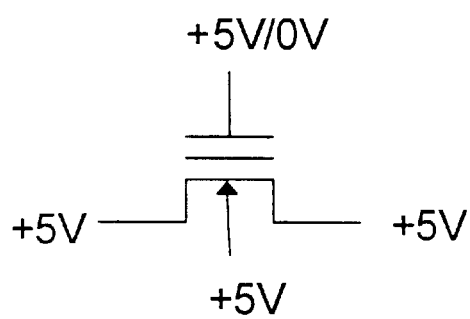
Figure 28:
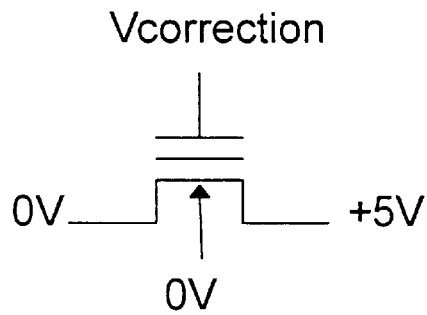
Figure 28:
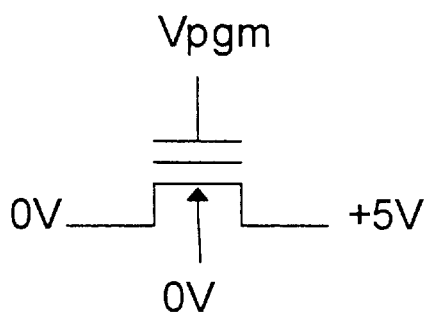
Figure 29:
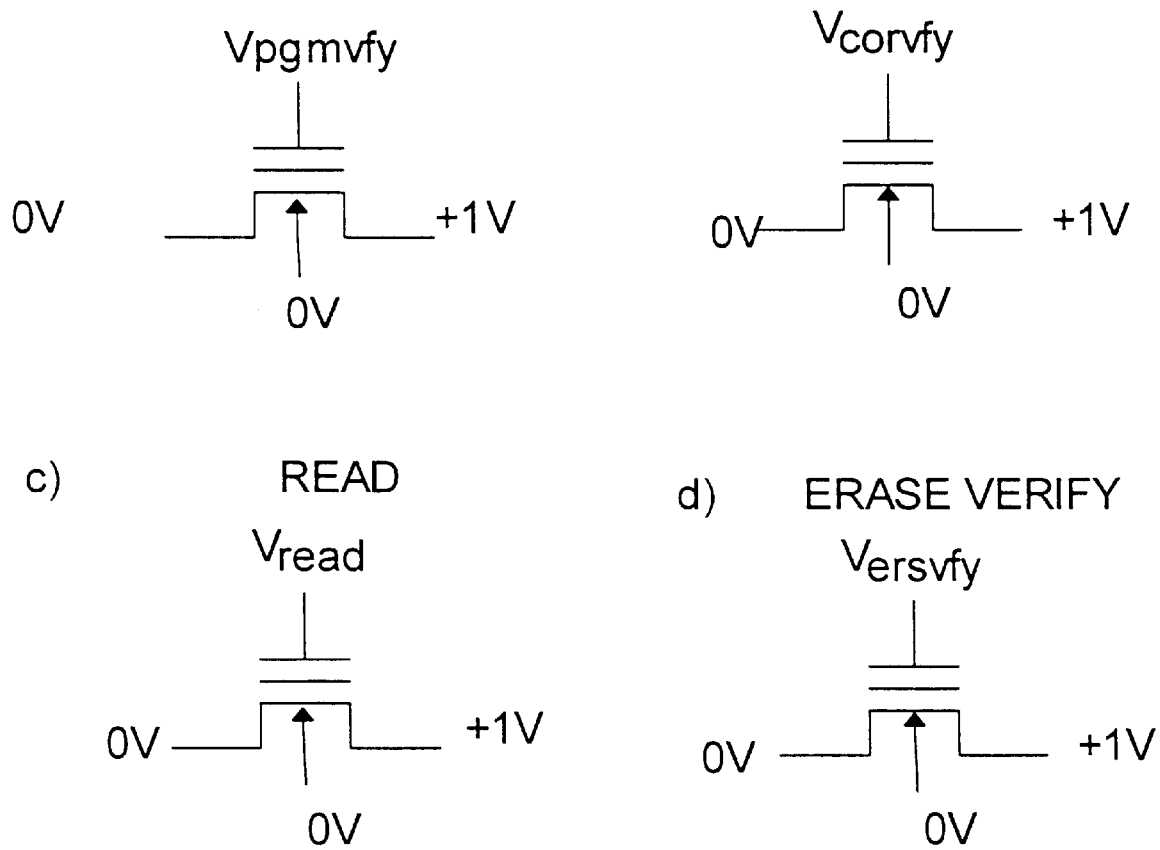
Figure 30:
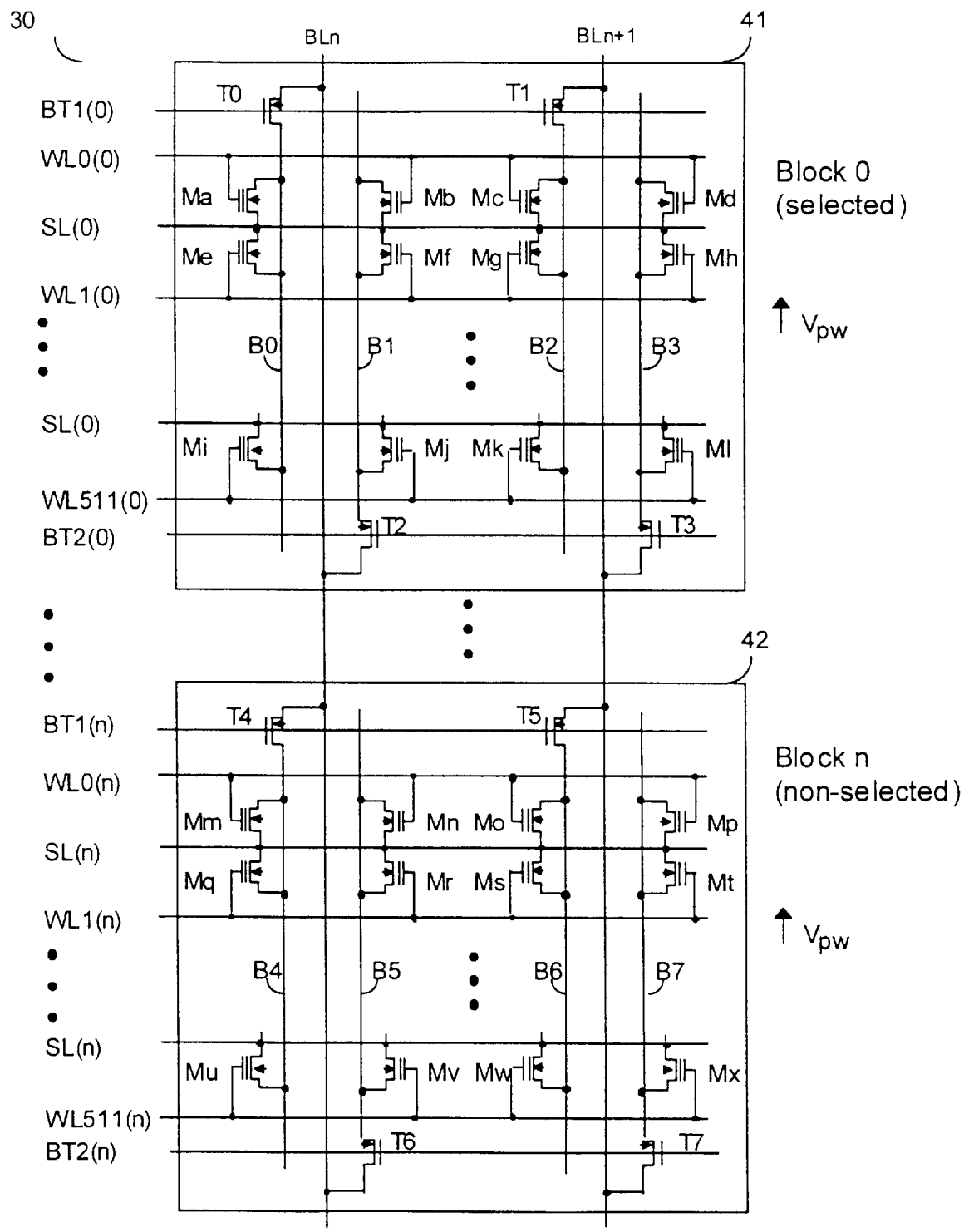
FIG. 30 illustrates an ETOX NOR flash cell array on a P-well of prior art.

In FIG. 30 is shown a conventional ETOX NOR type flash EEPROM memory array formed on a P-well 30. This nonvolatile NOR-type memory array includes: a matrix of word lines and bit lines intersecting one another; and an ETOX memory cell being disposed so as to correspond to each intersection of the matrix of the global bit lines BLn–BLn+1, local bit line Bn, source line SLn and global word lines WLn. The memory cell including a control gate, a drain, a source and a P-well is as shown in FIG. 28. The control gates are coupled to a corresponding one of the row wise word lines WLm(n), the drains are coupled to a corresponding one of the local column wise bit line Bn and one of the global bit line BLn selected by transistor Tn gated by BT1(n) and BT2(n), and the sources are coupled to a corresponding one of the local row wise source lines SLm The memory cell is capable of performing a FN erase and a CHE program operation based on the 3-level word line of the present invention. The plurality of control signals of WLm(n), BT1(n) and BT2(n) are generated from an X-decoder (word line decoder), local bit line decoder, local source line decoder, global bit line decoder and global source line decoder, respectively.

Figure 31:
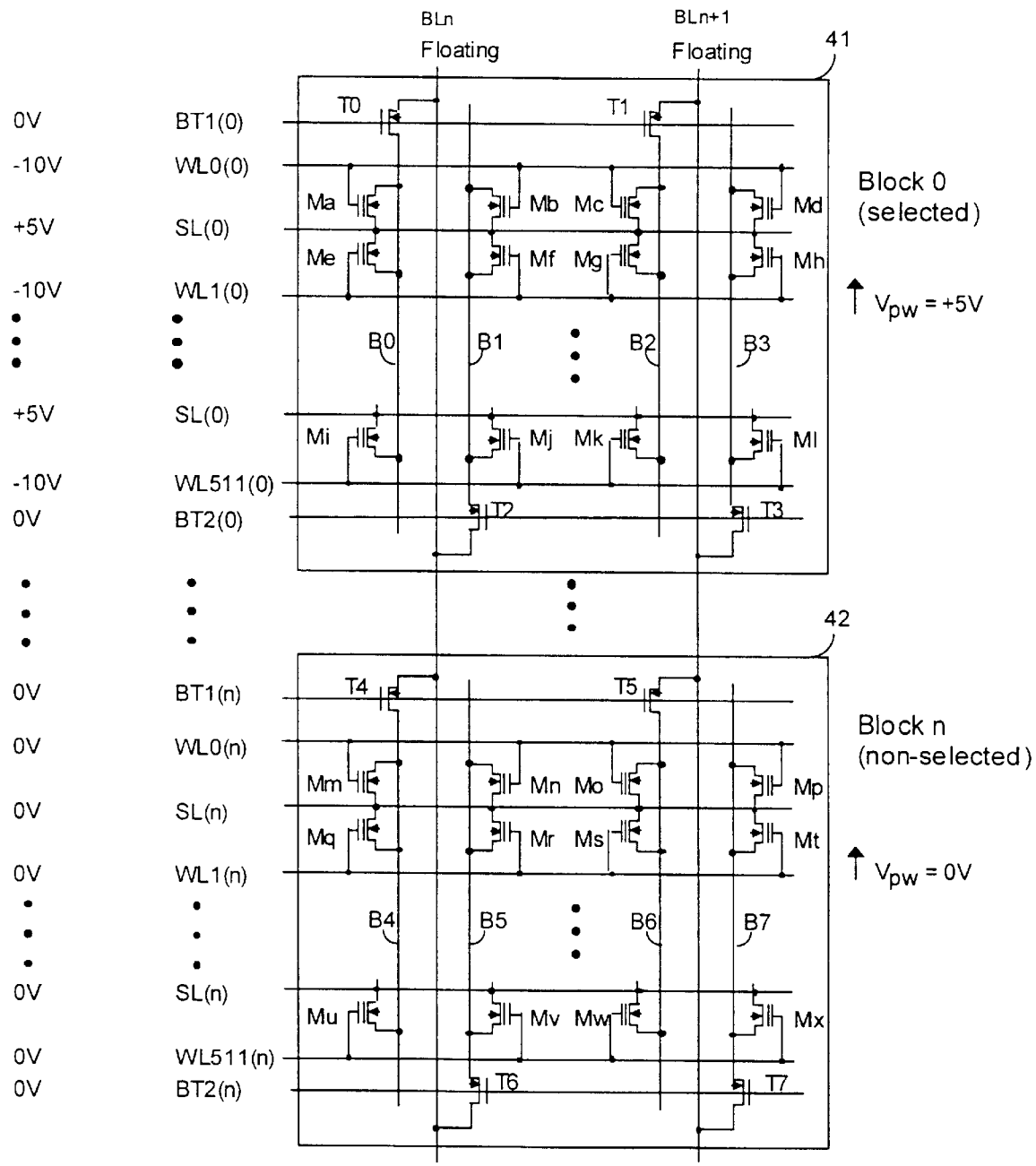
FIG. 31 illustrates the bias conditions for block erase operations of the present invention for the ETOX NOR array of prior art on a P-well.

Shown in FIG. 31 is a block erase operations for a conventional ETOX NOR type flash EEPROM memory array formed in a P-well 41 and 42. The block erase is an channel erase operation. For a channel erase operation, an erase voltage of −10V is coupled to the corresponding row wise word lines, WL0(0)–WL511(0) for selected Block 0, and ground is coupled to the non-selected word lines in the rest of the blocks. The drains of the cells are left floating by the corresponding local column wise first level metal bit lines B0–B3 and the second global metal bit lines BLn–BLn+1 via transistors of T0 and T1 which are gated by applying 0V to BT1(n) and BT2(n) signals. The sources are coupled to 5V by a corresponding plurality of row wise source lines SL(O). The P-well voltage for Block 0 is set to +5V, and the P-well for the blocks not being erased, Block n is set to 0V. The channel erase conditions are applied so that the memory cells of Ma–Ml in the word lines in Block 0 are capable of performing a FN erase operation. The Vt of the cells are decreased after the erase operation is performed. The flash cells of Mm–Mx in non-selected Block n are kept undisturbed. The erase operation is designed to be an iterative process. Each erase pulse width can be set to around 1 ms. Given a shorter erase pulse, a larger number of erase pulses are required. Three concurrent word line voltages are not required in this block erase operation.

Figure 32:
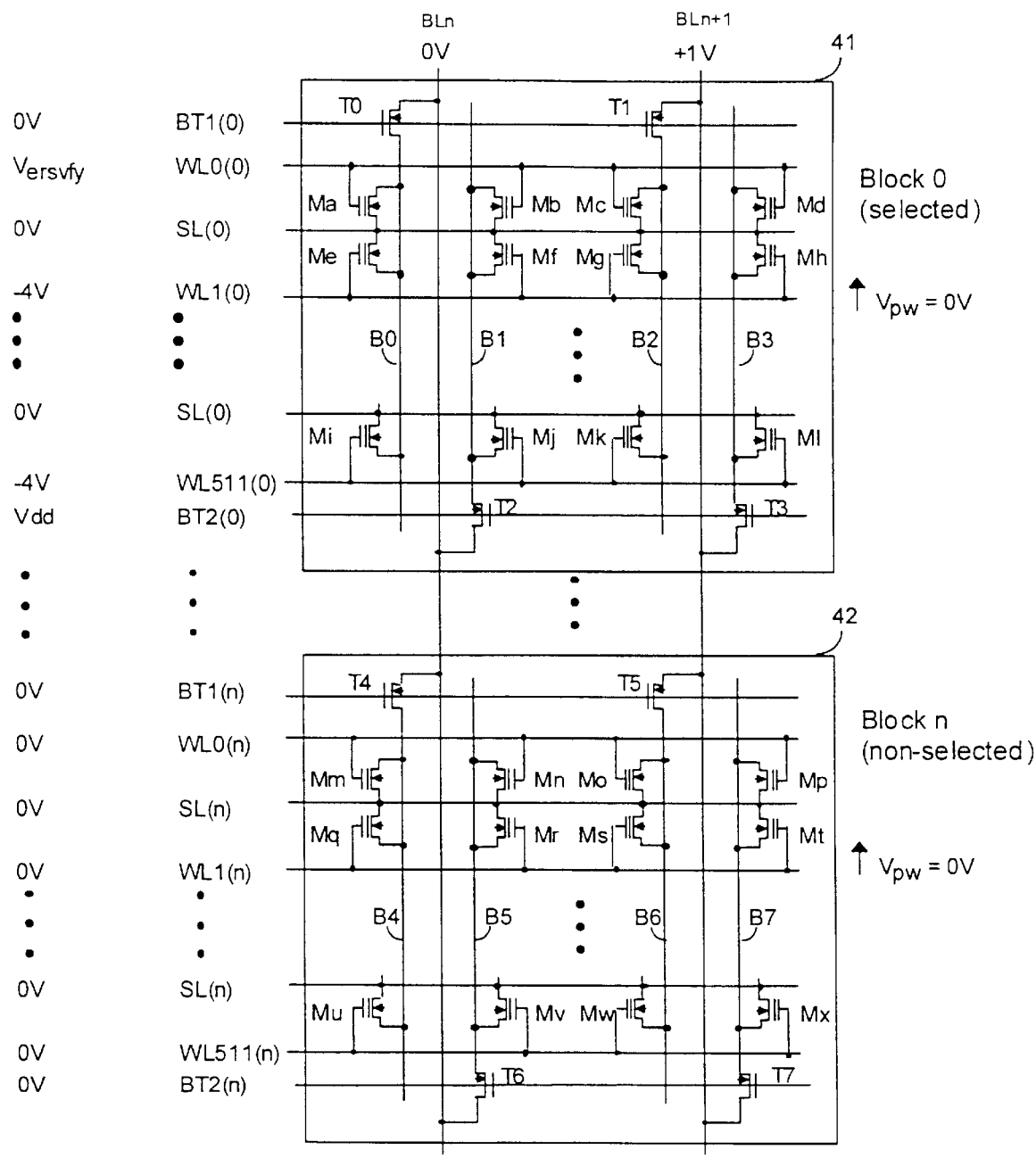
FIG. 32 illustrates the bias conditions for block erase verify operations of the present invention for the ETOX NOR array of prior art on a P-well.

In FIG. 32 is illustrated a block erase verify operation for an ETOX NOR array formed in a P-well with preferred voltages for WLm(n), global BLn, global SL(n), BT1(n), and BT2(n), Assuming WL0(0) is first selected for Block erase, then Versvfy is coupled to WL0(0). The rest of the word lines of WL1(0) to WL511(0) are coupled to −4V to shut off any potential leakage caused by over-erased cells that might exist in Block 0. The word line voltage of −4 v is not a fixed number but is set to be able to shut off any leakage current resulted from cells with a Vt less than −4V. All source voltages SL(n) are coupled to ground. Bit line BLn is coupled to 0V and BLn+1 is coupled to 1V for the verify operation. Bit line BLn+1 is then selectively connected to a corresponding sense amplifier for verification. The P-wells 41 and 42 for all blocks are coupled to 0V. The process is continued in the same page until all cells in the page are verified. Then the verify process is moved to the next page of WL1(0) in Block 0. After five hundred and twelve word lines are verified, the block erase verify is terminated. With the successful verification of block erase all cells in the selected block (Block 0) for erase operation become a logical "0". The data for cells in the non-selected blocks remain the same without changes. Although the cells in Block 0 are at a logical "0", there could be over erased cells. The definition of an over erased cell in the present invention is a cell Vt ranging from a negative Vt to a positive Vt but below 0.5V. The over-erase cells will induce leakage and result in false readings so that a Vt correction operation is required. The three concurrent word line voltages, Versvfy, −4V and 0V are required for this operation.

Figure 33:
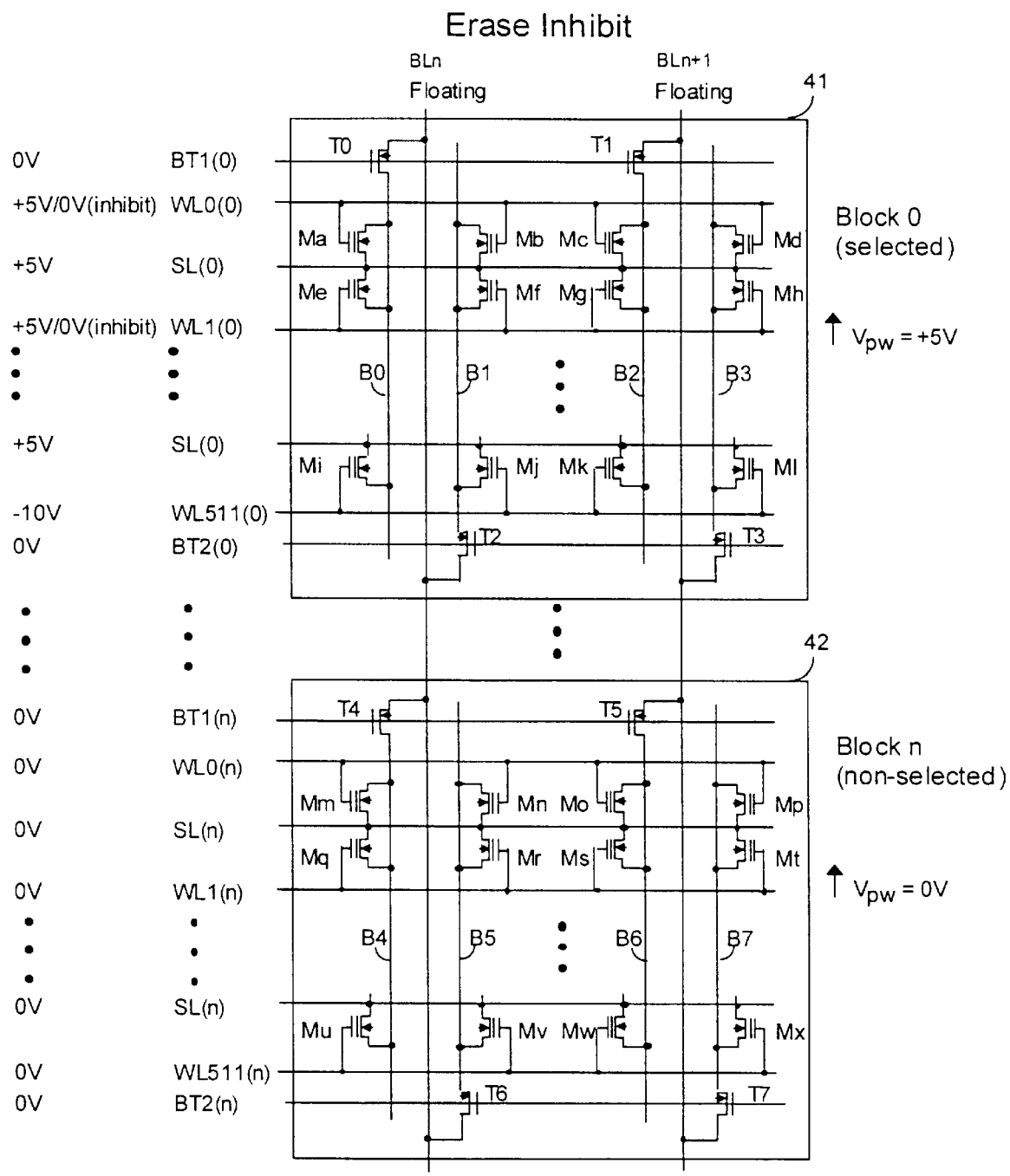
FIG. 33 illustrates the bias conditions for erase inhibit operations of the present invention for the ETOX NOR array of prior art on a P-well.

FIG. 33 shows an erase inhibit operation for an ETOX NOR array formed on a P-well with preferred voltages for WLm(n), global BLn, global SL(n), BT1(n), and BT2(n). This operation is performed on sub-block basis and is intended to set those sub-blocks that have been successfully erased into a de-selected mode to prevent further erase. For example, WL0(0) and WL1(0) are verified to have a successful erase and are set to be in Erase Inhibit mode to avoid the further erase pluses. The way erase inhibit is set, the word line voltage is set to +5V/0V for channel erase with the drain floating and the source voltage at +5V. In the erase inhibit mode the tunneling electric field is reduced so that no tunneling effect will take place. The P-well voltage for the active block, Block 0, is +5V, and the P-well voltage for the other blocks not having an erase operation is 0V. Three concurrent word line voltages are not required for this operation; however, if the operation is used in conjunction with an erase operation there would be three concurrent word line voltages, −10V for word lines being erased, +5 v for inhibiting word lines in the selected block and 0 v for word lines in non-selected blocks Both gate voltages, 0V and 5V, are optional inhibit voltages. The "0V" causes less voltage stress on WL decoder but more disturbance. The "5V" causes more voltage stress on WL decoder but less disturbance. The disturbance of both cases is too small to affect the value of Vt even during spec maximum erase time.

Figure 34:
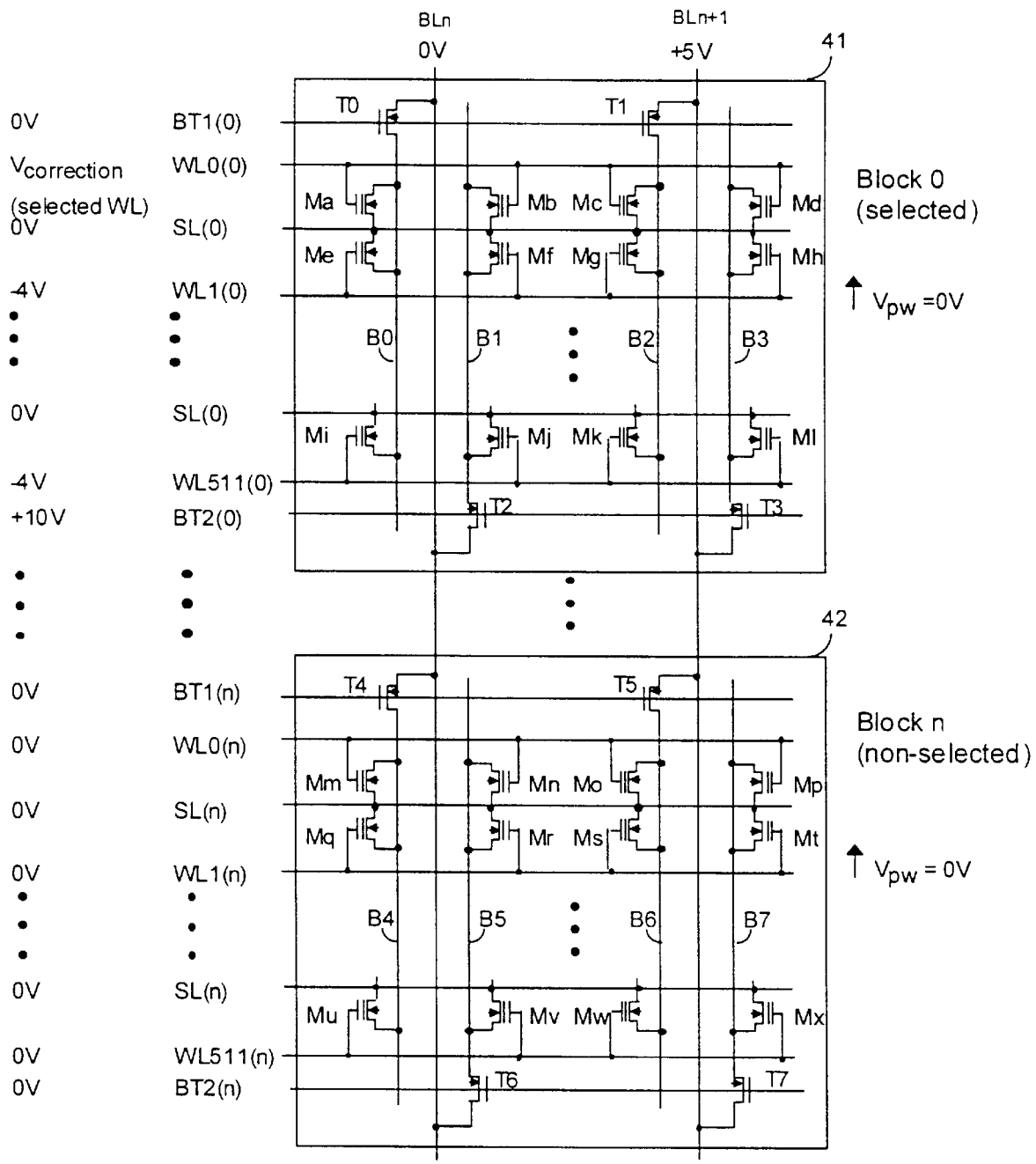
FIG. 34 illustrates the bias conditions for correction operations of the present invention for the ETOX NOR array of prior art on a P-well.
Figure 35:
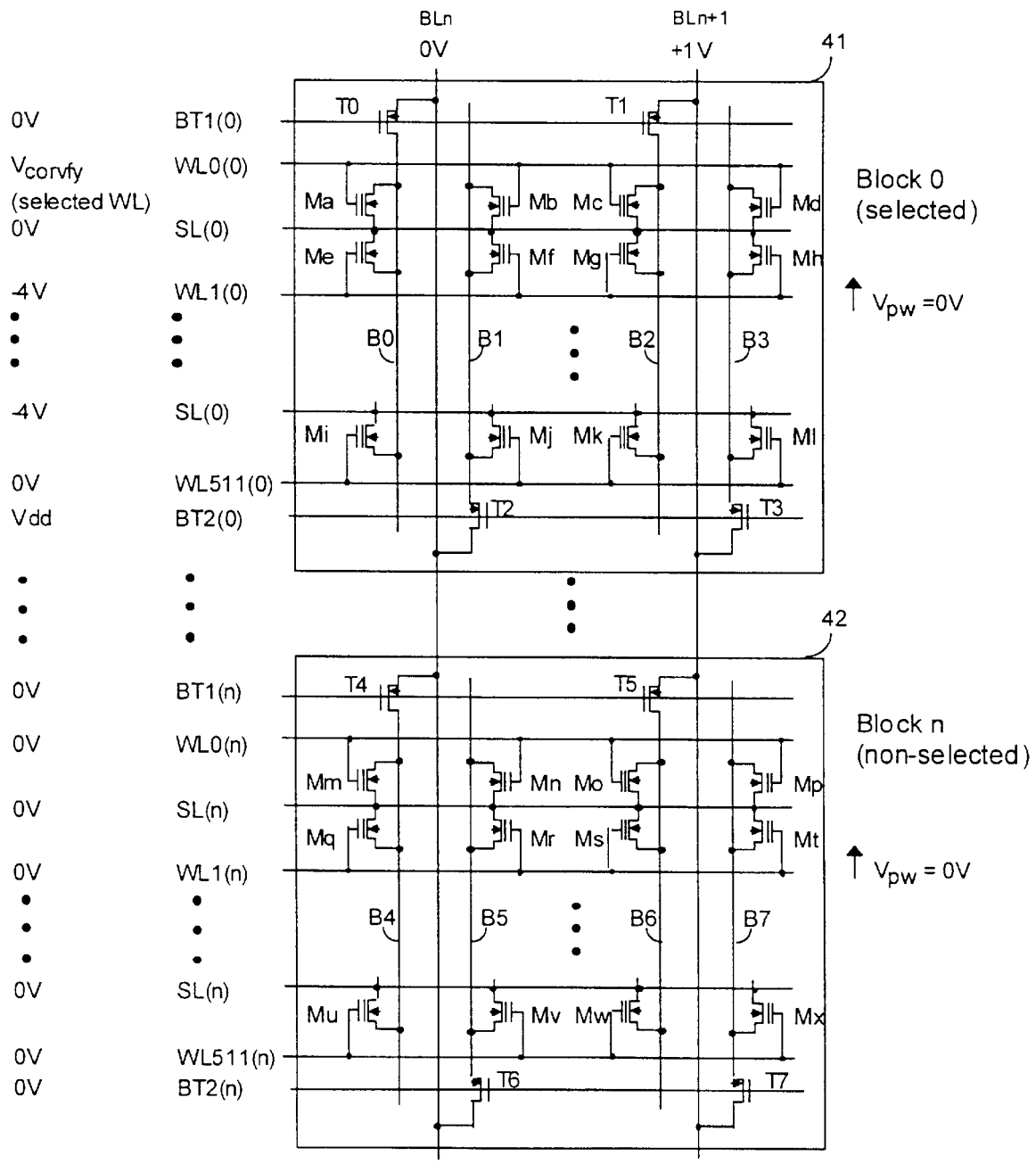
FIG. 35 illustrates the bias conditions for correction verify operations of the present invention for the ETOX NOR array of prior art on a P-well.

In FIG. 34 a correction operation is illustrated with preferred voltages for WLm(n), global BLn, global SL(n), BT1(n) and BT2(n). The correction operation is performed on a bit-by-bit basis and is intended to correct those over erased cells to a Vt voltage that is above +0.5V but below +1.0V. The process is repeated to correct all cells in one selected word line WL0(0) and then moved to correct the cells in next word lines of Block 0. A Vcorrection voltage is coupled to the first selected word line WL0(0) along with a bit line voltage of 5V in order to perform a CHE soft program. The Vcorrection voltage is set to be less than +10V while the rest of the word lines of WL1(0) to WL511(0) are coupled to −4V to shut off any potential leakage due to over erased cells that might be existing in Block 0. The −−4V is an approximate value and is of sufficient magnitude to be able to shut off any leakage current resulting from cells with Vt less than −4V. All source voltages of SL(0)–SL(n) are coupled to ground along with bit line BLn. Bit line BLn+1 is couple to 5V for the correction operation. The P-well of all blocks is couple to 0V. The process is continued in a same page until all cells in same page are corrected and then the process moves to correct next page WL0(1) in Block 0. After all word lines in a block are successfully corrected, the correction process is terminated. With the successful correction, all cells in the selected block (Block 0) become "0". The data of cells in the non-selected blocks remain the same without changes. This operation requires the use of three concurrent word line voltages, Vcorrection, −4V, and FIG. 35 illustrates a correction verify operation with preferred voltages for WLm(n), global BLn, global, SL(n), BT1(n), BT2(n). This operation is performed on bit-by-bit basis. In the present invention, this operation is intended to verify that those over erased cells are corrected to Vt within +0.5V but below +1V. A voltage Vcorvfy is coupled to word line WL0(0) and the rest of the word lines, WL1(0) to WL511(0), are coupled to −4V to shut off any potential leakage caused by over erased cells that might be existing in Block 0. The voltage of −4 v is an approximate value and is set to be able to shut off any leakage current which results from cells with Vt less than −4V. All source voltages of SL(O)–SL(n) are coupled to ground along with the bit line BLn. The bit line BLn+1 is coupled to +1V for the verify operation. The P-well of all bocks is coupled to 0V. The process is continued in the same page until all cells in that page are corrected and verified. Then the operation moves to verify next page of WLn(0) in Block 0. After all word lines in the block are successfully corrected and verified, the verify process is terminated. This operation requires three concurrent word line voltages, Vcorvfy, −4V and 0V.

Figure 36:
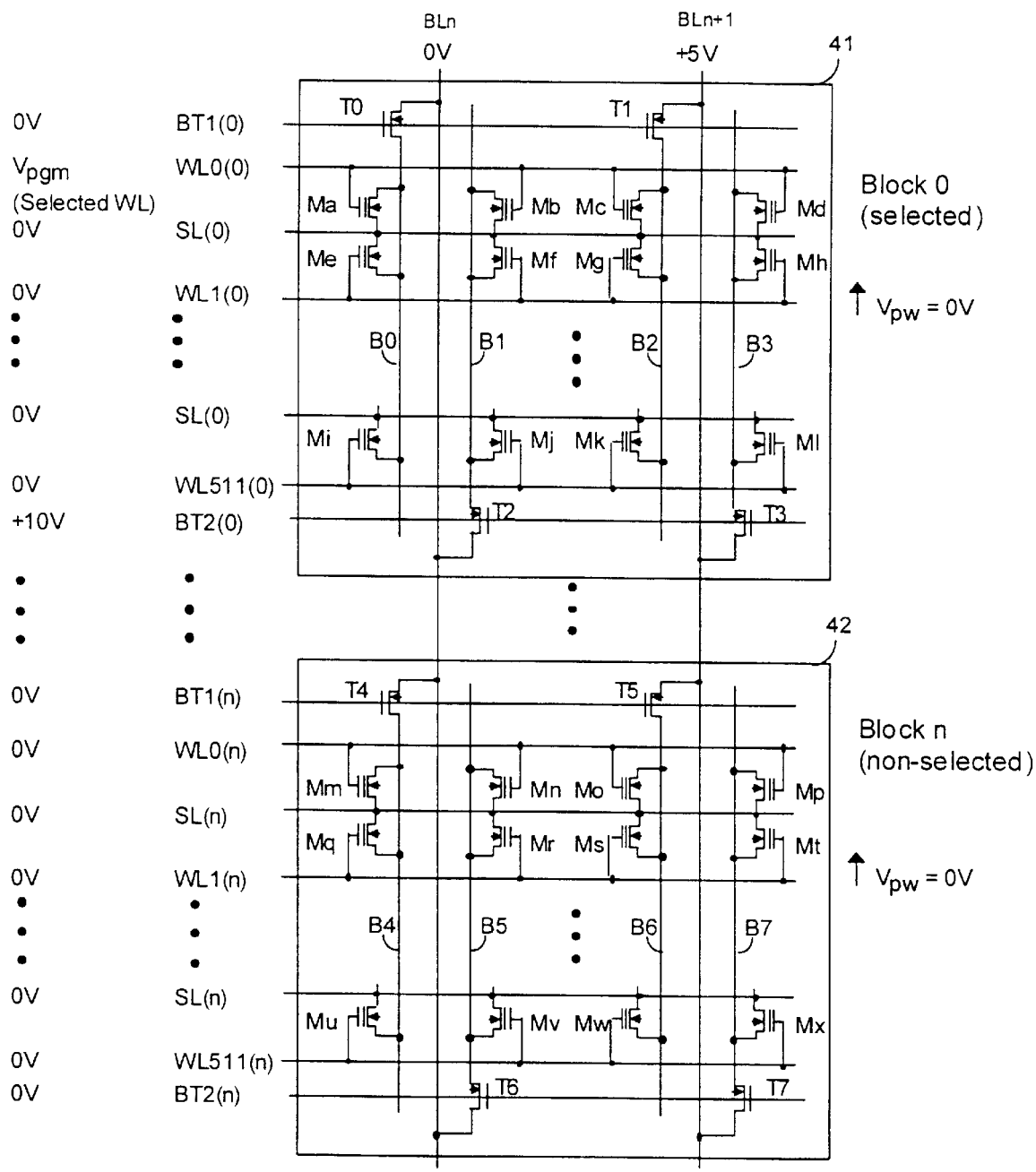
FIG. 36 illustrates the bias conditions for program operations of the present invention for the ETOX NOR array of prior art on a P-well.

In FIG. 36 is illustrated a CHE program operation with preferred voltages for WLm(n), global BLn, global SL(n), BT1(n), and BT2(n). This operation is performed after correction and is on a bit-by-bit basis. The process is continued until all cells are fully verified. A voltage Vpgm, which is approximately 10V, is coupled to WL0(0), and the remainder of the word lines of WL1(0) to WL511(0) are coupled to 0V. Because all over erased cells have previously been corrected, the −4 v used to shut off any leakage is no longer needed. The CHE program operation continues on a bit-by-bit basis and terminates when all cells in same byte/word that are programmed, coupled to a high Vt (>−4V). This CHE program operation does not require three concurrent word line voltages.

Figure 37:
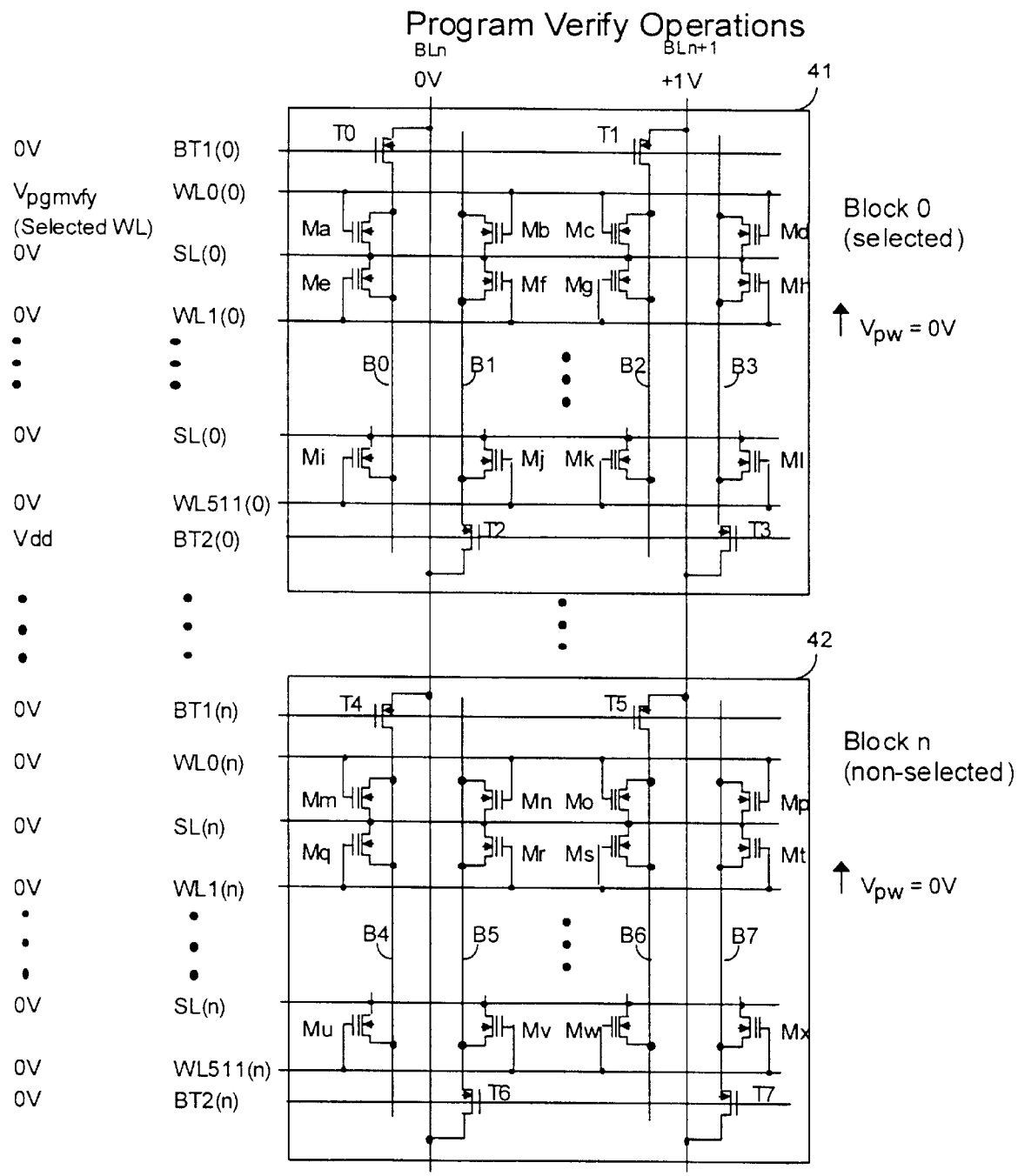
FIG. 37 illustrates the bias conditions for program verify operations of the present invention for the ETOX NOR array of prior art on a P-well.

In FIG. 37 a CHE program verify operation is illustrated with preferred voltages for WLm(n), global BLn, global SL(n), BT1(n), and BT2(n). The P-well voltage is set to 0V. This operation is performed in a similar manner as program verify in FIG. 15. This program verify operation does not require three concurrent word line voltages.

Figure 38A:
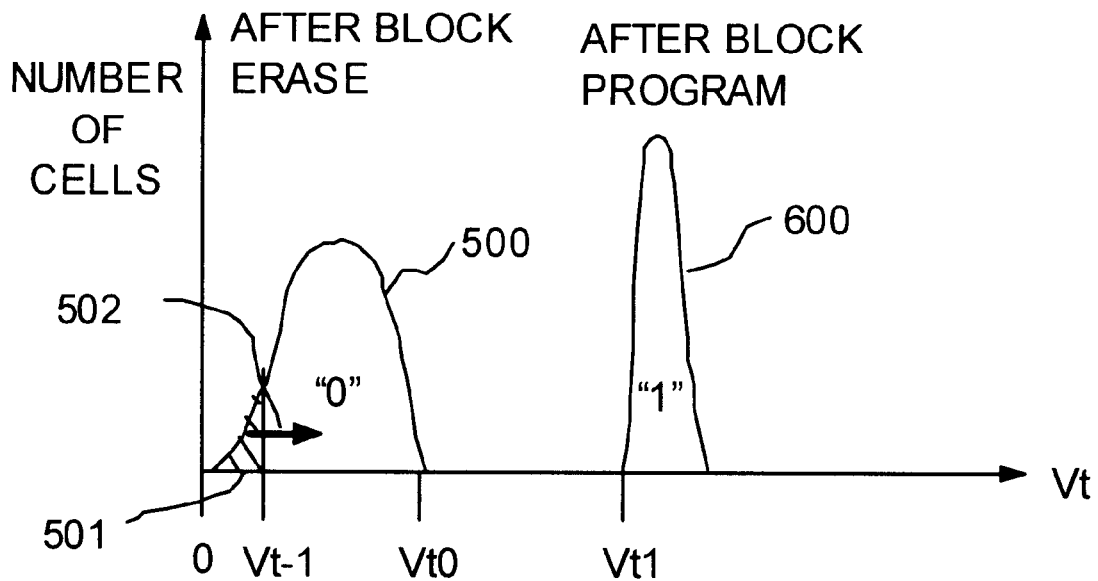
FIG. 38a shows the Vt distribution obtained after application of the block erase and page program sequence of operations in an ETOX NOR array of prior art.

The fourth embodiment of the present invention will be described with reference to flow charts of FIG. 38 to FIG. 44 to illustrate the three concurrent word line voltages technique of this invention. In FIG. 38a is shown the Vt distribution of ETOX cells of prior art for a large block after performing FN block erase and CHE block program operations. Prior to the erase operation, the data of the cells contained both "1" and "0" data of different Vt voltages. All cells are pre-programmed to high Vt state above Vt1 as shown in waveform 600. Typically, Vt1 is approximately +4V for a binary-data cell. Since the pre-program operation is performed on a bit-by-bit basis, the Vt distribution of the "1" for programmed cells can be controlled to be very narrow. The flash cells with Vt larger than Vt1 store "1" data.

Continuing to refer to FIG. 38a, subsequent to the pre-programming, an FN erase operation is performed on a block basis to lower Vt of all programmed cells. This operation is to change the cell data from "1" to "0" in the selected block and creates a distribution as seen in waveform 500. After block erase, the Vt of the cells in the selected block are brought lower and below Vt0. The cells with a Vt below Vt−1 are referred to as over-erased cells 501 that require a correction 502. In the NOR type flash array, the voltage Vt−1 is the lowest acceptable positive Vt (not negative) to guarantee there is no occurrence of the over erase problem 501 for normal operation. Since the erase operation is performed on block basis and is less controllable than the program operation done on a bit-by-bit basis. As a result, the Vt distribution of "0" data 500 after block erase operation is much broader than the "1" data. The voltage Vt−1 in FIG. 38a is approximately +0.6V, Vt0 is approximately +2.5V and Vt1 is approximately +4V for 3V operation.

Figure 38B:
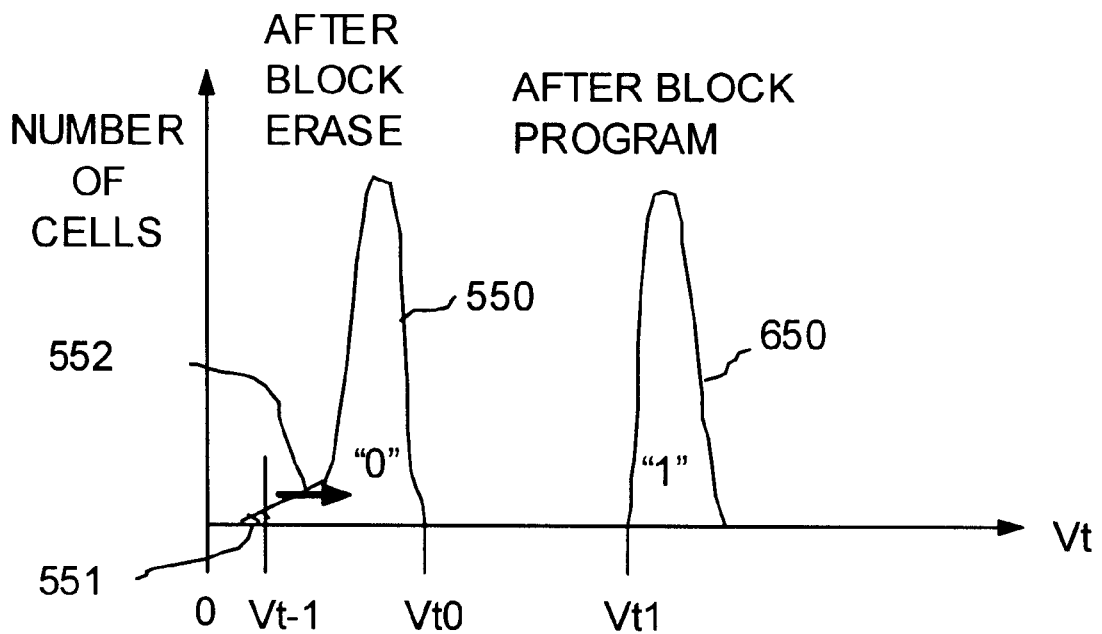
FIG. 38b shows the Vt distribution obtained after application of the block erase and page program sequence of operations of the present invention to the cells in an ETOX NOR array.

Referring to FIG. 38b, a Vt distribution is shown of ETOX cells in a large block when the three concurrent word line voltages of the present invention are used. As seen from waveforms 550 and 650, the Vt distributions of the programmed state of data "1" and the block erased state of data "0" can be made very narrow. The detailed explanation to show how to achieve the narrow-distribution of data "0" and data "1" is with reference to the flow diagram of FIG. 39. Over erased cells 551 are corrected 552 using a correction operation discussed with reference to the flow diagram on FIG. 40.

Figure 39:
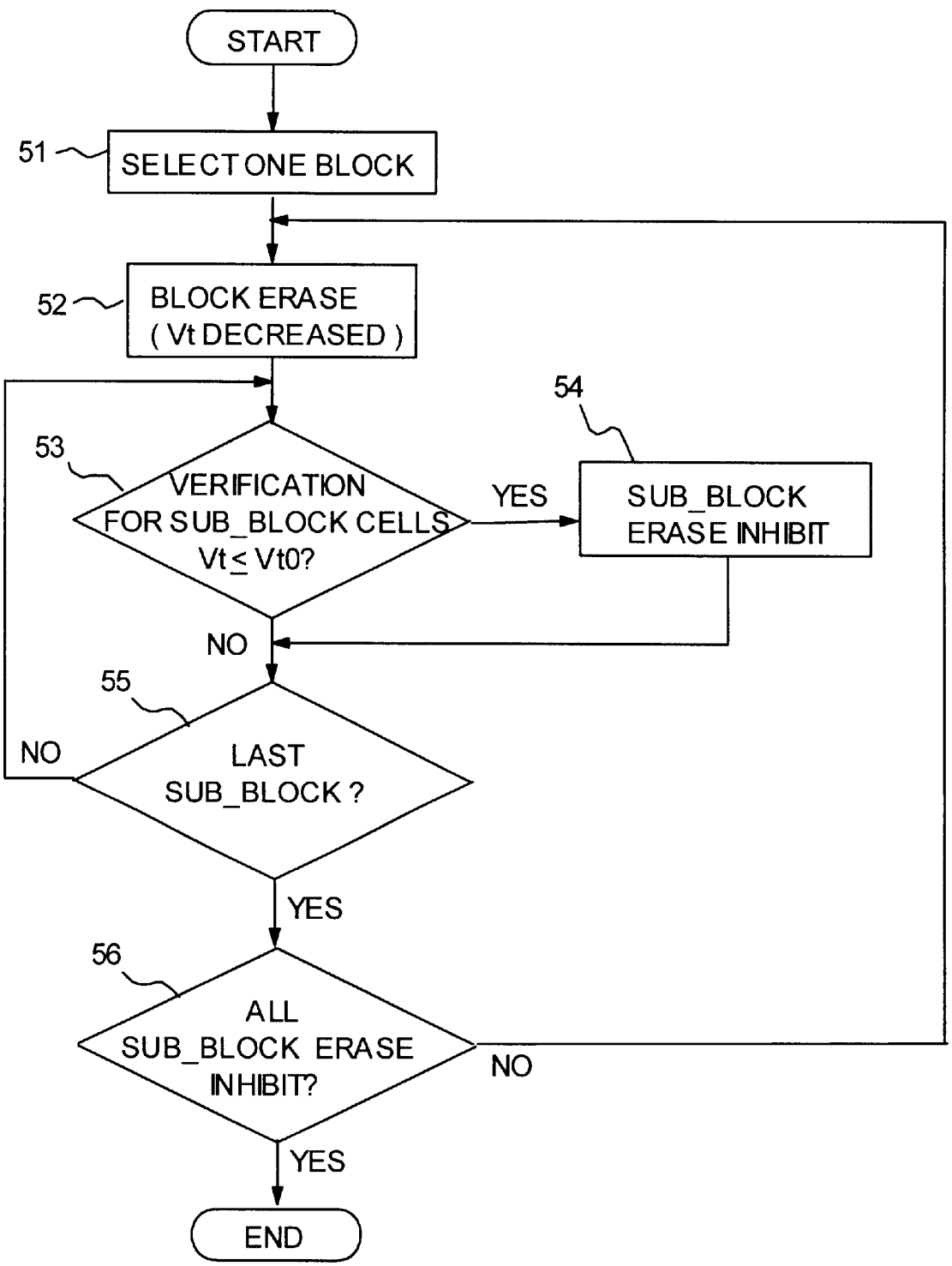
FIG. 39 is a flow diagram of the present invention for block erase operations in an ETOX NOR array.

FIG. 39 shows a simplified flow diagram of a block erase operation when the present invention is applied to an ETOX cell. The block erase operation starts with selecting one block 51 which sets up a plurality of addresses for an X-decoder and Y-decoder to select the right block. This is then followed by a FN block erase operation 52 to decrease the Vt of the selected cells in the selected block. The erase operation is an iterative process, and each time an erase pulse of a pre-determined time is performed on the selected block, all erased cells are verified to determine if the Vt value is below Vt0 53 on a sub-block basis. Any sub-blocks that have been verified to satisfy that Vt is below Vt0 are immediately set to an inhibit state by sub-block erase inhibit 54 to avoid further erase operation. The process continues to check determine if all sub-blocks are verified 53. The process stops when all pages of the sub-block are verified successfully 55. Any sub-block that is not inhibited 56 is returned to the erase operation 52. In the process shown in the flow diagram of FIG. 39, three concurrent applied word line voltages are used in some steps. The first is in decision step 53 (Versvfy, see FIG. 10 and FIG. 32) and the second one is in step 54 see FIG. 33).

Figure 40:
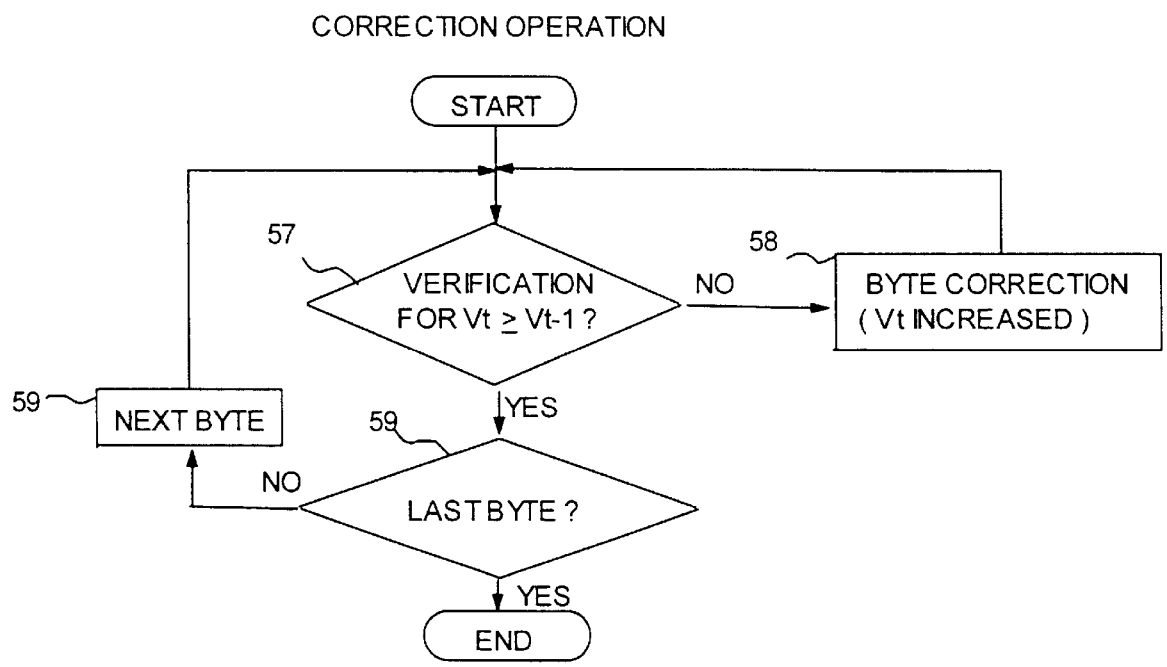
FIG. 40 is a flow diagram of the present invention for correction operations of an ETOX NOR array.

FIG. 40 shows a preferred flow diagram for a correction operation of the present invention. This operation is intended to correct those over erase cells in an erased block. Any cells with Vt below Vt−1 must be corrected to a voltage above Vt-1. With three concurrent word line voltages, this operation can be performed on a bit-by-bit basis. It should be noted that correction is performed byte by byte, but correction will depend on the threshold voltage of each individual bit in the byte. The purpose is to avoid any over-correction. Thus, "bit-by-bit" means that the correction inhibition will stop correction on any successfully corrected bit. Therefore, a narrow Vt distribution of data "0" is achieved. The first step is to perform a check 57 is to verify that Vt<Vt-1. If the Vt of any cells is below Vt-1, the cells are corrected 58 to increase the VT of those cells. Since step 57 is carried out on bit-by-bit basis, all bytes in the selected block are checked 59. The next byte 60 is verified until all pages in selected block have been verified to have a Vt>VT-1. Whenever an over erase byte is found, an immediate byte correction is performed 58 and Vt is increased above Vt−1 for the over erased byte. The reason for byte-correction is that an ETOX cell which uses CHE correction which consumes too much power and can not be performed on page basis. Each page contains a plurality of bytes, and the byte correction operation is performed consecutively byte by byte until all bytes in the selected page are corrected. The correction operation uses three concurrent applied word line voltages, Vcorrection for byte correction 58 and Vcorvfy for byte correction verification 57.

Figure 41A:
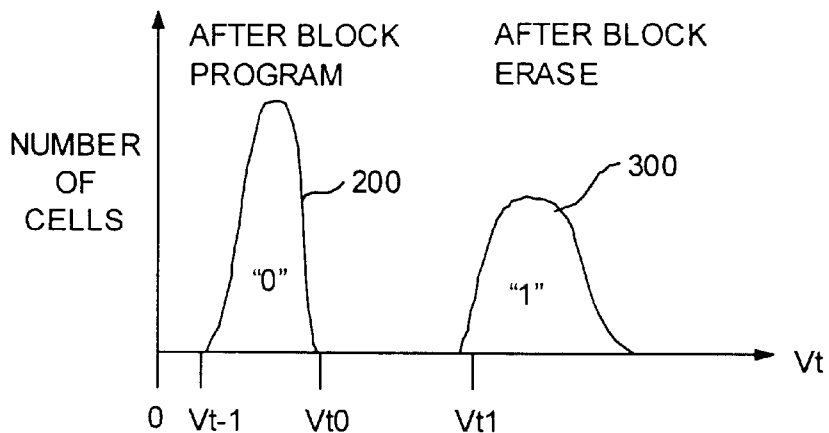
FIG. 41a shows a Vt distribution obtained after application of block erase and page program sequence of operations for a first AND cell array of prior art.

FIG. 41a shows the Vt distribution for AND cells in prior art of a large block after a FN block erase and a FN page program operations on all pages in a block are performed. Prior to the erase operation, the data of the cells contained both "1" and "0" at different Vts. All cells were erased to high Vt state (above Vt1) as shown in waveform 300. Typically, Vt1 is around +4V for a binary-data cell. Since the erase operation is performed on block basis, the Vt distribution of "1" data 300 of the erased cells can not be controlled well. As a result, a wide Vt distribution of "1" data 300 is generated in prior art. Subsequent to the erase operation, a FN page program operation is performed to lower Vt of all erased cells. This operation changes the cell data from "1" to "0" in the selected block as seen in waveform 200. After the page program, the Vt of the cells is brought lower below Vt0. Cells with a Vt below Vt−1 are defined as over-erased cells 301 that require Vt correction. In a NOR type flash array, the voltage Vt−1 is the lowest acceptable positive Vt (not negative) in order to guarantee no occurrence of the over erase problem for a normal operation. Since the program operation is performed on page basis, it is more controllable than the erase operation which is performed on a block basis. As a result, the Vt distribution of "0" data 200 is much narrower than the distribution of "1" data 300. The voltage Vt−1 is approximately +0.6V, Vt0 approximately +1.0V and Vt1 is approximately +4V for a 3V operation.

Figure 41B:
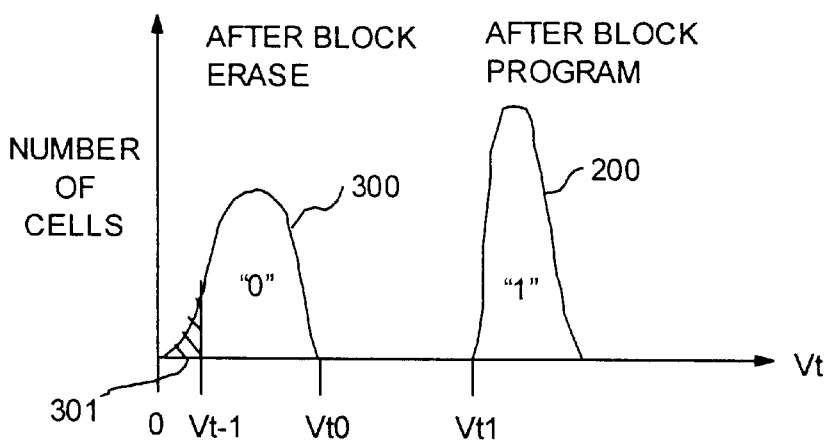
FIG. 41b shows a Vt distribution obtained after application block erase and page program sequence of operations for a second AND cell array of prior art.

In FIG. 41b is shown a Vt distribution for AND cells of second prior art. Unlike the approach in FIG. 41a, the program operation is to increases the Vt of the cells 200 and is carried out on page basis for all pages in a block. The erase operation decreases the Vt of the cells 300 and is carried out on block basis. Therefore, "1" data has narrower Vt distribution than "0" data because there is more control over the operation carried out on a page basis. The Vt0 in FIG. 41b is set to be much higher than Vt0 in FIG. 41a, because the cell program is performed on page with respect to the prior art of FIG. 41a, and the erase operation in FIG. 41b is performed on block basis. The prior art of FIG. 41a uses a bit-by-bit program scheme to obtain "0" data so that over-erase will not occur. The Vt0 can be set around +1.0V with Vt−1 of +0.5V in FIG. 41a. The prior art of FIG. 41b uses block erase, and the erase operation cannot be performed on a bit-by-bit basis. In FIG. 41b, Vt0 is set at higher value +2.5V to reduce the number of over-erased cells.

Figure 41C:
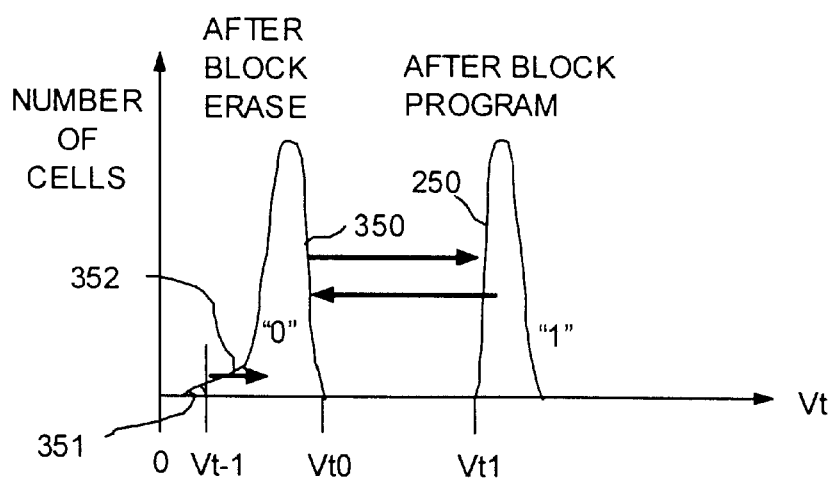
FIG. 41c shows a Vt distribution obtained after application of block erase and page program sequence of operations of the present invention to an AND cell array.

FIG. 41c shows the Vt distribution for cells of the present invention and having a tight distribution for "1" data 250 and "0" data 350. All cells in a selected block are first collectively erased below Vt0 by FN tunneling as shown in distribution 350. The voltage Vt0 is set to be approximately + 1.0V for the present invention. Any over erased cells 351 with a Vt below Vt−1 (+0.5V) is corrected 352 back above Vt−1 but below Vt0 by means of the bit-by-bit correction operation of this invention. Vt0 is used for block erase verify and Vt−1 used for page correction verify. Although erase is performed on block basis, the post-erase, bit-by-bit correction makes a very tight Vt distribution for "0" data 350 in the present invention. A FN channel program operation is performed to increase Vt of selected cells on a page basis for all pages in a block. This operation changes the data of the cells from "0" to "1" in the selected block and results in the distribution of threshold voltages as seen in waveform 250. After the FN channel program, the Vt of the cells are raised above Vt1.

Continuing to refer to FIG. 41c, in a NOR-type flash array, the Vt−1 voltage is the lowest acceptable positive Vt to guarantee no occurrence of the over erase problem in a normal operation. Since the program operation is performed on page basis for all pages in a block, it is more controllable than the block erase operation. As a result, a tight Vt distribution of "1" data 250 is achieved. By using the techniques of the present invention, both tight Vt distribution of "1" data 250 and "0" data 350 can be attained.

FIG. 42a shows a simplified flow diagram of a write operation for an AND cell. The write operation includes a block erase 20 to increase the Vt of cells above Vt1 collectively and a page program 21 to selectively decrease the Vt below Vt0. FIG. 42b shows a simplified flow diagram of a write operation for a second AND cell. The write operation includes a block erase 22 to decrease Vt of the cells collectively below Vt0, and programming 23 selectively increase Vt above Vt1. In either FIG. 42a or FIG. 42b, block erase and program are based on concurrent two voltage word line designs, Vt0 and Vt1.

Figure 43:
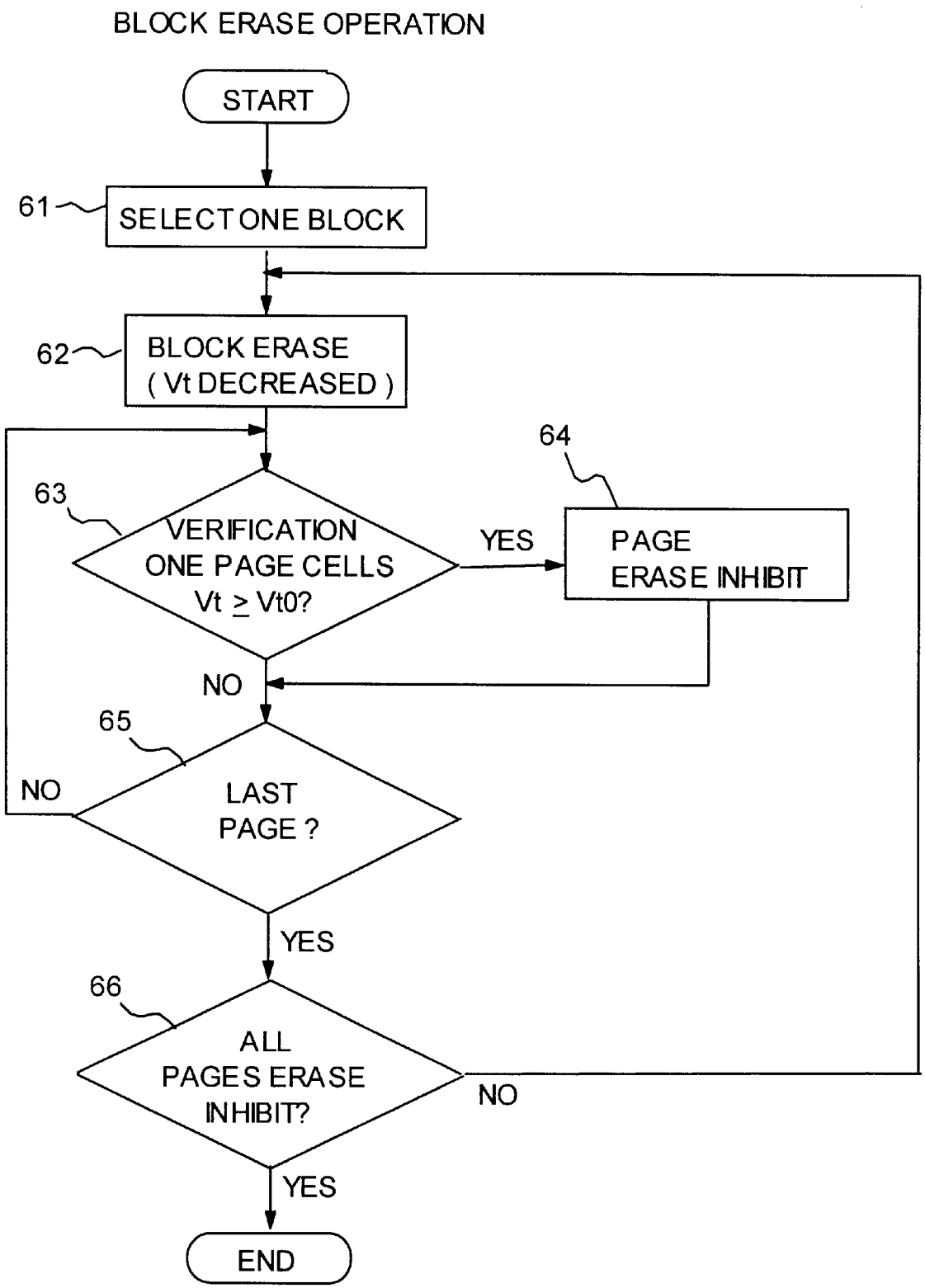
FIG. 43 is a flow diagram of the present invention for block erase operations for an AND array of the present invention.

FIG. 43 shows a simplified flow diagram of a block erase operation for an AND-like cell of the present invention. This flow diagram starts by selecting a block 61 for erase. Then a block erase 62 is performed where the Vt of the cells in the block is decreased. After the first block erase pulse is executed on all selected pages, a page verification 63 is performed to check if Vt is below Vt0. If the selected page meets the criteria Vt<Vt0, it will be set to the erase inhibit state 64 to prevent further erasing; otherwise, the verification is continued to set any next pages in erase inhibit. The page verification will stop when all pages 65 are verified and set to page erase inhibit. Subsequently, a second erase pulse is selectively applied to those pages not in the state of page erase inhibit. The operation is branched back to block erase 62 where Vt is decreased when all pages are not in erase inhibit. Each time, the number of erased word lines will be reduced in the block erase operation 62. The operation will terminate when all pages are set into page erase inhibit. Unlike the method in FIG. 42a and FIG. 42b, the three concurrent applied word line voltage technique of the present invention is used in the block erase operation shown in FIG. 43, verification of one page cells 63 (Versvfy), and page edge erase inhibit 64 (+5V/0V, see FIG. 23).

Figure 44:
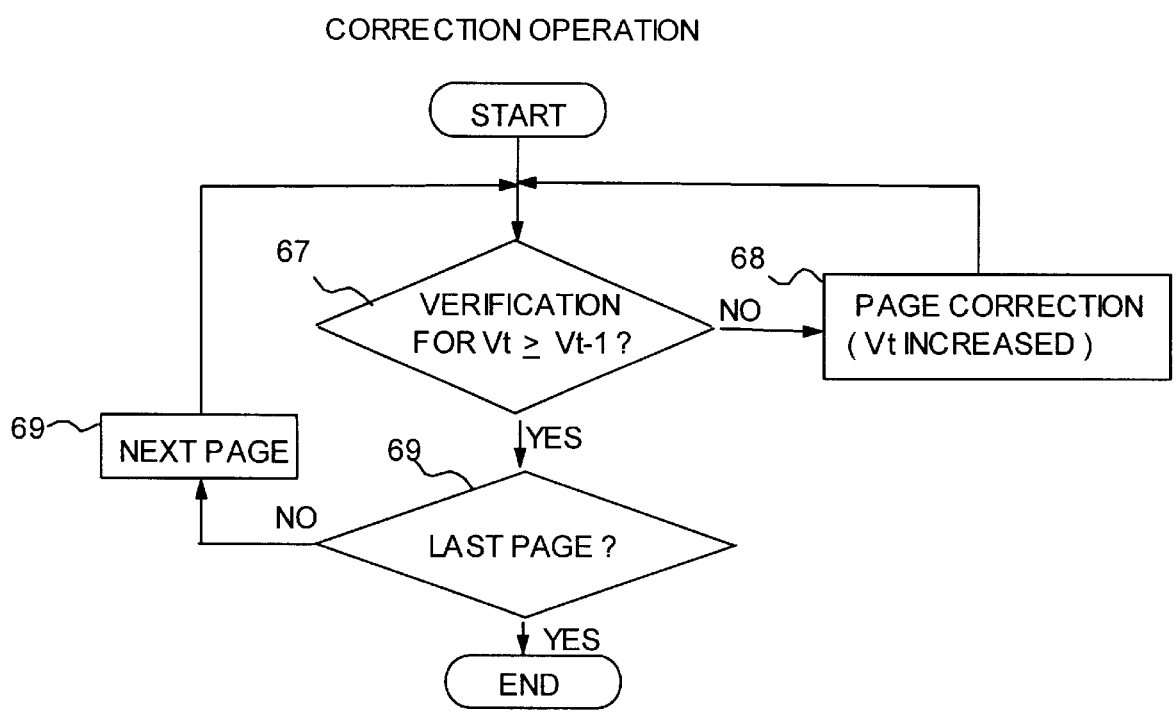
FIG. 44 is a flow diagram of the present invention for correction operations for an AND array of the present invention.

FIG. 44 shows a preferred flow diagram for a correction operation of the present invention. This operation is intended to correct those over erase cells in the erased block. Any cells with Vt below Vt−1(67) have to be corrected to have a Vt, which is above Vt−1 using correction 68 which increases the Vt of a cell. The page verification is continued until all pages 69 and 70 in a block have been corrected. With the three concurrent applied word line voltages, Vcorrection for page correction 68 and Vcorvfy for page correction verification 67 this operation can be performed on a bit-by-bit basis. The operation will stop when all pages have been corrected.

While the invention has been particularly shown and described with reference to preferred embodiments thereof, it will be understood by those skilled in the art that various changes in form and details may be made without departing from the spirit and scope of the invention.

What is claimed is:

1. A method to provide storage operations for an ETOX NOR memory array on a P-substrate using three concurrent word line voltages, comprising:
    a) applying a first voltage to a selected word line in a selected memory block of an ETOX NOR memory array to control a memory operation,
    b) applying a second voltage to a non-selected word line in said selected memory block to eliminate bit line leakage in the selected memory block,
    c) applying a third voltage to said non-selected word line in non-selected blocks of said memory array to prevent disturb conditions,
    d) continuing the application of the three word line voltages until all word lines of said selected block have been processed.

2. The method in claim 1, wherein said memory operation is block erase verify.

3. The method in claim 1, wherein said memory operation is cell voltage correction.

4. The method in claim 1, wherein said memory operation is cell voltage correction verify.

5. A method to provide storage operations for an ETOX NOR memory array on a P-well using three concurrent word line voltages, comprising:
    a) applying a first voltage to a selected word line in a selected memory block of an ETOX NOR memory array to control a memory operation,
    b) applying a second voltage to a non-selected word line in said selected memory block to eliminate bit line leakage in the selected memory block
    c) applying a third voltage to said non-selected word line in non-selected blocks, of said memory array to prevent disturb conditions,
    d) continuing the application of the three word line voltages until all word lines of said selected block have been processed.

6. The method in claim 5, wherein said memory operation is block erase verify.

7. The method in claim 5, wherein said memory operation is cell voltage correction.

8. The method in claim 5, wherein said memory operation is cell voltage correction verify.

* * * * *